United States Patent
Sheen

(10) Patent No.: US 11,803,350 B2
(45) Date of Patent: Oct. 31, 2023

(54) FACILITATING CALIBRATION OF AN AUDIO PLAYBACK DEVICE

(71) Applicant: Sonos, Inc., Santa Barbara, CA (US)

(72) Inventor: Timothy W. Sheen, Brighton, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 17/407,793

(22) Filed: Aug. 20, 2021

(65) Prior Publication Data

US 2022/0137918 A1   May 5, 2022

Related U.S. Application Data

(63) Continuation of application No. 16/812,618, filed on Mar. 9, 2020, now Pat. No. 11,099,808, which is a (Continued)

(51) Int. Cl.
*G06F 3/16* (2006.01)
*H03G 5/00* (2006.01)
(Continued)

(52) U.S. Cl.
CPC ............. *G06F 3/165* (2013.01); *H03G 5/005* (2013.01); *H03G 5/165* (2013.01); *H04R 3/04* (2013.01);
(Continued)

(58) Field of Classification Search
CPC ........ G06F 3/165; H03G 5/005; H03G 5/165; H04R 3/04; H04R 29/001; H04R 29/007;
(Continued)

(56) References Cited

U.S. PATENT DOCUMENTS 4,306,113 A   12/1981   Morton
4,342,104 A    7/1982   Jack
(Continued)

FOREIGN PATENT DOCUMENTS

CN   1369188 A    9/2002
CN   1447624 A   10/2003
(Continued)

OTHER PUBLICATIONS

Notice of Allowance dated Sep. 20, 2017, issued in connection with U.S. Appl. No. 14/481,514, filed Sep. 9, 2014, 10 pages.
(Continued)

*Primary Examiner* — Fan S Tsang
*Assistant Examiner* — David Siegel
(74) *Attorney, Agent, or Firm* — FORTEM IP LLP; Benjamin Urban

(57) ABSTRACT

Example techniques facilitate calibration of a playback device. An example implementation involves a computing device capturing, via a microphone, data representing multiple iterations of a calibration sound as played by a playback device. The computing device identifies multiple sections within the captured data. Two or more sections represent respective iterations of the calibration sound as played by the playback device. Based on the multiple identified sections, the computing device determines a frequency response of the playback device, the frequency response of the playback device representing audio output by the playback device and acoustic characteristics of an environment around the playback device. Based on the frequency response of the playback device and a target frequency response, the computing device determines one or more parameters of an audio processing algorithm and sends, to the playback device, the one or more parameters of the audio processing algorithm.

20 Claims, 20 Drawing Sheets

Related U.S. Application Data continuation of application No. 16/182,886, filed on Nov. 7, 2018, now Pat. No. 10,585,639, which is a continuation of application No. 14/864,393, filed on Sep. 24, 2015, now Pat. No. 10,127,006.

(60) Provisional application No. 62/220,225, filed on Sep. 17, 2015.

(51) Int. Cl.
   *H03G 5/16* (2006.01)
   *H04S 7/00* (2006.01)
   *H04R 29/00* (2006.01)
   *H04R 3/04* (2006.01)

(52) U.S. Cl.
   CPC ......... *H04R 29/001* (2013.01); *H04R 29/007* (2013.01); *H04S 7/301* (2013.01); *H04S 7/303* (2013.01); *H04S 7/307* (2013.01); *H04R 2227/001* (2013.01); *H04R 2227/005* (2013.01); *H04S 2420/07* (2013.01)

(58) Field of Classification Search
   CPC ........ H04R 2227/001; H04R 2227/005; H04S 7/301; H04S 7/303; H04S 7/307; H04S 2420/07
   See application file for complete search history.

(56) References Cited

U.S. PATENT DOCUMENTS

| | | |
|---|---|---|
| 4,504,704 A | 3/1985 | Ohyaba et al. |
| 4,592,088 A | 5/1986 | Shimada |
| 4,628,530 A | 12/1986 | Op De Beek et al. |
| 4,631,749 A | 12/1986 | Rapaich |
| 4,694,484 A | 9/1987 | Atkinson et al. |
| 4,773,094 A | 9/1988 | Dolby |
| 4,995,778 A | 2/1991 | Bruessel |
| 5,218,710 A | 6/1993 | Yamaki et al. |
| 5,255,326 A | 10/1993 | Stevenson |
| 5,323,257 A | 6/1994 | Abe et al. |
| 5,386,478 A | 1/1995 | Plunkett |
| 5,440,644 A | 8/1995 | Farinelli et al. |
| 5,553,147 A | 9/1996 | Pineau |
| 5,581,621 A | 12/1996 | Koyama et al. |
| 5,754,774 A | 5/1998 | Bittinger et al. |
| 5,757,927 A | 5/1998 | Gerzon et al. |
| 5,761,320 A | 6/1998 | Farinelli et al. |
| 5,910,991 A | 6/1999 | Farrar |
| 5,923,902 A | 7/1999 | Inagaki |
| 5,939,656 A | 8/1999 | Suda |
| 6,018,376 A | 1/2000 | Nakatani |
| 6,032,202 A | 2/2000 | Lea et al. |
| 6,072,879 A | 6/2000 | Ouchi et al. |
| 6,111,957 A | 8/2000 | Thomasson |
| 6,256,554 B1 | 7/2001 | DiLorenzo |
| 6,363,155 B1 | 3/2002 | Horbach |
| 6,404,811 B1 | 6/2002 | Cvetko et al. |
| 6,469,633 B1 | 10/2002 | Wachter |
| 6,522,886 B1 | 2/2003 | Youngs et al. |
| 6,573,067 B1 | 6/2003 | Dib-Hajj et al. |
| 6,611,537 B1 | 8/2003 | Edens et al. |
| 6,631,410 B1 | 10/2003 | Kowalski et al. |
| 6,639,989 B1 | 10/2003 | Zacharov et al. |
| 6,643,744 B1 | 11/2003 | Cheng |
| 6,704,421 B1 | 3/2004 | Kitamura |
| 6,721,428 B1 | 4/2004 | Allred et al. |
| 6,731,760 B2 | 5/2004 | Pedersen |
| 6,757,517 B2 | 6/2004 | Chang |
| 6,760,451 B1 | 7/2004 | Craven et al. |
| 6,766,025 B1 | 7/2004 | Levy et al. |
| 6,778,869 B2 | 8/2004 | Champion |
| 6,798,889 B1 | 9/2004 | Dicker et al. |
| 6,862,440 B2 | 3/2005 | Sampath |
| 6,916,980 B2 | 7/2005 | Ishida et al. |
| 6,931,134 B1 | 8/2005 | Waller, Jr. et al. |
| 6,985,694 B1 | 1/2006 | De Bonet et al. |
| 6,990,211 B2 | 1/2006 | Parker |
| 7,031,476 B1 | 4/2006 | Chrisop et al. |
| 7,039,212 B2 | 5/2006 | Poling et al. |
| 7,058,186 B2 | 6/2006 | Tanaka |
| 7,072,477 B1 | 7/2006 | Kincaid |
| 7,092,535 B1 | 8/2006 | Pedersen et al. |
| 7,092,537 B1 | 8/2006 | Allred et al. |
| 7,103,187 B1 | 9/2006 | Neuman |
| 7,130,608 B2 | 10/2006 | Hollstrom et al. |
| 7,130,616 B2 | 10/2006 | Janik |
| 7,143,939 B2 | 12/2006 | Henzerling |
| 7,187,947 B1 | 3/2007 | White et al. |
| 7,236,773 B2 | 6/2007 | Thomas |
| 7,289,637 B2 | 10/2007 | Montag et al. |
| 7,295,548 B2 | 11/2007 | Blank et al. |
| 7,312,785 B2 | 12/2007 | Tsu et al. |
| 7,391,791 B2 | 6/2008 | Balassanian et al. |
| 7,477,751 B2 | 1/2009 | Lyon et al. |
| 7,483,538 B2 | 1/2009 | McCarty et al. |
| 7,483,540 B2 | 1/2009 | Rabinowitz et al. |
| 7,489,784 B2 | 2/2009 | Yoshino |
| 7,490,044 B2 | 2/2009 | Kulkarni |
| 7,492,909 B2 | 2/2009 | Carter et al. |
| 7,519,188 B2 | 4/2009 | Berardi et al. |
| 7,529,377 B2 | 5/2009 | Nackvi et al. |
| 7,571,014 B1 | 8/2009 | Lambourne et al. |
| 7,590,772 B2 | 9/2009 | Marriott et al. |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,664,276 B2 | 2/2010 | McKee |
| 7,676,044 B2 | 3/2010 | Sasaki et al. |
| 7,689,305 B2 | 3/2010 | Kreifeldt et al. |
| 7,697,701 B2 | 4/2010 | Pedersen et al. |
| 7,720,237 B2 | 5/2010 | Bharitkar et al. |
| 7,742,740 B2 | 6/2010 | Goldberg et al. |
| 7,769,183 B2 | 8/2010 | Bharitkar et al. |
| 7,796,068 B2 | 9/2010 | Raz et al. |
| 7,835,689 B2 | 11/2010 | Goldberg et al. |
| 7,853,341 B2 | 12/2010 | McCarty et al. |
| 7,876,903 B2 | 1/2011 | Sauk |
| 7,925,203 B2 | 4/2011 | Lane et al. |
| 7,949,140 B2 | 5/2011 | Kino |
| 7,949,707 B2 | 5/2011 | McDowall et al. |
| 7,961,893 B2 | 6/2011 | Kino |
| 7,970,922 B2 | 6/2011 | Svendsen |
| 7,987,294 B2 | 7/2011 | Bryce et al. |
| 8,005,228 B2 | 8/2011 | Bharitkar et al. |
| 8,014,423 B2 | 9/2011 | Thaler et al. |
| 8,042,961 B2 | 10/2011 | Massara et al. |
| 8,045,721 B2 | 10/2011 | Burgan et al. |
| 8,045,952 B2 | 10/2011 | Qureshey et al. |
| 8,050,652 B2 | 11/2011 | Qureshey et al. |
| 8,063,698 B2 | 11/2011 | Howard |
| 8,074,253 B1 | 12/2011 | Nathan |
| 8,103,009 B2 | 1/2012 | McCarty et al. |
| 8,116,476 B2 | 2/2012 | Inohara |
| 8,126,156 B2 | 2/2012 | Corbett et al. |
| 8,126,172 B2 | 2/2012 | Horbach et al. |
| 8,131,390 B2 | 3/2012 | Braithwaite et al. |
| 8,139,774 B2 | 3/2012 | Berardi et al. |
| 8,144,883 B2 | 3/2012 | Pdersen et al. |
| 8,160,276 B2 | 4/2012 | Liao et al. |
| 8,160,281 B2 | 4/2012 | Kim et al. |
| 8,170,260 B2 | 5/2012 | Reining et al. |
| 8,175,292 B2 | 5/2012 | Aylward et al. |
| 8,175,297 B1 | 5/2012 | Ho et al. |
| 8,194,874 B2 | 6/2012 | Starobin et al. |
| 8,229,125 B2 | 7/2012 | Short |
| 8,233,632 B1 | 7/2012 | MacDonald et al. |
| 8,234,395 B2 | 7/2012 | Millington |
| 8,238,547 B2 | 8/2012 | Dhki et al. |
| 8,238,578 B2 | 8/2012 | Aylward |
| 8,243,961 B1 | 8/2012 | Morrill |
| 8,264,408 B2 | 9/2012 | Kainulainen et al. |

(56) References Cited

U.S. PATENT DOCUMENTS

| | | |
|---|---|---|
| 8,265,310 B2 | 9/2012 | Berardi et al. |
| 8,270,620 B2 | 9/2012 | Christensen |
| 8,279,709 B2 | 10/2012 | Choisel et al. |
| 8,281,001 B2 | 10/2012 | Busam et al. |
| 8,290,185 B2 | 10/2012 | Kim |
| 8,291,349 B1 | 10/2012 | Park et al. |
| 8,300,845 B2 | 10/2012 | Zurek et al. |
| 8,306,235 B2 | 11/2012 | Mahowald |
| 8,325,931 B2 | 12/2012 | Howard et al. |
| 8,325,935 B2 | 12/2012 | Rutschman |
| 8,325,944 B1 | 12/2012 | Duwenhorst et al. |
| 8,331,585 B2 | 12/2012 | Hagen et al. |
| 8,332,414 B2 | 12/2012 | Nguyen et al. |
| 8,379,876 B2 | 2/2013 | Zhang |
| 8,385,557 B2 | 2/2013 | Tashev et al. |
| 8,391,501 B2 | 3/2013 | Khawand et al. |
| 8,392,505 B2 | 3/2013 | Haughay et al. |
| 8,401,202 B2 | 3/2013 | Brooking |
| 8,433,076 B2 | 4/2013 | Zurek et al. |
| 8,452,020 B2 | 5/2013 | Gregg et al. |
| 8,463,184 B2 | 6/2013 | Dua |
| 8,483,853 B1 | 7/2013 | Lambourne |
| 8,488,799 B2 | 7/2013 | Goldstein et al. |
| 8,503,669 B2 | 8/2013 | Mao |
| 8,527,876 B2 | 9/2013 | Wood et al. |
| 8,577,045 B2 | 11/2013 | Gibbs |
| 8,577,048 B2 | 11/2013 | Chaikin et al. |
| 8,600,075 B2 | 12/2013 | Lim |
| 8,620,006 B2 | 12/2013 | Berardi et al. |
| 8,682,002 B2 | 3/2014 | Wihardja et al. |
| 8,731,206 B1 | 5/2014 | Park |
| 8,755,538 B2 | 6/2014 | Kwon |
| 8,798,280 B2 | 8/2014 | Goldberg et al. |
| 8,819,554 B2 | 8/2014 | Basso et al. |
| 8,831,244 B2 | 9/2014 | Apfel |
| 8,855,319 B2 | 10/2014 | Liu et al. |
| 8,862,273 B2 | 10/2014 | Karr |
| 8,879,761 B2 | 11/2014 | Johnson et al. |
| 8,903,526 B2 | 12/2014 | Beckhardt et al. |
| 8,914,559 B2 | 12/2014 | Kalayjian et al. |
| 8,930,005 B2 | 1/2015 | Reimann |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,965,033 B2 | 2/2015 | Wiggins |
| 8,965,546 B2 | 2/2015 | Visser et al. |
| 8,977,974 B2 | 3/2015 | Kraut |
| 8,984,442 B2 | 3/2015 | Pirnack et al. |
| 8,989,406 B2 | 3/2015 | Wong et al. |
| 8,995,687 B2 | 3/2015 | Marino, Jr. et al. |
| 8,995,688 B1 | 3/2015 | Chemtob et al. |
| 8,996,370 B2 | 3/2015 | Ansell |
| 9,020,153 B2 | 4/2015 | Britt, Jr. |
| 9,021,153 B2 | 4/2015 | Lu |
| 9,042,556 B2 | 5/2015 | Kallai et al. |
| 9,065,929 B2 | 6/2015 | Chen et al. |
| 9,084,058 B2 | 7/2015 | Reilly et al. |
| 9,100,766 B2 | 8/2015 | Soulodre et al. |
| 9,106,192 B2 | 8/2015 | Sheen et al. |
| 9,179,233 B2 | 11/2015 | Kang |
| 9,215,545 B2 | 12/2015 | Dublin et al. |
| 9,219,460 B2 | 12/2015 | Bush |
| 9,231,545 B2 | 1/2016 | Agustin et al. |
| 9,247,365 B1 | 1/2016 | Ellis et al. |
| 9,264,839 B2 | 2/2016 | Oishi et al. |
| 9,286,384 B2 | 3/2016 | Kuper et al. |
| 9,288,597 B2 | 3/2016 | Carlsson et al. |
| 9,300,266 B2 | 3/2016 | Grokop |
| 9,307,340 B2 | 4/2016 | Seefeldt |
| 9,319,816 B1 | 4/2016 | Narayanan |
| 9,398,392 B2 | 7/2016 | Ridihalgh et al. |
| 9,451,377 B2 | 9/2016 | Massey et al. |
| 9,462,399 B2 | 10/2016 | Bharitkar et al. |
| 9,467,779 B2 | 10/2016 | Iyengar et al. |
| 9,472,201 B1 | 10/2016 | Sleator |
| 9,473,207 B2 | 10/2016 | McCormack et al. |
| 9,489,948 B1 | 11/2016 | Chu et al. |
| 9,524,098 B2 | 12/2016 | Griffiths et al. |
| 9,538,305 B2 | 1/2017 | Lehnert et al. |
| 9,538,308 B2 | 1/2017 | Isaac et al. |
| 9,544,701 B1 | 1/2017 | Rappoport |
| 9,560,449 B2 | 1/2017 | Carlsson et al. |
| 9,560,460 B2 | 1/2017 | Chaikin et al. |
| 9,584,915 B2 | 2/2017 | Fullam et al. |
| 9,609,383 B1 | 3/2017 | Hirst |
| 9,615,171 B1 | 4/2017 | O'Neill et al. |
| 9,648,422 B2 | 5/2017 | Sheen et al. |
| 9,654,073 B2 | 5/2017 | Apodaca |
| 9,674,625 B2 | 6/2017 | Armstrong-Muntner et al. |
| 9,678,708 B2 | 6/2017 | Bierbower et al. |
| 9,686,625 B2 | 6/2017 | Patel |
| 9,689,960 B1 | 6/2017 | Barton et al. |
| 9,690,271 B2 | 6/2017 | Sheen et al. |
| 9,690,539 B2 | 6/2017 | Sheen et al. |
| 9,693,165 B2 | 6/2017 | Downing et al. |
| 9,699,582 B2 | 7/2017 | Sheerin et al. |
| 9,706,323 B2 | 7/2017 | Sheen et al. |
| 9,715,365 B2 | 7/2017 | Kusano et al. |
| 9,723,420 B2 | 8/2017 | Family et al. |
| 9,729,984 B2 | 8/2017 | Tan et al. |
| 9,736,584 B2 | 8/2017 | Sheen et al. |
| 9,743,207 B1 | 8/2017 | Hartung |
| 9,743,208 B2 | 8/2017 | Oishi et al. |
| 9,749,763 B2 | 8/2017 | Sheen |
| 9,763,018 B1 | 9/2017 | McPherson et al. |
| 9,781,532 B2 | 10/2017 | Sheen |
| 9,788,113 B2 | 10/2017 | Wilberding et al. |
| 9,794,722 B2 | 10/2017 | Petrov |
| 9,807,536 B2 | 10/2017 | Liu et al. |
| 9,810,784 B2 | 11/2017 | Altman et al. |
| 9,860,662 B2 | 1/2018 | Jarvis et al. |
| 9,864,574 B2 | 1/2018 | Hartung et al. |
| 9,910,634 B2 | 3/2018 | Sheen et al. |
| 9,913,056 B2 | 3/2018 | Master et al. |
| 9,916,126 B2 | 3/2018 | Lang |
| 9,952,825 B2 | 4/2018 | Sheen |
| 9,984,703 B2 | 5/2018 | Ur et al. |
| 10,045,142 B2 | 8/2018 | McPherson et al. |
| 10,111,002 B1 | 10/2018 | Poulad |
| 10,125,006 B2 | 11/2018 | Jacobsen et al. |
| 10,127,006 B2 | 11/2018 | Sheen |
| 10,154,359 B2 | 12/2018 | Sheen |
| 10,206,052 B2 | 2/2019 | Perianu |
| 10,299,054 B2 | 5/2019 | McPherson et al. |
| 10,299,061 B1 | 5/2019 | Sheen |
| 10,402,154 B2 | 9/2019 | Hartung et al. |
| 10,791,407 B2 | 9/2020 | Oishi et al. |
| 2001/0038702 A1 | 11/2001 | Lavoie et al. |
| 2001/0042107 A1 | 11/2001 | Palm |
| 2001/0043592 A1 | 11/2001 | Jimenez et al. |
| 2001/0053228 A1 | 12/2001 | Jones |
| 2002/0022453 A1 | 2/2002 | Balog et al. |
| 2002/0026442 A1 | 2/2002 | Lipscomb et al. |
| 2002/0072816 A1 | 6/2002 | Shdema et al. |
| 2002/0078161 A1 | 6/2002 | Cheng |
| 2002/0089529 A1 | 7/2002 | Robbin |
| 2002/0124097 A1 | 9/2002 | Isely et al. |
| 2002/0126852 A1 | 9/2002 | Kashani |
| 2002/0136414 A1 | 9/2002 | Jordan et al. |
| 2002/0146136 A1 | 10/2002 | Carter, Jr. |
| 2003/0002689 A1 | 1/2003 | Folio |
| 2003/0031334 A1 | 2/2003 | Layton et al. |
| 2003/0081115 A1 | 5/2003 | Curry et al. |
| 2003/0108212 A1 | 6/2003 | Tun |
| 2003/0157951 A1 | 8/2003 | Hasty, Jr. |
| 2003/0159569 A1 | 8/2003 | Ohta |
| 2003/0161479 A1 | 8/2003 | Yang et al. |
| 2003/0161492 A1 | 8/2003 | Miller et al. |
| 2003/0179891 A1 | 9/2003 | Rabinowitz et al. |
| 2003/0235311 A1 | 12/2003 | Grancea et al. |
| 2004/0024478 A1 | 2/2004 | Hans et al. |
| 2004/0071294 A1 | 4/2004 | Halgas, Jr. et al. |
| 2004/0114771 A1 | 6/2004 | Vaughan et al. |
| 2004/0131338 A1 | 7/2004 | Asada et al. |

(56) References Cited

U.S. PATENT DOCUMENTS

| | | |
|---|---|---|
| 2004/0237750 A1 | 12/2004 | Smith et al. |
| 2005/0021470 A1 | 1/2005 | Martin et al. |
| 2005/0031143 A1 | 2/2005 | Devantier et al. |
| 2005/0063554 A1 | 3/2005 | Devantier et al. |
| 2005/0147261 A1 | 7/2005 | Yeh |
| 2005/0157885 A1 | 7/2005 | Olney et al. |
| 2005/0276425 A1 | 12/2005 | Forrester et al. |
| 2006/0008256 A1 | 1/2006 | Khedouri et al. |
| 2006/0026521 A1 | 2/2006 | Hotelling et al. |
| 2006/0032357 A1 | 2/2006 | Roovers et al. |
| 2006/0104454 A1 | 5/2006 | Guitarte Perez et al. |
| 2006/0147057 A1 | 7/2006 | Aggarwal et al. |
| 2006/0153391 A1 | 7/2006 | Hooley et al. |
| 2006/0195480 A1 | 8/2006 | Spiegelman et al. |
| 2006/0225097 A1 | 10/2006 | Lawrence-Apfelbaum |
| 2007/0003067 A1 | 1/2007 | Gierl et al. |
| 2007/0025559 A1 | 2/2007 | Mihelich et al. |
| 2007/0032895 A1 | 2/2007 | Nackvi et al. |
| 2007/0038999 A1 | 2/2007 | Millington |
| 2007/0086597 A1 | 4/2007 | Kino |
| 2007/0087686 A1 | 4/2007 | Holm et al. |
| 2007/0116254 A1 | 5/2007 | Looney et al. |
| 2007/0121955 A1 | 5/2007 | Johnston et al. |
| 2007/0142944 A1 | 6/2007 | Goldberg et al. |
| 2007/0217619 A1 | 9/2007 | Hall et al. |
| 2008/0002839 A1 | 1/2008 | Eng |
| 2008/0014989 A1 | 1/2008 | Sandegard et al. |
| 2008/0065247 A1 | 3/2008 | Igoe |
| 2008/0069378 A1 | 3/2008 | Rabinowitz et al. |
| 2008/0077261 A1 | 3/2008 | Baudino et al. |
| 2008/0098027 A1 | 4/2008 | Aarts |
| 2008/0136623 A1 | 6/2008 | Calvarese |
| 2008/0144864 A1 | 6/2008 | Huon et al. |
| 2008/0175411 A1 | 7/2008 | Greve |
| 2008/0214160 A1 | 9/2008 | Jonsson |
| 2008/0232603 A1 | 9/2008 | Soulodre |
| 2008/0266385 A1 | 10/2008 | Smith et al. |
| 2008/0281523 A1 | 11/2008 | Dahl et al. |
| 2009/0003613 A1 | 1/2009 | Christensen |
| 2009/0024662 A1 | 1/2009 | Park et al. |
| 2009/0047993 A1 | 2/2009 | Vasa |
| 2009/0063274 A1 | 3/2009 | Dublin, III et al. |
| 2009/0089054 A1 | 4/2009 | Wang et al. |
| 2009/0110218 A1 | 4/2009 | Swain |
| 2009/0138507 A1 | 5/2009 | Burckart et al. |
| 2009/0147134 A1 | 6/2009 | Iwamatsu |
| 2009/0175476 A1 | 7/2009 | Bottum |
| 2009/0180632 A1 | 7/2009 | Goldberg et al. |
| 2009/0196428 A1 | 8/2009 | Kim |
| 2009/0202082 A1 | 8/2009 | Bharitkar et al. |
| 2009/0252481 A1 | 10/2009 | Ekstrand |
| 2009/0285404 A1 | 11/2009 | Hsu et al. |
| 2009/0304194 A1 | 12/2009 | Eggleston et al. |
| 2009/0304205 A1 | 12/2009 | Hardacker et al. |
| 2009/0316923 A1 | 12/2009 | Tashev et al. |
| 2010/0013550 A1 | 1/2010 | Tanaka |
| 2010/0095332 A1 | 4/2010 | Gran et al. |
| 2010/0104114 A1* | 4/2010 | Chapman ............... H04S 7/305 381/103 |
| 2010/0128902 A1 | 5/2010 | Liu et al. |
| 2010/0135501 A1 | 6/2010 | Corbett et al. |
| 2010/0142735 A1* | 6/2010 | Yoon ............... H04S 7/301 381/303 |
| 2010/0146445 A1 | 6/2010 | Kraut |
| 2010/0162117 A1 | 6/2010 | Basso et al. |
| 2010/0189203 A1 | 7/2010 | Wilhelmsson et al. |
| 2010/0195846 A1 | 8/2010 | Yokoyama |
| 2010/0272270 A1* | 10/2010 | Chaikin ............... H04R 29/008 381/59 |
| 2010/0296659 A1 | 11/2010 | Tanaka |
| 2010/0303248 A1 | 12/2010 | Tawada |
| 2010/0303250 A1 | 12/2010 | Goldberg et al. |
| 2010/0323793 A1 | 12/2010 | Andall |
| 2011/0007904 A1 | 1/2011 | Tomoda et al. |
| 2011/0007905 A1 | 1/2011 | Sato et al. |
| 2011/0029111 A1 | 2/2011 | Sabin et al. |
| 2011/0087842 A1 | 4/2011 | Lu et al. |
| 2011/0091055 A1 | 4/2011 | Leblanc |
| 2011/0135103 A1 | 6/2011 | Sun et al. |
| 2011/0150228 A1 | 6/2011 | Yoon et al. |
| 2011/0150230 A1 | 6/2011 | Tanaka |
| 2011/0150247 A1 | 6/2011 | Oliveras |
| 2011/0170710 A1 | 7/2011 | Son |
| 2011/0216924 A1 | 9/2011 | Berardi et al. |
| 2011/0234480 A1 | 9/2011 | Fino et al. |
| 2011/0235808 A1 | 9/2011 | Kon |
| 2011/0268281 A1 | 11/2011 | Florencio et al. |
| 2011/0293123 A1 | 12/2011 | Neumeyer et al. |
| 2012/0032928 A1 | 2/2012 | Alberth et al. |
| 2012/0051558 A1 | 3/2012 | Kim et al. |
| 2012/0057724 A1 | 3/2012 | Rabinowitz et al. |
| 2012/0063615 A1 | 3/2012 | Crockett et al. |
| 2012/0093320 A1 | 4/2012 | Flaks et al. |
| 2012/0114152 A1 | 5/2012 | Nguyen et al. |
| 2012/0127831 A1 | 5/2012 | Gicklhorn et al. |
| 2012/0140936 A1 | 6/2012 | Bonnick et al. |
| 2012/0148075 A1 | 6/2012 | Goh et al. |
| 2012/0183156 A1 | 7/2012 | Schlessinger et al. |
| 2012/0184335 A1 | 7/2012 | Kim et al. |
| 2012/0213391 A1 | 8/2012 | Usami et al. |
| 2012/0215530 A1 | 8/2012 | Harsch |
| 2012/0237037 A1 | 9/2012 | Ninan et al. |
| 2012/0243697 A1 | 9/2012 | Frye et al. |
| 2012/0263325 A1 | 10/2012 | Freeman et al. |
| 2012/0268145 A1 | 10/2012 | Chandra et al. |
| 2012/0269356 A1 | 10/2012 | Sheerin et al. |
| 2012/0275613 A1 | 11/2012 | Soulodre |
| 2012/0283593 A1 | 11/2012 | Searchfield et al. |
| 2012/0288124 A1 | 11/2012 | Fejzo et al. |
| 2013/0003981 A1 | 1/2013 | Lane |
| 2013/0010970 A1 | 1/2013 | Hegarty et al. |
| 2013/0019193 A1 | 1/2013 | Rhee et al. |
| 2013/0028443 A1 | 1/2013 | Pance et al. |
| 2013/0051572 A1 | 2/2013 | Goh et al. |
| 2013/0066453 A1 | 3/2013 | Seefeldt |
| 2013/0108055 A1 | 5/2013 | Hanna et al. |
| 2013/0129102 A1 | 5/2013 | Li et al. |
| 2013/0129122 A1 | 5/2013 | Johnson et al. |
| 2013/0166227 A1 | 6/2013 | Hermann et al. |
| 2013/0170647 A1 | 7/2013 | Reilly et al. |
| 2013/0173794 A1 | 7/2013 | Agerbak et al. |
| 2013/0179535 A1 | 7/2013 | Baalu et al. |
| 2013/0202131 A1 | 8/2013 | Kemmochi et al. |
| 2013/0211843 A1 | 8/2013 | Clarkson |
| 2013/0216071 A1 | 8/2013 | Maher et al. |
| 2013/0223642 A1 | 8/2013 | Warren et al. |
| 2013/0230175 A1 | 9/2013 | Bech et al. |
| 2013/0259254 A1 | 10/2013 | Xiang et al. |
| 2013/0279706 A1 | 10/2013 | Marti et al. |
| 2013/0305152 A1 | 11/2013 | Griffiths et al. |
| 2013/0315405 A1 | 11/2013 | Kanishima et al. |
| 2013/0329896 A1 | 12/2013 | Krishnaswamy et al. |
| 2013/0331970 A1 | 12/2013 | Beckhardt et al. |
| 2013/0346559 A1 | 12/2013 | Van Erven et al. |
| 2014/0003611 A1 | 1/2014 | Mohammad et al. |
| 2014/0003622 A1 | 1/2014 | Ikizyan et al. |
| 2014/0003623 A1 | 1/2014 | Lang |
| 2014/0003625 A1 | 1/2014 | Sheen et al. |
| 2014/0003626 A1 | 1/2014 | Holman et al. |
| 2014/0003635 A1 | 1/2014 | Mohammad et al. |
| 2014/0006587 A1 | 1/2014 | Kusano |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0029201 A1 | 1/2014 | Yang et al. |
| 2014/0032709 A1 | 1/2014 | Saussy et al. |
| 2014/0037097 A1 | 2/2014 | Labosco |
| 2014/0037107 A1 | 2/2014 | Marino, Jr. et al. |
| 2014/0052770 A1 | 2/2014 | Gran et al. |
| 2014/0064501 A1 | 3/2014 | Olsen et al. |
| 2014/0079242 A1 | 3/2014 | Nguyen et al. |
| 2014/0084014 A1 | 3/2014 | Sim et al. |
| 2014/0086423 A1 | 3/2014 | Domingo et al. |

(56) References Cited

U.S. PATENT DOCUMENTS

| | | |
|---|---|---|
| 2014/0112481 A1 | 4/2014 | Li et al. |
| 2014/0119551 A1 | 5/2014 | Bharitkar et al. |
| 2014/0126730 A1 | 5/2014 | Crawley et al. |
| 2014/0161265 A1 | 6/2014 | Chaikin et al. |
| 2014/0169569 A1 | 6/2014 | Toivanen et al. |
| 2014/0180684 A1 | 6/2014 | Strub |
| 2014/0192986 A1 | 7/2014 | Lee et al. |
| 2014/0219456 A1 | 8/2014 | Morrell et al. |
| 2014/0219483 A1 | 8/2014 | Hong |
| 2014/0226823 A1 | 8/2014 | Sen et al. |
| 2014/0226837 A1 | 8/2014 | Grokop |
| 2014/0242913 A1 | 8/2014 | Pang |
| 2014/0267148 A1 | 9/2014 | Luna et al. |
| 2014/0270202 A1 | 9/2014 | Ivanov et al. |
| 2014/0270282 A1 | 9/2014 | Tammi et al. |
| 2014/0273859 A1 | 9/2014 | Luna et al. |
| 2014/0274212 A1 | 9/2014 | Zurek et al. |
| 2014/0279889 A1 | 9/2014 | Luna |
| 2014/0285313 A1 | 9/2014 | Luna et al. |
| 2014/0286496 A1 | 9/2014 | Luna et al. |
| 2014/0294200 A1 | 10/2014 | Baumgarte et al. |
| 2014/0294201 A1 | 10/2014 | Johnson et al. |
| 2014/0310269 A1 | 10/2014 | Zhang et al. |
| 2014/0321670 A1 | 10/2014 | Nystrom et al. |
| 2014/0323036 A1 | 10/2014 | Daley et al. |
| 2014/0334644 A1 | 11/2014 | Selig et al. |
| 2014/0341399 A1 | 11/2014 | Dusse et al. |
| 2014/0344689 A1 | 11/2014 | Scott et al. |
| 2014/0355768 A1 | 12/2014 | Sen et al. |
| 2014/0355794 A1 | 12/2014 | Morrell et al. |
| 2014/0364056 A1 | 12/2014 | Belk et al. |
| 2014/0369519 A1 | 12/2014 | Leschka et al. |
| 2015/0011195 A1 | 1/2015 | Li |
| 2015/0016642 A1 | 1/2015 | Walsh et al. |
| 2015/0023509 A1 | 1/2015 | Devantier et al. |
| 2015/0031287 A1 | 1/2015 | Pang et al. |
| 2015/0032844 A1 | 1/2015 | Tarr et al. |
| 2015/0036847 A1 | 2/2015 | Donaldson |
| 2015/0036848 A1 | 2/2015 | Donaldson |
| 2015/0043736 A1 | 2/2015 | Olsen et al. |
| 2015/0063610 A1 | 3/2015 | Mossner |
| 2015/0078586 A1 | 3/2015 | Ang et al. |
| 2015/0078596 A1 | 3/2015 | Sprogis |
| 2015/0100991 A1 | 4/2015 | Risberg et al. |
| 2015/0146886 A1 | 5/2015 | Baumgarte |
| 2015/0149943 A1 | 5/2015 | Nguyen et al. |
| 2015/0161360 A1 | 6/2015 | Paruchuri et al. |
| 2015/0195666 A1 | 7/2015 | Massey et al. |
| 2015/0201274 A1 | 7/2015 | Ellner et al. |
| 2015/0208184 A1 | 7/2015 | Tan et al. |
| 2015/0220558 A1 | 8/2015 | Snibbe et al. |
| 2015/0223002 A1 | 8/2015 | Mehta et al. |
| 2015/0223004 A1 | 8/2015 | Deprez et al. |
| 2015/0229699 A1 | 8/2015 | Liu |
| 2015/0260754 A1 | 9/2015 | Perotti et al. |
| 2015/0263692 A1 | 9/2015 | Bush |
| 2015/0264023 A1 | 9/2015 | Reno |
| 2015/0271616 A1 | 9/2015 | Kechichian et al. |
| 2015/0271620 A1 | 9/2015 | Lando et al. |
| 2015/0281866 A1 | 10/2015 | Williams et al. |
| 2015/0286360 A1 | 10/2015 | Wachter |
| 2015/0289064 A1 | 10/2015 | Jensen et al. |
| 2015/0358756 A1 | 12/2015 | Harma et al. |
| 2015/0382128 A1 | 12/2015 | Ridihalgh et al. |
| 2016/0007116 A1 | 1/2016 | Holman |
| 2016/0011846 A1 | 1/2016 | Sheen |
| 2016/0011850 A1 | 1/2016 | Sheen et al. |
| 2016/0014509 A1 | 1/2016 | Hansson et al. |
| 2016/0014510 A1 | 1/2016 | Sheen |
| 2016/0014511 A1 | 1/2016 | Sheen et al. |
| 2016/0014534 A1 | 1/2016 | Sheen |
| 2016/0014536 A1 | 1/2016 | Sheen |
| 2016/0021458 A1 | 1/2016 | Johnson et al. |
| 2016/0021473 A1 | 1/2016 | Riggi et al. |
| 2016/0021481 A1 | 1/2016 | Johnson et al. |
| 2016/0027467 A1 | 1/2016 | Proud |
| 2016/0029142 A1 | 1/2016 | Isaac et al. |
| 2016/0035337 A1 | 2/2016 | Aggarwal et al. |
| 2016/0036404 A1 | 2/2016 | Fleischmann et al. |
| 2016/0036881 A1 | 2/2016 | Tembey et al. |
| 2016/0037277 A1 | 2/2016 | Matsumoto et al. |
| 2016/0061597 A1 | 3/2016 | De et al. |
| 2016/0070525 A1 | 3/2016 | Sheen et al. |
| 2016/0070526 A1 | 3/2016 | Sheen |
| 2016/0073210 A1 | 3/2016 | Sheen |
| 2016/0088438 A1 | 3/2016 | O'Keeffe |
| 2016/0119730 A1 | 4/2016 | Virtanen |
| 2016/0140969 A1 | 5/2016 | Srinivasan et al. |
| 2016/0142849 A1 | 5/2016 | Satheesh et al. |
| 2016/0165297 A1 | 6/2016 | Jamal-Syed et al. |
| 2016/0192098 A1 | 6/2016 | Oishi et al. |
| 2016/0192099 A1 | 6/2016 | Oishi et al. |
| 2016/0212535 A1 | 7/2016 | Le Nerriec et al. |
| 2016/0239255 A1 | 8/2016 | Chavez et al. |
| 2016/0246449 A1 | 8/2016 | Jarske |
| 2016/0254696 A1 | 9/2016 | Plumb et al. |
| 2016/0260140 A1 | 9/2016 | Shirley et al. |
| 2016/0309276 A1 | 10/2016 | Ridihalgh et al. |
| 2016/0330562 A1 | 11/2016 | Crockett |
| 2016/0342201 A1 | 11/2016 | Jehan |
| 2016/0353018 A1 | 12/2016 | Anderson et al. |
| 2016/0366517 A1 | 12/2016 | Chandran et al. |
| 2016/0373860 A1 | 12/2016 | Leschka et al. |
| 2017/0026769 A1 | 1/2017 | Patel |
| 2017/0041724 A1 | 2/2017 | Master et al. |
| 2017/0069338 A1 | 3/2017 | Elliot et al. |
| 2017/0083279 A1 | 3/2017 | Sheen |
| 2017/0086003 A1 | 3/2017 | Rabinowitz et al. |
| 2017/0105084 A1 | 4/2017 | Holman |
| 2017/0133011 A1 | 5/2017 | Chen et al. |
| 2017/0142532 A1 | 5/2017 | Pan |
| 2017/0207762 A1 | 7/2017 | Porter et al. |
| 2017/0215017 A1 | 7/2017 | Hartung et al. |
| 2017/0223447 A1 | 8/2017 | Johnson et al. |
| 2017/0230772 A1 | 8/2017 | Johnson et al. |
| 2017/0257722 A1 | 9/2017 | Kerdranvat et al. |
| 2017/0280265 A1 | 9/2017 | Po |
| 2017/0286052 A1 | 10/2017 | Hartung et al. |
| 2017/0303039 A1 | 10/2017 | Iyer et al. |
| 2017/0311108 A1 | 10/2017 | Patel |
| 2017/0374482 A1 | 12/2017 | McPherson et al. |
| 2018/0122378 A1 | 5/2018 | Mixter et al. |
| 2018/0376268 A1 | 12/2018 | Kerdranvat et al. |
| 2019/0037328 A1 | 1/2019 | McPherson et al. |
| 2019/0058942 A1 | 2/2019 | Garner et al. |
| 2019/0320278 A1 | 10/2019 | McPherson et al. |
| 2020/0005830 A1 | 1/2020 | Wasada et al. |
| 2020/0249346 A1 | 8/2020 | Lim et al. |
| 2020/0382888 A1 | 12/2020 | McPherson et al. |
| 2021/0141050 A1 | 5/2021 | Janssen et al. |

FOREIGN PATENT DOCUMENTS

| | | |
|---|---|---|
| CN | 1622694 A | 6/2005 |
| CN | 1984507 A | 6/2007 |
| CN | 101032187 A | 9/2007 |
| CN | 101047777 A | 10/2007 |
| CN | 101366177 A | 2/2009 |
| CN | 101478296 A | 7/2009 |
| CN | 101491116 A | 7/2009 |
| CN | 101681219 A | 3/2010 |
| CN | 101754087 A | 6/2010 |
| CN | 101800051 A | 8/2010 |
| CN | 102004823 A | 4/2011 |
| CN | 102318325 A | 1/2012 |
| CN | 102823277 A | 12/2012 |
| CN | 102893633 A | 1/2013 |
| CN | 103491397 A | 1/2014 |
| CN | 103811010 A | 5/2014 |
| CN | 103988523 A | 8/2014 |
| CN | 104219604 A | 12/2014 |
| CN | 104247461 A | 12/2014 |
| CN | 104284291 A | 1/2015 |
| CN | 104584061 A | 4/2015 |

(56) References Cited

FOREIGN PATENT DOCUMENTS

| | | |
|---|---|---|
| CN | 104967953 A | 10/2015 |
| CN | 105163221 A | 12/2015 |
| DE | 102007032281 A1 | 1/2009 |
| EP | 0505949 A1 | 9/1992 |
| EP | 0772374 A2 | 5/1997 |
| EP | 1133896 B1 | 8/2002 |
| EP | 1349427 A2 | 10/2003 |
| EP | 1389853 A1 | 2/2004 |
| EP | 2043381 A2 | 4/2009 |
| EP | 1349427 B1 | 12/2009 |
| EP | 2161950 A2 | 3/2010 |
| EP | 2194471 A1 | 6/2010 |
| EP | 2197220 A2 | 6/2010 |
| EP | 2288178 A1 | 2/2011 |
| EP | 2429155 A1 | 3/2012 |
| EP | 1825713 B1 | 10/2012 |
| EP | 2613573 A1 | 7/2013 |
| EP | 2591617 B1 | 6/2014 |
| EP | 2747081 A1 | 6/2014 |
| EP | 2835989 A2 | 2/2015 |
| EP | 2860992 A1 | 4/2015 |
| EP | 2874413 A1 | 5/2015 |
| EP | 3128767 A2 | 2/2017 |
| EP | 2974382 B1 | 4/2017 |
| EP | 2986034 B1 | 5/2017 |
| EP | 3285502 A1 | 2/2018 |
| JP | H02280199 A | 11/1990 |
| JP | H05199593 A | 8/1993 |
| JP | H05211700 A | 8/1993 |
| JP | H06327089 A | 11/1994 |
| JP | H0723490 A | 1/1995 |
| JP | H1069280 A | 3/1998 |
| JP | H10307592 A | 11/1998 |
| JP | 2002502193 A | 1/2002 |
| JP | 2002101500 A | 4/2002 |
| JP | 2003143252 A | 5/2003 |
| JP | 2003304590 A | 10/2003 |
| JP | 2005086686 A | 3/2005 |
| JP | 2005538633 A | 12/2005 |
| JP | 2006017893 A | 1/2006 |
| JP | 2006180039 A | 7/2006 |
| JP | 2006191562 A | 7/2006 |
| JP | 2006340285 A | 12/2006 |
| JP | 2007068125 A | 3/2007 |
| JP | 2007271802 A | 10/2007 |
| JP | 2007325073 A | 12/2007 |
| JP | 2008035254 A | 2/2008 |
| JP | 2008228133 A | 9/2008 |
| JP | 2009188474 A | 8/2009 |
| JP | 2010056970 A | 3/2010 |
| JP | 2010081124 A | 4/2010 |
| JP | 2010141892 A | 6/2010 |
| JP | 2011123376 A | 6/2011 |
| JP | 2011130212 A | 6/2011 |
| JP | 2011164166 A | 8/2011 |
| JP | 2011215378 A | 10/2011 |
| JP | 2011217068 A | 10/2011 |
| JP | 2013247456 A | 12/2013 |
| JP | 2013253884 A | 12/2013 |
| JP | 2014523165 A | 9/2014 |
| JP | 6356331 B2 | 7/2018 |
| JP | 6567735 B2 | 8/2019 |
| KR | 1020060116383 | 11/2006 |
| KR | 1020080011831 | 2/2008 |
| WO | 200153994 | 7/2001 |
| WO | 0182650 A2 | 11/2001 |
| WO | 200182650 | 11/2001 |
| WO | 2003093950 A2 | 11/2003 |
| WO | 2004066673 A1 | 8/2004 |
| WO | 2007016465 A2 | 2/2007 |
| WO | 2011139502 A1 | 11/2011 |
| WO | 2013006323 A2 | 1/2013 |
| WO | 2013016500 A1 | 1/2013 |
| WO | 2013126603 A1 | 8/2013 |
| WO | 2014032709 | 3/2014 |
| WO | 2014032709 A1 | 3/2014 |
| WO | 2014036121 A1 | 3/2014 |
| WO | 2015024881 A1 | 2/2015 |
| WO | 2015108794 A1 | 7/2015 |
| WO | 2015178950 A1 | 11/2015 |
| WO | 2016040324 A1 | 3/2016 |
| WO | 2016054090 A1 | 4/2016 |
| WO | 2017049169 A1 | 3/2017 |

OTHER PUBLICATIONS

Notice of Allowance dated Dec. 21, 2016, issued in connection with U.S. Appl. No. 14/682,182, filed Apr. 9, 2015, 8 pages.
Notice of Allowance dated Feb. 21, 2018, issued in connection with U.S. Appl. No. 15/005,853, filed Jan. 25, 2016, 5 pages.
Notice of Allowance dated Jul. 21, 2017, issued in connection with U.S. Appl. No. 15/211,835, filed Jul. 15, 2016, 10 pages.
Notice of Allowance dated Jun. 21, 2019, issued in connection with U.S. Appl. No. 15/235,598, filed Aug. 12, 2016, 11 pages.
Notice of Allowance dated Oct. 21, 2019, issued in connection with U.S. Appl. No. 16/182,886, filed Nov. 7, 2018, 10 pages.
Notice of Allowance dated Apr. 22, 2021, issued in connection with U.S. Appl. No. 16/812,618, filed Mar. 9, 2020, 12 pages.
Notice of Allowance dated Feb. 22, 2021, issued in connection with U.S. Appl. No. 16/944,884, filed Jul. 31, 2020, 9 pages.
Notice of Allowance dated Jun. 22, 2017, issued in connection with U.S. Appl. No. 14/644,136, filed Mar. 10, 2015, 12 pages.
Notice of Allowance dated Aug. 23, 2018, issued in connection with U.S. Appl. No. 15/909,529, filed Mar. 1, 2018, 8 pages.
Notice of Allowance dated Feb. 23, 2021, issued in connection with U.S. Appl. No. 16/115,525, filed Aug. 28, 2018, 8 pages.
Notice of Allowance dated Jun. 23, 2016, issued in connection with U.S. Appl. No. 14/921,781, filed Oct. 23, 2015, 8 pages.
Notice of Allowance dated Mar. 23, 2020, issued in connection with U.S. Appl. No. 16/542,418, filed Aug. 16, 2019, 5 pages.
Notice of Allowance dated May 23, 2018, issued in connection with U.S. Appl. No. 15/698,283, filed Sep. 7, 2017, 8 pages.
Notice of Allowance dated Nov. 23, 2020, issued in connection with U.S. Appl. No. 16/403,077, filed May 3, 2019, 6 pages.
Notice of Allowance dated Oct. 23, 2017, issued in connection with U.S. Appl. No. 14/481,522, filed Sep. 9, 2014, 16 pages.
Notice of Allowance dated Oct. 23, 2020, issued in connection with U.S. Appl. No. 16/555,846, filed Aug. 29, 2019, 5 pages.
Notice of Allowance dated Sep. 23, 2016, issued in connection with U.S. Appl. No. 15/070,160, filed Mar. 15, 2016, 7 pages.
Notice of Allowance dated Jul. 24, 2019, issued in connection with U.S. Appl. No. 15/229,693, filed Aug. 5, 2016, 13 pages.
Notice of Allowance dated Jul. 24, 2020, issued in connection with U.S. Appl. No. 16/665,415, filed Oct. 28, 2019, 12 pages.
Notice of Allowance dated May 24, 2017, issued in connection with U.S. Appl. No. 14/997,868, filed Jan. 18, 2016, 5 pages.
Notice of Allowance dated Nov. 24, 2017, issued in connection with U.S. Appl. No. 15/681,640, filed Aug. 21, 2017, 8 pages.
Notice of Allowance dated Apr. 25, 2017, issued in connection with U.S. Appl. No. 14/696,014, filed Apr. 24, 2015, 7 pages.
Notice of Allowance dated Apr. 25, 2017, issued in connection with U.S. Appl. No. 15/207,682, filed Jul. 12, 2016, 7 pages.
Notice of Allowance dated Apr. 25, 2019, issued in connection with U.S. Appl. No. 15/806,126, filed Nov. 7, 2017, 8 pages.
Notice of Allowance dated Jan. 25, 2021, issued in connection with U.S. Appl. No. 17/129,670, filed Dec. 21, 2020, 10 pages.
Notice of Allowance dated Oct. 25, 2016, issued in connection with U.S. Appl. No. 14/826,873, filed Aug. 14, 2015, 5 pages.
Notice of Allowance dated Feb. 26, 2016, issued in connection with U.S. Appl. No. 14/921,762, filed Oct. 23, 2015, 7 pages.
Notice of Allowance dated Jul. 26, 2016, issued in connection with U.S. Appl. No. 14/481,511, filed Sep. 9, 2014, 12 pages.
Notice of Allowance dated Oct. 26, 2016, issued in connection with U.S. Appl. No. 14/811,587, filed Jul. 28, 2015, 11 pages.
Notice of Allowance dated Feb. 27, 2017, issued in connection with U.S. Appl. No. 14/805,340, filed Jul. 21, 2015, 9 pages.
Notice of Allowance dated Jul. 27, 2017, issued in connection with U.S. Appl. No. 15/005,853, filed Jan. 25, 2016, 5 pages.

(56) References Cited

OTHER PUBLICATIONS

Notice of Allowance dated Jun. 27, 2017, issued in connection with U.S. Appl. No. 15/344,069, filed Nov. 4, 2016, 8 pages.
Notice of Allowance dated Oct. 27, 2020, issued in connection with U.S. Appl. No. 16/555,832, filed Aug. 29, 2019, 5 pages.
Notice of Allowance dated Oct. 27, 2021, issued in connection with U.S. Appl. No. 17/135,293, filed Dec. 28, 2020, 11 pages.
Notice of Allowance dated Aug. 28, 2017, issued in connection with U.S. Appl. No. 15/089,004, filed Apr. 1, 2016, 5 pages.
Notice of Allowance dated Jul. 28, 2017, issued in connection with U.S. Appl. No. 14/678,263, filed Apr. 3, 2015, 10 pages.
Notice of Allowance dated Jul. 28, 2017, issued in connection with U.S. Appl. No. 15/211,822, filed Jul. 15, 2016, 9 pages.
Notice of Allowance dated Mar. 28, 2018, issued in connection with U.S. Appl. No. 15/673,170, filed Aug. 9, 2017, 5 pages.
Notice of Allowance dated Aug. 29, 2018, issued in connection with U.S. Appl. No. 15/357,520, filed Nov. 21, 2016, 11 pages.
Notice of Allowance dated Aug. 29, 2018, issued in connection with U.S. Appl. No. 15/718,556, filed Sep. 28, 2017, 8 pages.
Notice of Allowance dated Aug. 29, 2019, issued in connection with U.S. Appl. No. 16/185,906, filed Nov. 9, 2018, 8 pages.
Notice of Allowance dated Dec. 29, 2017, issued in connection with U.S. Appl. No. 14/793,205, filed Jul. 7, 2015, 5 pages.
Notice of Allowance dated Jul. 29, 2016, issued in connection with U.S. Appl. No. 14/481,522, filed Sep. 2, 39014, 11 pages.
Notice of Allowance dated Oct. 29, 2015, issued in connection with U.S. Appl. No. 14/216,306, filed Mar. 17, 2014, 9 pages.
Notice of Allowance dated Sep. 29, 2021, issued in connection with U.S. Appl. No. 17/207,640, filed Mar. 20, 2021, 13 pages.
Notice of Allowance dated Mar. 3, 2021, issued in connection with U.S. Appl. No. 16/403,077, filed May 3, 2019, 6 pages.
Notice of Allowance dated Mar. 3, 2021, issued in connection with U.S. Appl. No. 17/078,382, filed Oct. 23, 2020, 9 pages.
Notice of Allowance dated May 3, 2019, issued in connection with U.S. Appl. No. 15/217,399, filed Jul. 22, 2016, 7 pages.
Notice of Allowance dated May 3, 2019, issued in connection with U.S. Appl. No. 16/181,583, filed on Nov. 6, 2018, 7 pages.
Non-Final Office Action dated Jun. 20, 2017, issued in connection with U.S. Appl. No. 15/207,682, filed Jul. 12, 2016, 17 pages.
Non-Final Office Action dated Dec. 21, 2018, issued in connection with U.S. Appl. No. 16/181,213, filed Nov. 5, 2018, 13 pages.
Non-Final Office Action dated Jun. 21, 2016, issued in connection with U.S. Appl. No. 14/678,248, filed Apr. 3, 2015, 10 pages.
Non-Final Office Action dated Jun. 21, 2019, issued in connection with U.S. Appl. No. 16/181,865, filed Nov. 6, 2018, 12 pages.
Non-Final Office Action dated Nov. 21, 2014, issued in connection with U.S. Appl. No. 13/536,493, filed Jun. 28, 2012, 20 pages.
Non-Final Office Action dated Jun. 22, 2018, issued in connection with U.S. Appl. No. 15/217,399, filed Jul. 22, 2016, 33 pages.
Non-Final Office Action dated Jun. 22, 2020, issued in connection with U.S. Appl. No. 16/555,832, filed Aug. 29, 2019, 15 pages.
Non-Final Office Action dated Oct. 22, 2019, issued in connection with U.S. Appl. No. 16/416,619, filed May 20, 2019, 12 pages.
Non-Final Office Action dated Oct. 22, 2021, issued in connection with U.S. Appl. No. 16/949,951, filed Nov. 20, 2020, 10 pages.
Non-Final Office Action dated Jan. 23, 2019, issued in connection with U.S. Appl. No. 16/113,032, filed Aug. 27, 2018, 8 pages.
Non-Final Office Action dated May 24, 2019, issued in connection with U.S. Appl. No. 16/401,981, filed May 2, 2019, 14 pages.
Non-Final Office Action dated Oct. 25, 2016, issued in connection with U.S. Appl. No. 14/864,506, filed Sep. 24, 2015, 9 pages.
Non-Final Office Action dated Sep. 26, 2018, issued in connection with U.S. Appl. No. 15/229,693, filed Aug. 5, 2016, 25 pages.
Non-Final Office Action dated Dec. 27, 2017, issued in connection with U.S. Appl. No. 15/357,520, filed Nov. 21, 2016, 28 pages.
Non-Final Office Action dated Feb. 27, 2018, issued in connection with U.S. Appl. No. 14/864,393, filed Sep. 24, 2015, 19 pages.
Non-Final Office Action dated Feb. 27, 2018, issued in connection with U.S. Appl. No. 15/718,556, filed Sep. 28, 2017, 19 pages.
Non-Final Office Action dated Jul. 27, 2016, issued in connection with U.S. Appl. No. 14/696,014, filed Apr. 24, 2015, 11 pages.
Non-Final Office Action dated Mar. 27, 2017, issued in connection with U.S. Appl. No. 15/211,835, filed Jul. 15, 2016, 30 pages.
Non-Final Office Action dated Mar. 27, 2018, issued in connection with U.S. Appl. No. 15/785,088, filed Oct. 16, 2017, 11 pages.
Non-Final Office Action dated Jul. 28, 2016, issued in connection with U.S. Appl. No. 14/884,001, filed Oct. 15, 2015, 8 pages.
Non-Final Office Action dated May 28, 2021, issued in connection with U.S. Appl. No. 17/098,134, filed Nov. 13, 2020, 14 pages.
Non-Final Office Action dated Nov. 28, 2017, issued in connection with U.S. Appl. No. 15/673,170, filed Aug. 9, 2017, 7 pages.
Non-Final Office Action dated Sep. 28, 2018, issued in connection with U.S. Appl. No. 15/588,186, filed May 5, 2017, 12 pages.
Non-Final Office Action dated Sep. 28, 2018, issued in connection with U.S. Appl. No. 15/595,519, filed May 15, 2017, 12 pages.
Non-Final Office Action dated Mar. 29, 2018, issued in connection with U.S. Appl. No. 15/716,313, filed Sep. 26, 2017, 16 pages.
Non-Final Office Action dated May 3, 2021, issued in connection with U.S. Appl. No. 16/564,766, filed Sep. 9, 2019, 16 pages.
Non-Final Office Action dated Aug. 30, 2019, issued in connection with U.S. Appl. No. 16/115,525, filed Aug. 28, 2018, 13 pages.
Non-Final Office Action dated May 30, 2017, issued in connection with U.S. Appl. No. 15/478,770, filed Apr. 4, 2017, 9 pages.
Non-Final Office Action dated Mar. 31, 2021, issued in connection with U.S. Appl. No. 16/919,467, filed Jul. 2, 2020, 10 pages.
Non-Final Office Action dated May 31, 2019, issued in connection with U.S. Appl. No. 16/185,906, filed Nov. 9, 2018, 7 pages.
Non-Final Office Action dated Mar. 4, 2020, issued in connection with U.S. Appl. No. 15/966,534, filed Apr. 30, 2018, 11 pages.
Non-Final Office Action dated Jan. 5, 2021, issued in connection with U.S. Appl. No. 17/078,382, filed Oct. 23, 2020, 11 pages.
Non-Final Office Action dated Jul. 6, 2020, issued in connection with U.S. Appl. No. 16/812,618, filed Mar. 9, 2020, 15 pages.
Non-Final Office Action dated Nov. 6, 2018, issued in connection with U.S. Appl. No. 15/235,598, filed Aug. 12, 2016, 13 pages.
Non-Final Office Action dated Feb. 7, 2019, issued in connection with U.S. Appl. No. 15/859,311, filed Dec. 29, 2017, 9 pages.
Non-Final Office Action dated Feb. 7, 2019, issued in connection with U.S. Appl. No. 15/865,221, filed Jan. 8, 2018, 10 pages.
Non-Final Office Action dated Jun. 8, 2021, issued in connection with U.S. Appl. No. 17/207,640, filed Mar. 20, 2021, 17 pages.
Non-Final Office Action dated Jan. 9, 2018, issued in connection with U.S. Appl. No. 15/698,283, filed Sep. 7, 2017, 18 pages.
Non-Final Office Action dated Jan. 9, 2018, issued in connection with U.S. Appl. No. 15/727,913, filed Oct. 9, 2017, 8 pages.
Notice of Allowance dated Jul. 21, 2021, issued in connection with U.S. Appl. No. 16/944,884, filed Jul. 31, 2020, 3 pages.
Notice of Allowance dated Aug. 4, 2021, issued in connection with U.S. Appl. No. 17/104,466, filed Nov. 25, 2020, 9 pages.
Notice of Allowance dated May 1, 2017, issued in connection with U.S. Appl. No. 14/805,140, filed Jul. 21, 2015, 13 pages.
Notice of Allowance dated Nov. 2, 2016, issued in connection with U.S. Appl. No. 14/884,001, filed Oct. 15, 2015, 8 pages.
Notice of Allowance dated Jun. 3, 2016, issued in connection with U.S. Appl. No. 14/921,799, filed Oct. 23, 2015, 8 pages.
Notice of Allowance dated Nov. 4, 2016, issued in connection with U.S. Appl. No. 14/481,514, filed Sep. 9, 2014, 10 pages.
Notice of Allowance dated Jun. 6, 2018, issued in connection with U.S. Appl. No. 15/727,913, filed Oct. 9, 2017, 5 pages.
Notice of Allowance dated Dec. 7, 2015, issued in connection with U.S. Appl. No. 14/216,325, filed Mar. 17, 2014, 7 pages.
Notice of Allowance dated Nov. 9, 2016, issued in connection with U.S. Appl. No. 14/805,340, filed Jul. 21, 2015, 13 pages.
Notice of Allowance dated Feb. 1, 2018, issued in connection with U.S. Appl. No. 15/480,265, filed Apr. 5, 2017, 8 pages.
Notice of Allowance dated Nov. 1, 2021, issued in connection with U.S. Appl. No. 17/103,556, filed Nov. 24, 2020, 5 pages.
European Patent Office, European EPC Article 94.3 dated Aug. 16, 2021, issued in connection with European Application No. 19765920.4, 5 pages.

(56) References Cited

OTHER PUBLICATIONS

European Patent Office, European EPC Article 94.3 dated Oct. 29, 2021, issued in connection with European Application No. 20196286.7, 5 pages.
European Patent Office, European EPC Article 94.3 dated Apr. 30, 2021, issued in connection with European Application No. 20196286.7, 5 pages.
European Patent Office, European Examination Report dated May 11, 2018, issued in connection with European Application No. 16748186.0, 6 pages.
European Patent Office, European Extended Search Report dated Dec. 11, 2020, issued in connection with European Application No. 20196286.7, 6 pages.
European Patent Office, European Extended Search Report dated Jan. 14, 2022, issued in connection with European Application No. 21171959.6, 12 pages.
European Patent Office, European Extended Search Report dated Mar. 16, 2020, issued in connection with European Application No. 19209551.1, 7 pages.
European Patent Office, European Extended Search Report dated Oct. 16, 2018, issued in connection with European Application No. 17185193.4, 6 pages.
European Patent Office, European Extended Search Report dated Jul. 17, 2019, issued in connection with European Application No. 19167365.6, 7 pages.
European Patent Office, European Extended Search Report dated Mar. 25, 2020, issued in connection with European Application No. 19215348.4, 10 pages.
European Patent Office, European Extended Search Report dated Jun. 26, 2018, issued in connection with European Application No. 18171206.8, 9 pages.
European Patent Office, European Extended Search Report dated Sep. 8, 2017, issued in connection with European Application No. 17000460.0, 8 pages.
European Patent Office, European Office Action dated Nov. 10, 2020, issued in connection with European Application No. 19168800.1, 5 pages.
European Patent Office, European Office Action dated Dec. 11, 2018, issued in connection with European Application No. 15778787.0, 6 pages.
European Patent Office, European Office Action dated Jul. 11, 2019, issued in connection with European Application No. 15778787.0, 10 pages.
European Patent Office, European Office Action dated Sep. 16, 2020, issued in connection with European Application No. 15778787.0, 7 pages.
European Patent Office, European Office Action dated Aug. 19, 2020, issued in connection with European Application No. 17754501.9, 6 pages.
European Patent Office, European Office Action dated Nov. 2, 2018, issued in connection with European Application No. 18171206.8, 6 pages.
European Patent Office, European Office Action dated Jan. 3, 2020, issued in connection with European Application No. 17703876.7, 8 pages.
European Patent Office, European Office Action dated Feb. 4, 2019, issued in connection with European Application No. 17703876.7, 9 pages.
European Patent Office, European Office Action dated Sep. 7, 2020, issued in connection with European Application No. 19161826.3, 6 pages.
European Patent Office, European Office Action dated Jul. 9, 2020, issued in connection with European Application No. 19167365.6, 4 pages.
European Patent Office, European Office Action dated May 9, 2019, issued in connection with European Application No. 18171206.8, 7 pages.
European Patent Office, European Partial Search Report dated Jun. 7, 2019, issued in connection with European Application No. 19161826.3, 17 pages.
European Patent Office, European Search Report dated Jun. 13, 2019, issued in connection with European Application No. 18204450.3, 11 pages.
European Patent Office, European Search Report dated Sep. 13, 2019, issued in connection with European Application No. 19161826.3, 13 pages.
European Patent Office, European Search Report dated Jan. 18, 2018, issued in connection with European Patent Application No. 17185193.4, 9 pages.
European Patent Office, European Search Report dated Jul. 9, 2019, issued in connection with European Application No. 19168800.1, 12 pages.
European Patent Office, Examination Report dated Jul. 12, 2021, issued in connection with European Patent Application No. 17754501.9 6 pages.
European Patent Office, Extended European Search Report dated Jan. 5, 2017, issued in connection with European Patent Application No. 15765555.6, 8 pages.
European Patent Office, Extended Search Report dated Jan. 25, 2017, issued in connection with European Application No. 15765548.1, 7 pages.
European Patent Office, Extended Search Report dated Apr. 26, 2017, issued in connection with European Application No. 15765548.1, 10 pages.
European Patent Office, Office Action dated Nov. 12, 2018, issued in connection with European Application No. 17000460.0, 6 pages.
European Patent Office, Office Action dated Jun. 13, 2017, issued in connection with European patent application No. 17000484.0, 10 pages.
European Patent Office, Office Action dated Dec. 15, 2016, issued in connection with European Application No. 15766998.7, 7 pages.
European Patent Office, Summons to Attend Oral Proceedings mailed on Nov. 15, 2018, issued in connection with European Application No. 16748186.0, 57 pages.
European Patent Office, Summons to Attend Oral Proceedings mailed on Sep. 24, 2019, issued in connection with European Application No. 17000460.0, 5 pages.
Ex Parte Quayle Office Action dated Apr. 15, 2019, issued in connection with U.S. Appl. No. 15/235,598, filed Aug. 12, 2016, 7 pages.
Ex Parte Quayle Office Action dated Dec. 26, 2019, issued in connection with U.S. Appl. No. 16/542,418, filed Aug. 16, 2019, 7 pages.
Excerpts from Andrew Tanenbaum, Computer Networks. 4th Edition. Copyright 2003, 87 pages [produced by Google in IPR of U.S. Pat. No. 9,219,460, IPR2021-00475 on Feb. 5, 2021].
Excerpts from Morfey, Christopher L., Dictionary of Acoustics. Copyright 2001, 4 pages [produced by Google in IPR of U.S. Pat. No. 9,219,460, IPR2021-00475 on Feb. 5, 2021].
Final Office Action dated Dec. 2, 2019, issued in connection with U.S. Appl. No. 15/005,496, filed Jan. 25, 2016, 19 pages.
Final Office Action dated Apr. 3, 2017, issued in connection with U.S. Appl. No. 14/678,248, filed Apr. 3, 2015, 22 pages.
Final Office Action dated Jul. 13, 2017, issued in connection with U.S. Appl. No. 14/726,921, filed Jun. 1, 2015, 10 pages.
Final Office Action dated Jun. 13, 2017, issued in connection with U.S. Appl. No. 14/481,505, filed Sep. 9, 2014, 22 pages.
Final Office Action dated Dec. 14, 2020, issued in connection with U.S. Appl. No. 16/812,618, filed Mar. 9, 2020, 17 pages.
Final Office Action dated Feb. 14, 2019, issued in connection with U.S. Appl. No. 15/005,496, filed Jan. 25, 2016, 16 pages.
Final Office Action dated Feb. 14, 2019, issued in connection with U.S. Appl. No. 15/217,399, filed Jul. 22, 2016, 37 pages.
Final Office Action dated Oct. 14, 2016, issued in connection with U.S. Appl. No. 14/682,182, filed Apr. 9, 2015, 16 pages.
Final Office Action dated Oct. 17, 2016, issued in connection with U.S. Appl. No. 14/678,248, filed Apr. 3, 2015, 22 pages.
European Patent Office, European Extended Search Report dated Jun. 10, 2022, issued in connection with European Application No. 22155834.9, 8 pages.
European Patent Office, Summons to Attend Oral Proceedings mailed on Apr. 22, 2022, issued in connection with European Application No. 15778787.0, 6 pages.

(56) References Cited

OTHER PUBLICATIONS

*Google LLC* v. *Sonos, Inc.*, Declaration of Michael T. Johnson, Ph.D. Exhibit 2016 in Patent Owner Response to Petition for Inter Partes Review of U.S. Pat. No. 9,219,460, IPR2021-00475, Jun. 13, 2022, 117 pages.

*Google LLC* v. *Sonos, Inc.*, Deposition of Jeffrey S. Vipperman, Ph.D. Exhibit 2017 in Patent Owner Response to Petition for Inter Partes Review of U.S. Pat. No. 9,219,460, IPR2021-00475, Jun. 13, 2022, 183 pages.

*Google LLC* v. *Sonos, Inc.*, File History of U.S. Appl. No. 61/601,529 Maher. Exhibit 2018 in Patent Owner Response to Petition for Inter Partes Review of U.S. Pat. No. 9,219,460, IPR2021-00475, Jun. 13, 2022, 14 pages.

*Google LLC* v. *Sonos, Inc.*, Patent Owner Response to Petition for Inter Partes Review of U.S. Pat. No. 9,219,460, PR2021-00475, Jun. 13, 2022, 49 pages.

Non-Final Office Action dated Mar. 18, 2022, issued in connection with U.S. Appl. No. 17/033,818, filed Sep. 27, 2020, 12 pages.

Non-Final Office Action dated Jun. 24, 2022, issued in connection with U.S. Appl. No. 17/373,179, filed Jul. 12, 2021, 8 pages.

Non-Final Office Action dated Feb. 25, 2022, issued in connection with U.S. Appl. No. 17/107,157, filed Nov. 30, 2020, 30 pages.

Notice of Allowance dated Feb. 16, 2022, issued in connection with U.S. Appl. No. 16/919,467, filed Jul. 2, 2020, 9 pages.

Notice of Allowance dated Apr. 20, 2022, issued in connection with U.S. Appl. No. 17/098,134, filed Nov. 13, 2020, 5 pages.

Notice of Allowance dated Mar. 3, 2022, issued in connection with U.S. Appl. No. 17/135,308, filed Dec. 28, 2020, 7 pages.

Notice of Allowance dated May 5, 2022, issued in connection with U.S. Appl. No. 17/316,371, filed May 10, 2021, 10 pages.

Notice of Allowance dated Apr. 10, 2015, issued in connection with U.S. Appl. No. 13/536,493, filed Jun. 28, 2012, 8 pages.

Notice of Allowance dated Aug. 10, 2018, issued in connection with U.S. Appl. No. 15/785,088, filed Oct. 16, 2017, 6 pages.

Notice of Allowance dated Jul. 10, 2018, issued in connection with U.S. Appl. No. 15/673,170, filed Aug. 9, 2017, 2 pages.

Notice of Allowance dated Jun. 10, 2020, issued in connection with U.S. Appl. No. 16/713,858, filed Dec. 13, 2019, 8 pages.

Notice of Allowance dated Dec. 11, 2018, issued in connection with U.S. Appl. No. 15/909,327, filed Mar. 1, 2018, 10 pages.

Notice of Allowance dated Feb. 11, 2019, issued in connection with U.S. Appl. No. 15/588,186, filed May 5, 2017, 5 pages.

Notice of Allowance dated Jul. 11, 2017, issued in connection with U.S. Appl. No. 14/678,248, filed Apr. 3, 2015, 11 pages.

Notice of Allowance dated Mar. 11, 2015, issued in connection with U.S. Appl. No. 13/340,126, filed Dec. 29, 2011, 7 pages.

Notice of Allowance dated Apr. 12, 2016, issued in connection with U.S. Appl. No. 14/681,465, filed Apr. 2, 38015, 13 pages.

Notice of Allowance dated Aug. 12, 2019, issued in connection with U.S. Appl. No. 16/416,648, filed May 20, 2019, 7 pages.

Notice of Allowance dated Dec. 12, 2016, issued in connection with U.S. Appl. No. 14/805,140, filed Jul. 21, 2015, 24 pages.

Notice of Allowance dated Dec. 12, 2017, issued in connection with U.S. Appl. No. 14/481,505, filed Sep. 9, 2014, 9 pages.

Notice of Allowance dated Jan. 12, 2022, issued in connection with U.S. Appl. No. 16/994,627, filed Aug. 16, 2020, 7 pages.

Notice of Allowance dated Nov. 12, 2019, issued in connection with U.S. Appl. No. 15/955,545, filed Apr. 17, 2018, 9 pages.

Notice of Allowance dated Sep. 12, 2016, issued in connection with U.S. Appl. No. 15/066,072, filed Mar. 10, 2016, 7 pages.

Notice of Allowance dated Sep. 12, 2017, issued in connection with U.S. Appl. No. 15/207,682, filed Jul. 12, 2016, 8 pages.

Notice of Allowance dated Apr. 13, 2020, issued in connection with U.S. Appl. No. 16/181,865, filed Nov. 3, 2018, 10 pages.

Notice of Allowance dated Feb. 13, 2017, issued in connection with U.S. Appl. No. 14/864,506, filed Sep. 24, 2015, 8 pages.

Notice of Allowance dated Nov. 13, 2017, issued in connection with U.S. Appl. No. 14/726,921, filed Jun. 1, 2015, 8 pages.

Notice of Allowance dated Jul. 14, 2020, issued in connection with U.S. Appl. No. 16/556,297, filed Aug. 30, 2019, 11 pages.

Notice of Allowance dated Mar. 14, 2019, issued in connection with U.S. Appl. No. 15/343,996, filed Nov. 4, 2016, 8 pages.

Notice of Allowance dated Oct. 14, 2021, issued in connection with U.S. Appl. No. 16/115,525, filed Aug. 28, 2018, 5 pages.

Notice of Allowance dated Jan. 15, 2019, issued in connection with U.S. Appl. No. 16/115,524, filed Aug. 28, 2018, 8 pages.

Notice of Allowance dated Jun. 15, 2017, issued in connection with U.S. Appl. No. 15/096,827, filed Apr. 12, 2016, 5 pages.

Notice of Allowance dated Mar. 15, 2017, issued in connection with U.S. Appl. No. 14/826,856, filed Aug. 14, 2015, 7 pages.

Notice of Allowance dated May 15, 2019, issued in connection with U.S. Appl. No. 16/113,032, filed Aug. 27, 2018, 9 pages.

Notice of Allowance dated Nov. 15, 2021, issued in connection with U.S. Appl. No. 16/994,874, filed Aug. 17, 2020, 9 pages.

Notice of Allowance dated Oct. 15, 2018, issued in connection with U.S. Appl. No. 15/716,313, filed Sep. 26, 2017, 10 pages.

Notice of Allowance dated Jul. 16, 2020, issued in connection with U.S. Appl. No. 16/530,324, filed Aug. 2, 2019, 9 pages.

Notice of Allowance dated Jun. 16, 2017, issued in connection with U.S. Appl. No. 14/884,001, filed Oct. 15, 2015, 8 pages.

Notice of Allowance dated May 16, 2019, issued in connection with U.S. Appl. No. 16/181,213, filed Nov. 5, 2018, 10 pages.

Notice of Allowance dated Oct. 16, 2017, issued in connection with U.S. Appl. No. 15/478,770, filed Apr. 4, 2017, 10 pages.

Notice of Allowance dated Oct. 16, 2019, issued in connection with U.S. Appl. No. 16/401,981, filed May 2, 2019, 8 pages.

Notice of Allowance dated Sep. 16, 2016, issued in connection with U.S. Appl. No. 15/066,049, filed Mar. 10, 2016, 7 pages.

Notice of Allowance dated Dec. 17, 2018, issued in connection with U.S. Appl. No. 16/055,884, filed Aug. 6, 2018, 5 pages.

Notice of Allowance dated May 17, 2017, issued in connection with U.S. Appl. No. 15/339,260, filed Oct. 31, 2016, 7 pages.

Notice of Allowance dated Oct. 17, 2019, issued in connection with U.S. Appl. No. 16/542,433, filed Aug. 16, 2019, 9 pages.

Notice of Allowance dated Mar. 18, 2019, issued in connection with U.S. Appl. No. 16/056,862, filed Aug. 7, 2018, 12 pages.

Notice of Allowance dated Mar. 18, 2021, issued in connection with U.S. Appl. No. 15/005,496, filed Jan. 25, 2016, 8 pages.

Notice of Allowance dated Oct. 18, 2021, issued in connection with U.S. Appl. No. 16/570,679, filed Sep. 13, 2019, 9 pages.

Notice of Allowance dated Aug. 19, 2016, issued in connection with U.S. Appl. No. 14/644,136, filed Mar. 10, 2015, 12 pages.

Notice of Allowance dated Jan. 19, 2022, issued in connection with U.S. Appl. No. 17/399,294, filed Aug. 11, 2021, 11 pages.

Notice of Allowance dated Jun. 19, 2017, issued in connection with U.S. Appl. No. 14/793,190, filed Jul. 7, 2015, 5 pages.

Notice of Allowance dated Sep. 19, 2017, issued in connection with U.S. Appl. No. 14/793,205, filed Jul. 7, 2015, 16 pages.

Notice of Allowance dated Sep. 19, 2018, issued in connection with U.S. Appl. No. 14/864,393, filed Sep. 24, 2015, 10 pages.

Notice of Allowance dated Feb. 2, 2022, issued in connection with U.S. Appl. No. 16/949,951, filed Nov. 20, 2020, 8 pages.

Notice of Allowance dated Mar. 2, 2020, issued in connection with U.S. Appl. No. 16/213,552, filed Dec. 7, 2018, 9 pages.

Notice of Allowance dated Sep. 2, 2021, issued in connection with U.S. Appl. No. 17/357,302, filed Jun. 24, 2021, 10 pages.

Notice of Allowance dated Apr. 20, 2017, issued in connection with U.S. Appl. No. 14/940,779, filed Nov. 13, 2015, 11 pages.

Notice of Allowance dated Nov. 20, 2017, issued in connection with U.S. Appl. No. 15/298,115, filed Oct. 19, 2016, 10 pages.

Advisory Action dated Jul. 1, 2019, issued in connection with U.S. Appl. No. 15/229,693, filed Aug. 5, 2016, 2 pages.

Advisory Action dated Jul. 10, 2018, issued in connection with U.S. Appl. No. 15/056,553, filed Feb. 29, 2016, 3 pages.

Advisory Action dated Dec. 11, 2020, issued in connection with U.S. Appl. No. 15/005,496, filed Jan. 25, 2016, 3 pages.

Advisory Action dated Jul. 12, 2018, issued in connection with U.S. Appl. No. 15/166,241, filed May 26, 2016, 3 pages.

Advisory Action dated Jul. 12, 2018, issued in connection with U.S. Appl. No. 15/235,598, filed Aug. 12, 2016, 3 pages.

Advisory Action dated Aug. 16, 2017, issued in connection with U.S. Appl. No. 14/481,505, filed Sep. 9, 2014, 3 pages.

(56) References Cited

OTHER PUBLICATIONS

Advisory Action dated Jun. 19, 2018, issued in connection with U.S. Appl. No. 15/229,693, filed Aug. 5, 2016, 3 pages.
Advisory Action dated Sep. 19, 2017, issued in connection with U.S. Appl. No. 14/726,921, filed Jun. 1, 2015, 3 pages.
Advisory Action dated Nov. 22, 2021, issued in connection with U.S. Appl. No. 16/919,467, filed Jul. 2, 2020, 4 pages.
Advisory Action dated Jun. 3, 2020, issued in connection with U.S. Appl. No. 16/115,525, filed Aug. 28, 2018, 3 pages.
Advisory Action dated Apr. 30, 2019, issued in connection with U.S. Appl. No. 15/005,496, filed Jan. 25, 2016, 3 pages.
Advisory Action dated Feb. 7, 2019, issued in connection with U.S. Appl. No. 15/806,126, filed Nov. 7, 2017, 3 pages.
An Overview of IEEE 1451.4 Transducer Electronic Data Sheets (TEDS) National Instruments, 19 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
"AV Amplifier DSP-Z7", Yamaha, 2008 [retrieved on Jan. 3, 2022], Retrieved from the Internet: URL: https://de.yamaha.com/files/download/other_assets/6/318616/DSP-Z7_en.pdf, pp. 1-154.
BeoLab5 User Manual. Bang & Olufsen. Version 1.0, 20 pages [produced by Google in WDTX Case No. 6:20-cv-00881 Answer on Jan. 8, 2021].
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Burger, Dennis, "Automated Room Correction Explained," hometheaterreview.com, Nov. 18, 2013, http://hometheaterreview.com/automated-room-correction-explained/ Retrieved Oct. 10, 2014, 3 pages.
Chen, Trista P. et al. VRAPS: Visual Rhythm-Based Audio Playback System. IEEE, Gracenote, Inc., 2010, pp. 721-722.
Chinese Patent Office, Chinese Office Action and Translation dated Apr. 1, 2021, issued in connection with Chinese Application No. 201910395715.4, 8 pages.
Chinese Patent Office, First Office Action and Translation dated Nov. 3, 2021, issued in connection with Chinese Application No. 202011278502.2, 10 pages.
Chinese Patent Office, First Office Action and Translation dated Jun. 19, 2019, issued in connection with Chinese Application No. 201680054189.X, 11 pages.
Chinese Patent Office, First Office Action and Translation dated Feb. 22, 2021, issued in connection with Chinese Application No. 202010187024.8, 11 pages.
Chinese Patent Office, First Office Action and Translation dated Dec. 24, 2020, issued in connection with Chinese Application No. 201910978233.1, 15 pages.
Chinese Patent Office, First Office Action and Translation dated Jan. 28, 2021, issued in connection with Chinese Application No. 201680054164.X, 19 pages.
Chinese Patent Office, First Office Action and Translation dated Jun. 29, 2020, issued in connection with Chinese Application No. 201780057093.3, 11 pages.
Chinese Patent Office, First Office Action and Translation dated Feb. 3, 2021, issued in connection with Chinese Application No. 202010095178.4, 15 pages.
Chinese Patent Office, First Office Action and Translation dated Aug. 4, 2020, issued in connection with Chinese Application No. 201910395715.4, 22 pages.
Chinese Patent Office, First Office Action dated Aug. 11, 2017, issued in connection with Chinese Patent Application No. 201580013837.2, 8 pages.
Chinese Patent Office, First Office Action dated Nov. 20, 2018, issued in connection with Chinese Application No. 201580047998.3, 21 pages.
Chinese Patent Office, First Office Action dated Sep. 25, 2017, issued in connection with Chinese Patent Application No. 201580013894.0, 9 pages.
Chinese Patent Office, First Office Action dated Nov. 5, 2018, issued in connection with Chinese Application No. 201680044080.8, 5 pages.
Chinese Patent Office, Office Action dated Nov. 14, 2019, issued in connection with Chinese Application No. 201680040086.8, 9 pages.
Chinese Patent Office, Second Office Action and Translation dated Aug. 26, 2019, issued in connection with Chinese Application No. 201580047998.3, 25 pages.
Chinese Patent Office, Second Office Action dated Jan. 11, 2019, issued in connection with Chinese Application No. 201680044080.8, 4 pages.
Chinese Patent Office, Second Office Action dated Feb. 3, 2019, issued in connection with Chinese Application No. 201580048594.6, 11 pages.
Chinese Patent Office, Second Office Action dated May 6, 2020, issued in connection with Chinese Application No. 201680040086.8, 3 pages.
Chinese Patent Office, Second Office Action with Translation dated Jan. 9, 2018, issued in connection with Chinese Patent Application No. 201580013837.2, 10 pages.
Chinese Patent Office, Third Office Action dated Apr. 11, 2019, issued in connection with Chinese Application No. 201580048594.6, 4 pages.
"Constellation Acoustic System: a revolutionary breakthrough in acoustical design," Meyer Sound Laboratories, Inc. 2012, 32 pages.
"Constellation Microphones," Meyer Sound Laboratories, Inc. 2013, 2 pages.
Co-pending U.S. Application No. 201916530324, inventor Wilberding; Dayn, filed on Aug. 2, 2019.
Corrected Notice of Allowability dated Jan. 19, 2017, issued in connection with U.S. Appl. No. 14/826,873, filed Aug. 14, 2015, 11 pages.
Daddy, B., "Calibrating Your Audio with a Sound Pressure Level (SPL) Meter," Blue-ray.com, Feb. 22, 2008 Retrieved Oct. 10, 2014, 15 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Notice of Allowance dated Aug. 30, 2017, issued in connection with U.S. Appl. No. 15/088,994, filed Apr. 1, 2016, 10 pages.
Notice of Allowance dated Dec. 30, 2016, issued in connection with U.S. Appl. No. 14/696,014, filed Apr. 24, 2015, 13 pages.
Notice of Allowance dated Jan. 30, 2017, issued in connection with U.S. Appl. No. 15/339,260, filed Oct. 31, 2016, 8 pages.
Notice of Allowance dated Aug. 31, 2018, issued in connection with U.S. Appl. No. 15/872,979, filed Jan. 16, 2018, 7 pages.
Notice of Allowance dated Aug. 31, 2018, issued in connection with U.S. Appl. No. 16/055,884, filed Aug. 6, 2018, 8 pages.
Notice of Allowance dated Aug. 31, 2021, issued in connection with U.S. Appl. No. 16/944,884, filed Jul. 31, 2020, 8 pages.
Notice of Allowance dated Mar. 31, 2020, issued in connection with U.S. Appl. No. 16/538,629, filed Aug. 12, 2019, 9 pages.
Notice of Allowance dated Apr. 4, 2017, issued in connection with U.S. Appl. No. 14/682,182, filed Apr. 9, 2015, 8 pages.
Notice of Allowance dated Feb. 4, 2019, issued in connection with U.S. Appl. No. 15/166,241, filed Aug. 26, 2016, 8 pages.
Notice of Allowance dated Feb. 4, 2019, issued in connection with U.S. Appl. No. 16/181,583, filed Nov. 6, 2018, 9 pages.
Notice of Allowance dated Feb. 4, 2020, issued in connection with U.S. Appl. No. 16/416,619, filed May 20, 2019, 7 pages.
Notice of Allowance dated Oct. 4, 2018, issued in connection with U.S. Appl. No. 15/166,241, filed May 26, 2016, 7 pages.
Notice of Allowance dated Apr. 5, 2018, issued in connection with U.S. Appl. No. 15/681,640, filed Aug. 21, 2017, 8 pages.
Notice of Allowance dated Feb. 5, 2021, issued in connection with U.S. Appl. No. 16/827,143, filed Mar. 23, 2020, 9 pages.
Notice of Allowance dated Jun. 5, 2019, issued in connection with U.S. Appl. No. 15/859,311, filed Dec. 29, 2017, 8 pages.
Notice of Allowance dated Jun. 5, 2019, issued in connection with U.S. Appl. No. 15/865,221, filed Jan. 3, 2018, 8 pages.
Notice of Allowance dated Mar. 5, 2019, issued in connection with U.S. Appl. No. 16/102,499, filed Aug. 13, 2018, 8 pages.

(56) References Cited

OTHER PUBLICATIONS

Notice of Allowance dated May 5, 2017, issued in connection with U.S. Appl. No. 14/826,873, filed Aug. 14, 2015, 5 pages.
Notice of Allowance dated Oct. 5, 2018, issued in connection with U.S. Appl. No. 16/115,524, filed Aug. 28, 2018,10 pages.
Notice of Allowance dated Aug. 6, 2020, issued in connection with U.S. Appl. No. 16/564,684, filed Sep. 9, 2019, 8 pages.
Notice of Allowance dated Feb. 6, 2019, issued in connection with U.S. Appl. No. 15/996,878, filed Jun. 4, 2018, 8 pages.
Notice of Allowance dated Apr. 8, 2019, issued in connection with U.S. Appl. No. 16/011,402, filed Jun. 18, 2018, 8 pages.
Notice of Allowance dated Jul. 8, 2019, issued in connection with U.S. Appl. No. 15/856,791, filed Dec. 28, 2017, 5 pages.
Notice of Allowance dated Jun. 8, 2020, issued in connection with U.S. Appl. No. 16/658,896, filed Oct. 21, 2019, 8 pages.
Notice of Allowance dated Jun. 8, 2021, issued in connection with U.S. Appl. No. 17/104,466, filed Nov. 25, 2020, 8 pages.
Notice of Allowance dated May 8, 2018, issued in connection with U.S. Appl. No. 15/650,386, filed Jul. 14, 2017, 13 pages.
Notice of Allowance dated Apr. 9, 2020, issued in connection with U.S. Appl. No. 16/416,593, filed May 20, 2019, 9 pages.
Notice of Allowance dated Jun. 9, 2020, issued in connection with U.S. Appl. No. 15/966,534, filed Apr. 30, 2018, 16 pages.
Notice of Allowance dated May 9, 2019, issued in connection with U.S. Appl. No. 15/996,878, filed Jun. 4, 2018, 7 pages.
Notice of Allowance dated Apr. 19, 2017, issued in connection with U.S. Appl. No. 14/481,511, filed Sep. 9, 2014, 10 pages.
Palm, Inc., "Handbook for the Palm VII Handheld," May 2000, 311 pages.
Papp Istvan et al. "Adaptive Microphone Array for Unknown Desired Speaker's Transfer Function", The Journal of the Acoustical Society of America, American Institute of Physics for the Acoustical Society of America, New York, NY vol. 122, No. 2, Jul. 19, 2007, pp. 44-49.
Pre-Brief Appeal Conference Decision mailed on Mar. 19, 2019, issued in connection with U.S. Appl. No. 15/806,126, filed Nov. 7, 2017, 2 pages.
Preinterview First Office Action dated Oct. 6, 2016, issued in connection with U.S. Appl. No. 14/726,921, filed Jun. 1, 2015, 6 pages.
Preinterview First Office Action dated Jul. 12, 2017, issued in connection with U.S. Appl. No. 14/793,205, filed Jul. 7, 2015, 5 pages.
Preinterview First Office Action dated May 17, 2016, issued in connection with U.S. Appl. No. 14/481,505, filed Sep. 9, 2014, 7 pages.
Preinterview First Office Action dated May 25, 2016, issued in connection with U.S. Appl. No. 14/481,514, filed Sep. 9, 2014, 7 pages.
Presentations at WinHEC 2000, May 2000, 138 pages.
PRISMIQ, Inc., "PRISMIQ Media Player User Guide," 2003, 44 pages.
Ross, Alex, "Wizards of Sound: Retouching acoustics, from the restaurant to the concert hall," The New Yorker, Feb. 23, 2015. Web. Feb. 26, 2015, 9 pages.
*Sonos, Inc.* v. *Google LLC,* WDTX Case No. 6:20-cv-00881, Google's Answer and Counterclaims; dated Jan. 8, 2021, 39 pages.
Supplemental Notice of Allowability dated Oct. 27, 2016, issued in connection with U.S. Appl. No. 14/481,511, filed Sep. 9, 2014, 6 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Wikipedia, Server(Computing) https://web.archive.org/web/20160703173710/https://en.wikipedia.org/wiki/Server_(computing), published Jul. 3, 2016, 7 pages.
Yamaha DME 64 Owner's Manual; copyright 2004, 80 pages.
Yamaha DME Designer 3.0 Owner's Manual; Copyright 2008, 501 pages.
Yamaha DME Designer 3.5 setup manual guide; copyright 2004, 16 pages.
Yamaha DME Designer 3.5 User Manual; Copyright 2004, 507 pages.
Non-Final Office Action dated Jul. 3, 2018, issued in connection with U.S. Appl. No. 15/909,327, filed Mar. 1, 2018, 30 pages.
Non-Final Office Action dated Jan. 4, 2017, issued in connection with U.S. Appl. No. 15/207,682, filed Jul. 12, 2016, 6 pages.
Non-Final Office Action dated Nov. 4, 2016, issued in connection with U.S. Appl. No. 14/826,856, filed Aug. 14, 2015, 10 pages.
Non-Final Office Action dated Sep. 4, 2019, issued in connection with U.S. Appl. No. 16/213,552, filed Dec. 7, 2018, 16 pages.
Non-Final Office Action dated Jul. 5, 2017, issued in connection with U.S. Appl. No. 14/481,522, filed Sep. 9, 2014, 8 pages.
Non-Final Office Action dated Jul. 6, 2016, issued in connection with U.S. Appl. No. 15/070,160, filed Mar. 15, 2016, 6 pages.
Non-Final Office Action dated Oct. 6, 2016, issued in connection with U.S. Appl. No. 14/678,263, filed Apr. 3, 2015, 30 pages.
Non-Final Office Action dated Jun. 6, 2018, issued in connection with U.S. Appl. No. 15/005,496, filed Jan. 25, 2016, 16 pages.
Non-Final Office Action dated Dec. 7, 2015, issued in connection with U.S. Appl. No. 14/921,762, filed Oct. 23, 2015, 5 pages.
Non-Final Office Action dated Jul. 7, 2016, issued in connection with U.S. Appl. No. 15/066,049, filed Mar. 10, 2016, 6 pages.
Non-Final Office Action dated Mar. 7, 2017, issued in connection with U.S. Appl. No. 14/481,514, filed Sep. 9, 2014, 24 pages.
Non-Final Office Action dated Sep. 7, 2016, issued in connection with U.S. Appl. No. 14/826,873, filed Aug. 14, 2015, 12 pages.
Non-Final Office Action dated Jul. 8, 2016, issued in connection with U.S. Appl. No. 15/066,072, filed Mar. 10, 2016, 6 pages.
Non-Final Office Action dated Dec. 9, 2016, issued in connection with U.S. Appl. No. 14/678,248, filed Apr. 3, 2015, 22 pages.
Non-Final Office Action dated Apr. 10, 2018, issued in connection with U.S. Appl. No. 15/909,529, filed Mar. 1, 2018, 8 pages.
Non-Final Office Action dated Mar. 10, 2017, issued in connection with U.S. Appl. No. 14/997,868, filed Jan. 18, 2016, 10 pages.
Non-Final Office Action dated Sep. 10, 2018, issued in connection with U.S. Appl. No. 15/056,553, filed Feb. 29, 2016, 8 pages.
Non-Final Office Action dated Apr. 11, 2017, issued in connection with U.S. Appl. No. 15/088,994, filed Apr. 1, 2016, 13 pages.
Non-Final Office Action dated Apr. 11, 2017, issued in connection with U.S. Appl. No. 15/089,004, filed Apr. 1, 2016, 9 pages.
Non-Final Office Action dated Dec. 11, 2019, issued in connection with U.S. Appl. No. 16/556,297, filed Aug. 30, 2019, 9 pages.
Non-Final Office Action dated Dec. 11, 2019, issued in connection with U.S. Appl. No. 16/658,896, filed Oct. 21, 2019, 14 pages.
Non-Final Office Action dated Feb. 11, 2021, issued in connection with U.S. Appl. No. 17/104,466, filed Nov. 25, 2020, 39 pages.
Non-Final Office Action dated Oct. 11, 2017, issued in connection with U.S. Appl. No. 15/480,265, filed Apr. 5, 2017, 8 pages.
Non-Final Office Action dated Oct. 11, 2018, issued in connection with U.S. Appl. No. 15/856,791, filed Dec. 28, 2017, 13 pages.
Non-Final Office Action dated Mar. 12, 2020, issued in connection with U.S. Appl. No. 16/796,496, filed Feb. 20, 2020, 13 pages.
Non-Final Office Action dated Sep. 12, 2016, issued in connection with U.S. Appl. No. 14/811,587, filed Jul. 28, 2015, 24 pages.
Non-Final Office Action dated Aug. 13, 2021, issued in connection with U.S. Appl. No. 16/994,874, filed Aug. 17, 2020, 10 pages.
Non-Final Office Action dated Jul. 13, 2016, issued in connection with U.S. Appl. No. 14/940,779, filed Nov. 13, 2015, 16 pages.
Non-Final Office Action dated Mar. 13, 2020, issued in connection with U.S. Appl. No. 15/005,496, filed Jan. 25, 2016, 20 pages.
Non-Final Office Action dated Dec. 14, 2016, issued in connection with U.S. Appl. No. 14/481,505, filed Sep. 9, 2014, 19 pages.
Non-Final Office Action dated Mar. 14, 2017, issued in connection with U.S. Appl. No. 15/096,827, filed Apr. 12, 2016, 12 pages.

(56) References Cited

OTHER PUBLICATIONS

Non-Final Office Action dated May 14, 2019, issued in connection with U.S. Appl. No. 15/955,545, filed Apr. 17, 2018, 15 pages.
Non-Final Office Action dated Oct. 14, 2015, issued in connection with U.S. Appl. No. 14/216,325, filed Mar. 17, 2014, 7 pages.
Non-Final Office Action dated May 15, 2018, issued in connection with U.S. Appl. No. 15/806,126, filed Nov. 7, 2017, 17 pages.
Non-Final Office Action dated Nov. 15, 2021, issued in connection with U.S. Appl. No. 17/135,308, filed Dec. 28, 2020, 19 pages.
Non-Final Office Action dated Jun. 16, 2017, issued in connection with U.S. Appl. No. 15/005,496, filed Jan. 25, 2016, 15 pages.
Non-Final Office Action dated Nov. 16, 2018, issued in connection with U.S. Appl. No. 15/996,878, filed Jun. 4, 2018, 8 pages.
Non-Final Office Action dated Sep. 16, 2020, issued in connection with U.S. Appl. No. 16/115,525, filed Aug. 28, 2018, 11 pages.
Non-Final Office Action dated Aug. 18, 2020, issued in connection with U.S. Appl. No. 16/827,143, filed Mar. 23, 2020, 8 pages.
Non-Final Office Action dated Dec. 18, 2018, issued in connection with U.S. Appl. No. 16/011,402, filed Jun. 18, 2018, 10 pages.
Non-Final Office Action dated Feb. 18, 2016, issued in connection with U.S. Appl. No. 14/644,136, filed Mar. 10, 2015, 10 pages.
Non-Final Office Action dated Jun. 18, 2019, issued in connection with U.S. Appl. No. 15/005,496, filed Jan. 25, 2016, 15 pages.
Non-Final Office Action dated Aug. 19, 2021, issued in connection with U.S. Appl. No. 17/357,302, filed Jun. 24, 2021, 16 pages.
Non-Final Office Action dated Feb. 19, 2020, issued in connection with U.S. Appl. No. 16/665,415, filed Oct. 28, 2019, 53 pages.
Non-Final Office Action dated Jun. 19, 2020, issued in connection with U.S. Appl. No. 16/403,077, filed May 3, 2019, 6 pages.
Non-Final Office Action dated Sep. 19, 2017, issued in connection with U.S. Appl. No. 15/056,553, filed Feb. 29, 2016, 7 pages.
Non-Final Office Action dated Apr. 2, 2018, issued in connection with U.S. Appl. No. 15/872,979, filed Jan. 16, 2018, 6 pages.
Non-Final Office Action dated Aug. 2, 2017, issued in connection with U.S. Appl. No. 15/298,115, filed Oct. 19, 2016, 22 pages.
Non-Final Office Action dated Apr. 20, 2017, issued in connection with U.S. Appl. No. 15/005,853, filed Jan. 25, 2016, 8 pages.
Non-Final Office Action dated Jul. 20, 2016, issued in connection with U.S. Appl. No. 14/682,182, filed Apr. 9, 2015, 13 pages.
International Searching Authority, International Search Report and Written Opinion dated Nov. 18, 2015, issued in connection with International Application No. PCT/US2015/048954, filed on Sep. 8, 2015, 11 pages.
International Searching Authority, International Search Report and Written Opinion dated Oct. 18, 2016, issued in connection with International Application No. PCT/US2016/043116, filed on Jul. 20, 2016, 14 pages.
International Searching Authority, International Search Report and Written Opinion dated Oct. 18, 2016, issued in connection with International Application No. PCT/US2016/043840, filed on Jul. 25, 2016, 14 pages.
International Searching Authority, International Search Report and Written Opinion dated Nov. 23, 2015, issued in connection with International Application No. PCT/US2015/048942, filed on Sep. 8, 2015, 14 pages.
International Searching Authority, International Search Report and Written Opinion dated Nov. 23, 2015, issued in connection with International Application No. PCT/US2015/048944, filed on Sep. 8, 2015, 12 pages.
International Searching Authority, International Search Report and Written Opinion dated Nov. 23, 2016, issued in connection with International Patent Application No. PCT/US2016/052266, filed on Sep. 16, 2016, 11 pages.
International Searching Authority, International Search Report and Written Opinion dated Jan. 24, 2017, issued in connection with International Application No. PCT/US2016/052264, filed on Sep. 16, 2016, 17 pages.
International Searching Authority, International Search Report and Written Opinion dated Oct. 25, 2016, issued in connection with International Application No. PCT/US2016/043109, filed on Jul. 20, 2016, 12 pages.
International Searching Authority, International Search Report and Written Opinion dated Sep. 25, 2017, issued in connection with International Application No. PCT/US2017/042191, filed on Jul. 14, 2017, 16 pages.
International Searching Authority, International Search Report and Written Opinion dated Aug. 3, 2017, in connection with International Application No. PCT/U.S. Pat. No. 2017014596, 20 pages.
Japanese Patent Office, Office Action dated Dec. 7, 2021, issued in connection with Japanese Patent Application No. 2020-185230, 8 pages.
Japanese Patent Office, English Translation of Office Action dated May 8, 2018, issued in connection with Japanese Application No. 2017-513241, 4 pages.
Japanese Patent Office, Examination Report and Translation dated Dec. 7, 2021, issued in connection with Japanese Patent Application No. 2020-185230, 10 pages.
Japanese Patent Office, Japanese Office Action dated Oct. 3, 2017, issued in connection with Japanese Application No. 2017-501082, 7 pages.
Japanese Patent Office, Non-Final Office Action and Translation dated Dec. 10, 2019, issued in connection with Japanese Patent Application No. 2018-213477, 8 pages.
Japanese Patent Office, Non-Final Office Action with Translation dated Apr. 25, 2017, issued in connection with Japanese Patent Application No. 2016-568888, 7 pages.
Japanese Patent Office, Non-Final Office Action with Translation dated Oct. 3, 2017, issued in connection with Japanese Patent Application No. 2017-501082, 3 pages.
Japanese Patent Office, Notice of Reasons for Refusal and Translation dated Oct. 5, 2021, issued in connection with Japanese Patent Application No. 2020-134012, 10 pages.
Japanese Patent Office, Office Action and Translation dated Jun. 12, 2020, issued in connection with Japanese Patent Application No. 2019-056360, 6 pages.
Japanese Patent Office, Office Action and Translation dated Apr. 13, 2021, issued in connection with Japanese Patent Application No. 2020-048867, 4 pages.
Japanese Patent Office, Office Action and Translation dated Nov. 4, 2020, issued in connection with Japanese Patent Application No. 2019-141349, 6 pages.
Japanese Patent Office, Office Action dated Jun. 12, 2018, issued in connection with Japanese Application Mo. 2018-502729, 4 pages.
Japanese Patent Office, Office Action dated May 14, 2019, issued in connection with Japanese Patent Application No. 2018-500529, 8 pages.
Japanese Patent Office, Office Action dated Aug. 21, 2018, issued in connection with Japanese Application No. 2018-514418, 7 pages.
Japanese Patent Office, Office Action dated Jul. 24, 2018, issued in connection with Japanese Application No. 2018-514419, 5 pages.
Japanese Patent Office, Office Action dated Feb. 4, 2020, issued in connection with Japanese Patent Application No. 2018-500529, 6 pages.
Japanese Patent Office, Office Action dated Jun. 4, 2019, issued in connection with Japanese Patent Application No. 2018-112810, 4 pages.
Japanese Patent Office, Office Action dated May 8, 2018, issued in connection with Japanese Application No. 2017-513241, 8 pages.
Japanese Patent Office, Office Action with English Summary dated Jul. 18, 2017, issued in connection with Japanese Patent Application No. 2017-513171, 4 pages.
Japanese Patent Office, Translation of Office Action dated May 14, 2019, issued in connection with Japanese Patent Application No. 2018-500529, 5 pages.
Jo et al., "Synchronized One-to-many Media Streaming with Adaptive Playout Control," Proceedings of SPIE, 2002, pp. 71-82, vol. 4861.
John Mark and Paul Hufnagel "What is 1451.4, what are its uses and how does it work?" IEEE Standards Association, The IEEE 1451.4 Standard for Smart Transducers, 14pages.

(56) References Cited

OTHER PUBLICATIONS

Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
"auEQ for the iPhone," Mar. 25, 2015, retrieved from the internet: URL:https://web.archive.org/web20150325152629/http://www.hotto.de/mobileapps/iphoneaueq.html [retrieved on Jun. 24, 2016], 6 pages.
Lei et al. An Audio Frequency Acquision and Release System Based on TMS320VC5509, Instrumentation Technology, Editorial Department Email, Issue 02, 2007, 4 pages.
Louderback, Jim, "Affordable Audio Receiver Furnishes Homes With MP3," TechTV Vault. Jun. 28, 2000 retrieved Jul. 10, 2014, 2 pages.
Microsoft Corporation, "Using Microsoft Outlook 2003," Cambridge College, 2003.
Motorola, "Simplefi, Wireless Digital Audio Receiver, Installation and User Guide," Dec. 31, 2001, 111 pages.
Mulcahy, John, "Room EQ Wizard: Room Acoustics Software," REW, 2014, retrieved Oct. 10, 2014, 4 pages.
Non-Final Action dated Jan. 29, 2016, issued in connection with U.S. Appl. No. 14/481,511, filed Sep. 9, 2014, 10 pages.
Non-Final Office Action dated Sep. 16, 2021, issued in connection with U.S. Appl. No. 17/098,134, filed Nov. 13, 2020, 10 pages.
Non-Final Office Action dated Jul. 21, 2021, issued in connection with U.S. Appl. No. 16/570,679, filed Sep. 13, 2019, 18 pages.
Non-Final Office Action dated Sep. 7, 2021, issued in connection with U.S. Appl. No. 16/994,627, filed Aug. 16, 2020, 11 pages.
Non-Final Office Action dated Mar. 1, 2017, issued in connection with U.S. Appl. No. 15/344,069, filed Nov. 4, 2016, 20 pages.
Non-Final Office Action dated Nov. 1, 2017, issued in connection with U.S. Appl. No. 15/235,598, filed Aug. 12, 2016, 15 pages.
Non-Final Office Action dated Jun. 2, 2014, issued in connection with U.S. Appl. No. 13/340,126, filed Dec. 29, 2011, 14 pages.
Non-Final Office Action dated Jun. 2, 2017, issued in connection with U.S. Appl. No. 15/229,693, filed Aug. 5, 2016, 18 pages.
Non-Final Office Action dated Nov. 2, 2017, issued in connection with U.S. Appl. No. 15/166,241, filed May 26, 2016, 12 pages.
Non-Final Office Action dated Oct. 2, 2017, issued in connection with U.S. Appl. No. 15/005,853, filed Jan. 25, 2016, 8 pages.
Non-Final Office Action dated Feb. 3, 2016, issued in connection with U.S. Appl. No. 14/481,522, filed Sep. 9, 2014, 12 pages.
Final Office Action dated Sep. 17, 2021, issued in connection with U.S. Appl. No. 16/564,766, filed Sep. 9, 2019, 8 pages.
Final Office Action dated Apr. 18, 2017, issued in connection with U.S. Appl. No. 14/678,263, filed Apr. 2, 2015, 16 pages.
Final Office Action dated Apr. 18, 2018, issued in connection with U.S. Appl. No. 15/056,553, filed Feb. 29, 2016, 8 pages.
Final Office Action dated Dec. 18, 2014, issued in connection with U.S. Appl. No. 13/340,126, filed Dec. 29, 2011, 12 pages.
Final Office Action dated Jan. 19, 2017, issued in connection with U.S. Appl. No. 14/940,779, filed Nov. 13, 2015, 15 pages.
Final Office Action dated Apr. 2, 2018, issued in connection with U.S. Appl. No. 15/166,241, filed May 26, 2016, 14 pages.
Final Office Action dated Aug. 20, 2021, issued in connection with U.S. Appl. No. 16/919,467, filed Jul. 2, 2020, 22 pages.
Final Office Action dated Oct. 21, 2016, issued in connection with U.S. Appl. No. 14/696,014, filed Apr. 24, 2015, 13 pages.
Final Office Action dated Sep. 22, 2020, issued in connection with U.S. Appl. No. 15/005,496, filed Jan. 25, 2016, 17 pages.
Final Office Action dated Jan. 25, 2018, issued in connection with U.S. Appl. No. 15/005,496, filed Jan. 25, 2016, 17 pages.
Final Office Action dated Mar. 25, 2019, issued in connection with U.S. Appl. No. 15/856,791, filed Dec. 28, 2017, 11 pages.
Final Office Action dated Oct. 28, 2019, issued in connection with U.S. Appl. No. 16/181,865, filed Nov. 6, 2018, 17 pages.
Final Office Action dated Apr. 3, 2018, issued in connection with U.S. Appl. No. 15/235,598, filed Aug. 12, 2016, 12 pages.
Final Office Action dated Mar. 3, 2020, issued in connection with U.S. Appl. No. 16/115,525, filed Aug. 28, 2018, 13 pages.
Final Office Action dated Feb. 5, 2018, issued in connection with U.S. Appl. No. 15/229,693, filed Aug. 5, 2016, 21 pages.
Final Office Action dated Mar. 5, 2019, issued in connection with U.S. Appl. No. 15/056,553, filed Feb. 29, 2016, 9 pages.
Final Office Action dated Dec. 6, 2018, issued in connection with U.S. Appl. No. 15/806,126, filed Nov. 7, 2017, 18 pages.
Final Office Action dated Apr. 9, 2019, issued in connection with U.S. Appl. No. 15/229,693, filed Aug. 5, 2016, 33 pages.
First Action Interview Office Action dated Mar. 3, 2017, issued in connection with U.S. Appl. No. 14/726,921, filed Jun. 1, 2015, 9 pages.
First Action Interview Office Action dated Jul. 12, 2016, issued in connection with U.S. Appl. No. 14/481,514, filed Sep. 9, 2014, 10 pages.
First Action Interview Office Action dated Jun. 30, 2016, issued in connection with U.S. Appl. No. 14/481,505, filed Sep. 9, 2014, 9 pages.
First Action Interview Pilot Program Pre-Interview Communication dated Apr. 5, 2017, issued in connection with U.S. Appl. No. 14/793,190, filed Jul. 7, 2015, 4 pages.
First Action Interview Pilot Program Pre-Interview Communication dated Oct. 7, 2015, issued in connection with U.S. Appl. No. 14/216,306, filed Mar. 17, 2014, 5 pages.
First Action Interview Pilot Program Pre-Interview Communication dated Feb. 16, 2016, issued in connection with U.S. Appl. No. 14/681,465, filed Apr. 8, 2015, 5 pages.
30Nzalez et al., "Simultaneous Measurement of Multichannel Acoustic Systems," J. Audio Eng. Soc., 2004, pp. 26-42, vol. 52, No. 1/2.
*Google LLC v. Sonos, Inc.*, Declaration of Jeffery S. Vipperman, PHD. In Support of Petition for Inter Partes Review of U.S. Pat. No. 9,219,460, IPR2021-00475, Feb. 2, 2021, 92 pages.
*Google LLC v. Sonos, Inc.*, Petition for IPR of U.S. Pat. No. 9,219,460, IPR2021-00475, Feb. 5, 2021, 88 pages.
International Bureau, International Preliminary Report on Patentability and Written Opinion, dated Jan. 15, 2019, issued in connection with International Application No. PCT/US2017/042191, filed on Jul. 14, 2017, 10 pages.
International Bureau, International Preliminary Report on Patentability and Written Opinion, dated Mar. 20, 2018, issued in connection with International Application No. PCT/US2016/052264, filed on Sep. 16, 2016, 10 pages.
International Bureau, International Preliminary Report on Patentability and Written Opinion, dated Mar. 20, 2018, issued in connection with International Application No. PCT/US2016/052266, filed on Sep. 16, 2016, 7 pages.
International Bureau, International Preliminary Report on Patentability and Written Opinion, dated Jan. 23, 2018, issued in connection with International Application No. PCT/US2016/043109, filed on Jul. 20, 2016, 7 pages.
International Bureau, International Preliminary Report on Patentability and Written Opinion, dated Jan. 23, 2018, issued in connection with International Application No. PCT/US2016/043116, filed on Jul. 20, 2016, 8 pages.
International Bureau, International Preliminary Report on Patentability and Written Opinion, dated Oct. 24, 2017, issued in connection with International Application No. PCT/US2016/028997, filed on Apr. 22, 2016, 7 pages.
International Bureau, International Preliminary Report on Patentability and Written Opinion, dated Jan. 9, 2018, issued in connection with International Application No. PCT/US2016/041179, filed on Jul. 6, 2016, 6 pages.
International Bureau, International Preliminary Report on Patentability, dated Mar. 2, 2021, issued in connection with International Application No. PCT/US2019/048366, filed on Aug. 27, 2019, 7 pages.
International Bureau, International Preliminary Report on Patentability, dated Mar. 2, 2021, issued in connection with International Application No. PCT/US2019/048569, filed on Aug. 28, 2019, 11 pages.

(56) References Cited

OTHER PUBLICATIONS

International Bureau, International Preliminary Report on Patentability, dated Sep. 24, 2015, issued in connection with International Application No. PCT/US2014/030560, filed on Mar. 17, 2014, 7 pages.
International Bureau, International Preliminary Report on Patentability dated Sep. 29, 2016, issued in connection with International Application No. PCT/US2015/020993, filed on Mar. 17, 2015, 8 pages.
International Bureau, International Preliminary Report on Patentability dated Sep. 29, 2016, issued in connection with International Application No. PCT/US2015/021000, filed on Mar. 17, 2015, 9 pages.
International Bureau, International Preliminary Report on Patentability, dated Aug. 9, 2018, issued in connection with International Application No. PCT/US2017/014596, filed on Jan. 23, 2017, 11 pages.
International Bureau, International Search Report and Written Opinion dated Dec. 15, 2020, issued in connection with International Application No. PCT/US2020/045746, filed on Aug. 11, 2020, 23 pages.
International Bureau, International Search Report and Written Opinion dated Nov. 25, 2019, issued in connection with International Application No. PCT/US2019/048569, filed on Aug. 28, 2019, 13 pages.
International Bureau, International Search Report and Written Opinion dated Nov. 7, 2019, issued in connection with International Application No. PCT/US2019/048366, filed on Aug. 27, 2019, 9 pages.
International Searching Authority, International Preliminary Reporton Patentability dated Mar. 23, 2017, issued in connection with International Patent Application No. PCT/US2015/048944, filed on Sep. 8, 2015, 8 pages.
International Searching Authority, International Preliminary Reporton Patentability dated Oct. 24, 2017, issued in connection with International Application No. PCT/US2016/028994 filed on Apr. 22, 2016, 7 pages.
International Searching Authority, International Search Report and Written Opinion dated Jul. 4, 2016, issued in connection with International Application No. PCT/US2016/028994, filed on Apr. 22, 2016, 12 pages.
International Searching Authority, International Search Report and Written Opinion dated Jul. 5, 2016, issued in connection with International Application No. PCT/US2016/028997, filed on Apr. 22, 2016, 13 pages.
International Searching Authority, International Search Report and Written Opinion dated Jun. 5, 2015, issued in connection with International Application No. PCT/US2015/021000, filed on Mar. 17, 2015, 12 pages.
International Searching Authority, International Search Report and Written Opinion dated Oct. 12, 2016, issued in connection with International Application No. PCT/US2016/041179 filed on Jul. 6, 2016, 9 pages.
International Searching Authority, International Search Report and Written Opinion dated Jun. 16, 2015, issued in connection with International Application No. PCT/US2015/020993, filed on Mar. 17, 2015, 11 pages.
Final Office Action dated Jul. 1, 2022, issued in connection with U.S. Appl. No. 17/033,818, filed Sep. 27, 2020, 13 pages.
Final Office Action dated Aug. 30, 2022, issued in connection with U.S. Appl. No. 17/107,157, filed Nov. 30, 2020, 32 pages.
*Google LLC v Sonos, Inc.*, Patent Owner Sur-Reply to Petitioner's Reply for Inter Partes Review of U.S. Pat. No. 9,219,460, IPR2021-00475, Oct. 12, 2022, 32 pages.
*Google LLC v Sonos, Inc.*, Petitioner's Reply for Inter Partes Review of U.S. Pat. No. 9,219,460, IPR2021-00475, Sep. 6, 2022, 30 pages.
*Google LLC v. Sonos, Inc.*, Record of Oral Hearing for IPR of U.S. Pat. No. 9,219,460, IPR2021-00475, Dec. 14, 2022, 60 pages.
Non-Final Office Action dated Sep. 29, 2022, issued in connection with U.S. Appl. No. 17/340,353, filed Jun. 7, 2021, 8 pages.
Non-Final Office Action dated Sep. 30, 2022, issued in connection with U.S. Appl. No. 17/113,799, filed Dec. 7, 2020, 79 pages.
Notice of Allowance dated Oct. 6, 2022, issued in connection with U.S. Appl. No. 17/582,317, filed Jan. 24, 2022, 9 pages.
Notice of Allowance dated Jul. 13, 2022, issued in connection with U.S. Appl. No. 17/033,821, filed Sep. 27, 2020, 8 pages.
Notice of Allowance dated Sep. 15, 2022, issued in connection with U.S. Appl. No. 17/033,818, filed Sep. 27, 2020, 7 pages.
Notice of Allowance dated Aug. 17, 2022, issued in connection with U.S. Appl. No. 17/316,371, filed May 10, 2021, 9 pages.
Notice of Allowance dated Aug. 18, 2022, issued in connection with U.S. Appl. No. 17/660,185, filed Apr. 21, 2022, 11 pages.
Notice of Allowance dated Sep. 23, 2022, issued in connection with U.S. Appl. No. 17/373,179, filed Jul. 12, 2021, 5 pages.

* cited by examiner

FACILITATING CALIBRATION OF AN AUDIO PLAYBACK DEVICE

CROSS-REFERENCE TO RELATED APPLICATIONS

This application claims priority under 35 U.S.C. § 120 to, and is a continuation of, U.S. non-provisional patent application Ser. No. 16/812,618, filed on Mar. 9, 2020, entitled "Facilitating Calibration of an Audio Playback Device," which is incorporated herein by reference in its entirety.

U.S. non-provisional patent application Ser. No. 16/812,618 claims priority under 35 U.S.C. § 120 to, and is a continuation of, U.S. non-provisional patent application Ser. No. 16/182,886, filed on Nov. 7, 2018, entitled "Facilitating Calibration of an Audio Playback Device," and issued as U.S. Pat. No. 10,585,639 on Mar. 10, 2020, which is incorporated herein by reference in its entirety.

U.S. non-provisional patent application Ser. No. 16/182,886 claims priority under 35 U.S.C. § 120 to, and is a continuation of, U.S. non-provisional patent application Ser. No. 14/864,393, filed on Sep. 24, 2015, entitled "Facilitating Calibration of an Audio Playback Device," and issued as U.S. Pat. No. 10,127,006 on Nov. 13, 2018, which is incorporated herein by reference in its entirety.

U.S. non-provisional patent application Ser. No. 14/864,393 claims priority under 35 U.S.C. § 119 to U.S. Provisional Patent Application No. 62/220,225, filed on Sep. 17, 2015, the entire contents of which are hereby incorporated by reference in their entirety.

This application hereby incorporates by reference the entire contents of U.S. patent application Ser. No. 14/481,511, filed on Sep. 9, 2014. This application also hereby incorporates by reference the entire contents of U.S. patent application Ser. No. 14/696,014, filed on Apr. 24, 2015. This application also hereby incorporates by reference the entire contents of U.S. patent application Ser. No. 14/805,140, filed on Jul. 21, 2015. This application also hereby incorporates by reference the entire contents of U.S. patent application Ser. No. 14/805,340, filed on Jul. 21, 2015. This application also hereby incorporates by reference the entire contents of U.S. patent application Ser. No. 14/826,873, filed on Aug. 14, 2015.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
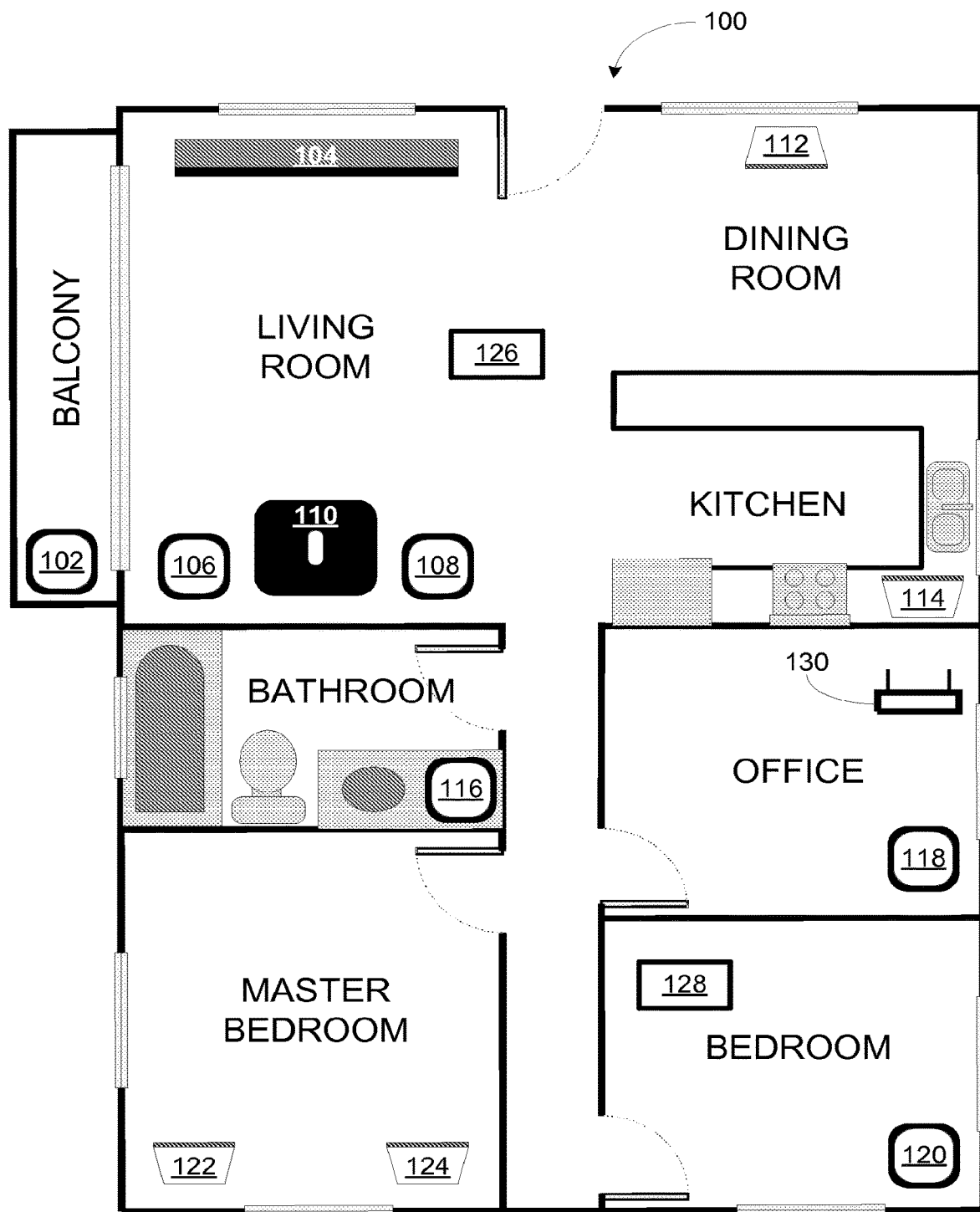
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Example procedures for calibrating a playback device may include the playback device playing one or more calibration sounds that are captured and/or analyzed by a computing device (e.g., a control device configured to control the playback device). In some embodiments, the computing device may analyze the captured calibration sounds over a calibration frequency range of the playback device. Accordingly, the one or more calibration sounds that are played by the playback device may include frequencies that span the calibration frequency range. The calibration frequency range may include a range of frequencies that the playback device is capable of emitting (e.g., 15-30,000 Hz) and may include frequencies that are considered to be within the range of human hearing (e.g., 20-20,000 Hz). By playing and subsequently capturing calibration sounds spanning the calibration frequency range, a frequency response that is inclusive of the calibration frequency range may be determined for the playback device. Such a frequency response may be representative of the environment in which the playback device played the calibration sounds.

An example of such an environment may include a room with walls, ceilings, and/or furniture, and so forth. Such objects within the environment may affect a listener's perception of playback by the playback device in various ways based on where the listener is positioned within the environment and/or where the playback device is positioned within the environment. Accordingly, for calibration, the playback device may be positioned within the environment where the playback device will later perform playback of audio content that is not necessarily related to calibration. In that position, the environment may affect the calibration sounds played by the playback device similarly to how playback might be affected by the environment during normal playback.

Some example calibration procedures may involve the computing device capturing, at multiple physical locations, calibration sounds played by the playback device, which may assist in determining acoustic characteristics of the environment. To facilitate capturing the calibration sounds at multiple points within the environment, some calibration procedures involve a moving microphone. For example, the microphone (e.g., of the computing device) that captures the calibration sounds may be continuously moved through the environment while the calibration sounds are played. Such continuous movement may facilitate capturing the calibration sounds at multiple physical locations within the environment, which may provide a better understanding of how the environment affects audio playback by the playback device.

In some embodiments, the playback device may repeatedly play calibration sounds such that each calibration sound spans the calibration frequency range during each repetition. Each calibration sound may be captured by the microphone of the computing device at a different physical location within the environment, thereby providing an audio sample for each location. Playing and capturing such calibration sounds may therefore facilitate determining a space-averaged frequency response of the playback device operating within the environment.

Example calibration sounds may span the calibration frequency range using various waveforms. Some example calibration sounds may include calibration noise (e.g., pseudorandom periodic noise) that spans at least a portion of the calibration frequency range. However, phase distortion caused by the microphone's movement may complicate association of captured sounds with emitted calibration noise. Other example calibration sounds may include a swept sound (e.g., a swept-sine or chirp) that ascends or descends in frequency through at least a portion of the calibration frequency range. Such a swept sound may facilitate association of a captured sound with an emitted swept sound, as the phase shift may take the form of predictable Doppler shift. However, at lower frequencies, a swept sound played at a volume necessary to overcome background noise typically present in a given environment may overload a speaker driver of the playback device.

As such, some example calibration sounds described herein may include a calibration sound that includes both a first component and a second component, which may help alleviate some of these issues. For instance, the calibration sound may include a first component that includes calibration noise between a minimum of the calibration frequency range (e.g., 15-20 Hz) and a first threshold frequency (e.g., 50-100 Hz). The first component may be emitted by the playback device with energy sufficient to overcome typical background noise (e.g., that of a quiet room) with a lower risk of overloading the speaker driver(s) of the playback device when compared to emitting a swept sound. The calibration sound may also include a second component that sweeps through (e.g., ascends or descends through) frequencies between a second threshold frequency (e.g., a frequency within the range of 50-100 Hz) and a maximum frequency of the calibration frequency range (e.g., 20-30,000 kHz). Use of a predictable sound, such as the swept sound of the second component, facilitates the computing device accounting for phase distortion resulting from the microphone motion.

Since portions of the calibration frequency range may be audible to humans, some aspects of the calibration sound may be designed to make the calibration sound more pleasant to a human listener. For instance, some calibration sounds may include a transition frequency range in which the first (noise) component and the second (swept) component overlap. The first component overlapping the second component in frequency may avoid potentially unpleasant sounds that are associated with a harsh frequency transition between the first component and the second component. In another example, the second portion of the calibration sound may descend (rather than ascend) through at least a portion of the calibration frequency range. While either an ascending or descending second component may be effective for calibration, a sound with descending frequency may be more pleasant to hear because of the particular shape of the human ear canal.

In some circumstances, multiple playback devices may be calibrated during a calibration procedure. For instance, an example calibration procedure may involve calibrating a grouping of playback devices. Such a grouping might be a zone of a media playback system that includes multiple playback devices, or, a grouping might be formed from multiple zones of a media playback system that are grouped into a zone group that includes a respective playback device from each zone. Such groupings might be physically located within the same environment (e.g., a room of a house or other building).

In some embodiments, multiple playback devices may play calibration sounds concurrently. However, when multiple playback devices play the same calibration sound concurrently, the concurrent calibration sounds may interfere with one another, which may prevent the microphone of the computing device from capturing audio of quality sufficient for calibration of the multiple playback devices. Further, the computing device might not be able to associate a particular calibration sound with the playback device that played the particular calibration sound because common frequencies of the various calibration sounds are generally indistinguishable.

Within example implementations, the calibration sounds may be tailored in an attempt to avoid such interference. For instance, first (noise) components of the calibration sounds played by respective playback devices may be lengthened in duration. Second (swept) components of the calibration sounds played by the respective playback devices may be mutually staggered so that common frequencies of the swept components are not played simultaneously by multiple playback devices. Such lengthening of the respective first components and staggering of the respective second components may provide sufficient time in each cycle for each of the playback devices to play a respective calibration sound that is detectable by the computing device. In such examples, the first (noise) components of the calibration sounds might be omitted because calibration noise played by the respective playback devices will generally be indistinguishable. Accordingly, calibration of the multiple playback devices may be limited to a frequency range bounded by the second threshold frequency and the maximum of the calibration frequency range (e.g., the range of frequencies included within the respective second swept components.)

Accordingly, some examples described herein include, among other things, detecting and analyzing calibration sounds that are played by a playback device to determine a frequency response of the playback device that is influenced by its surrounding environment, and determining an audio processing algorithm tuned to adjust the frequency response of the playback device to a target frequency response. Other aspects of the examples will be made apparent in the remainder of the description herein.

In one example, a non-transitory computer-readable medium stores instructions that, when executed by a computing device, cause the computing device to perform functions. The functions include, as the computing device is moving within an environment of a playback device, capturing, via a microphone of the computing device, one or more calibration sounds played by the playback device. Each of the one or more calibration sounds includes a sweep through frequencies of a calibration frequency range. The functions further include generating data representing the one or more calibration sounds and identifying one or more sections of the data such that each of the one or more sections of the data corresponds to a respective calibration sound of the one or more calibration sounds. The functions further include using the one or more sections of the data to determine a frequency response of the playback device over the calibration frequency range. The frequency response of the playback device characterizes audio playback by the playback device as influenced by acoustic characteristics of the environment of the playback device. The functions further include determining one or more parameters of an audio processing algorithm based on the frequency response of the playback device and a target frequency response, and sending, to the playback device, the one or more parameters of the audio processing algorithm.

In another example, a method performed by a computing device includes, as the computing device is moving within an environment of a playback device, capturing, via a microphone of the computing device, one or more calibration sounds played by the playback device. Each of the one or more calibration sounds includes a sweep through frequencies of a calibration frequency range. The method further includes generating data representing the one or more calibration sounds and identifying one or more sections of the data such that each of the one or more sections of the data corresponds to a respective calibration sound of the one or more calibration sounds. The method further includes using the one or more sections of the data to determine a frequency response of the playback device over the calibration frequency range. The frequency response of the playback device characterizes audio playback by the playback device as influenced by acoustic characteristics of the environment of the playback device. The method further includes determining one or more parameters of an audio processing algorithm based on the frequency response of the playback device and a target frequency response and sending, to the playback device, the one or more parameters of the audio processing algorithm.

In another example, a computing device includes one or more processors and a non-transitory computer-readable medium storing instructions that, when executed by the one or more processors, cause the computing device to perform functions. The functions include, as the computing device is moving within an environment of a playback device, capturing, via a microphone of the computing device, one or more calibration sounds played by the playback device. Each of the one or more calibration sounds includes a sweep through frequencies of a calibration frequency range. The functions further include generating data representing the one or more calibration sounds and identifying one or more sections of the data such that each of the one or more sections of the data corresponds to a respective calibration sound of the one or more calibration sounds. The functions further include using the one or more sections of the data to determine a frequency response of the playback device over the calibration frequency range. The frequency response of the playback device characterizes audio playback by the playback device as influenced by acoustic characteristics of the environment of the playback device. The functions further include determining one or more parameters of an audio processing algorithm based on the frequency response of the playback device and a target frequency response, and sending, to the playback device, the one or more parameters of the audio processing algorithm.

In one example, a non-transitory computer-readable medium stores instructions that, when executed by a computing device, cause the computing device to perform functions. The functions include capturing, via a microphone of the computing device, one or more calibration sounds played by a playback device and generating data representing the one or more calibration sounds. The functions further include identifying one or more sections of the data such that each of the one or more sections of the data corresponds to a respective calibration sound of the one or more calibration sounds. The functions further include determining that more than a threshold amount of sections of the one or more sections of the data correspond to respective signal-to-noise ratios (SNRs) that are less than a threshold signal-to-noise ratio and providing an indication, via a user interface of the computing device, that the playback device was not properly calibrated.

In another example, a method performed by a computing device includes capturing, via a microphone of the computing device, one or more calibration sounds played by a playback device. The method further includes generating data representing the one or more calibration sounds and identifying one or more sections of the data such that each of the one or more sections of the data corresponds to a respective calibration sound of the one or more calibration sounds. The method further includes determining that more than a threshold amount of sections of the one or more sections of the data correspond to respective signal-to-noise ratios (SNRs) that are less than a threshold signal-to-noise ratio. The method further includes providing an indication, via a user interface of the computing device, that the playback device was not properly calibrated.

In another example, a computing device includes one or more processors and a non-transitory computer-readable medium storing instructions that, when executed by the one or more processors, cause the computing device to perform functions. The functions include capturing, via a microphone of the computing device, one or more calibration sounds played by a playback device and generating data representing the one or more calibration sounds. The functions further include identifying one or more sections of the data such that each of the one or more sections of the data corresponds to a respective calibration sound of the one or more calibration sounds. The functions further include determining that more than a threshold amount of sections of the one or more sections of the data correspond to respective signal-to-noise ratios (SNRs) that are less than a threshold signal-to-noise ratio and providing an indication, via a user interface of the computing device, that the playback device was not properly calibrated.

In one example, a non-transitory computer-readable medium stores instructions that, when executed by a computing device, cause the computing device to perform functions. The functions include, as the computing device is moving within an environment of a first playback device and a second playback device, capturing, via a microphone of the computing device, one or more first calibration sounds played by the first playback device and one or more second calibration sounds played by the second playback device. Each of the one or more first calibration sounds and each of the one or more second calibration sounds includes a sweep through frequencies of a calibration frequency range. The functions further include generating data representing the one or more first calibration sounds and the one or more second calibration sounds. The functions further include identifying (i) one or more first sections of the data such that each of the one or more first sections of the data corresponds to a respective calibration sound of the one or more first calibration sounds and (ii) one or more second sections of the data such that each of the one or more second sections of the data correspond to a respective calibration sound of the one or more second calibration sounds. The functions further include using the one or more first sections of the data to determine a first frequency response of the first playback device over the calibration frequency range. The first frequency response characterizes audio playback by the first playback device as influenced by acoustic characteristics of the environment of the first playback device and the second playback device. The functions further include using the one or more second sections of the data to determine a second frequency response of the second playback device over the calibration frequency range. The second frequency response characterizes audio playback by the second playback device as influenced by the acoustic characteristics of the environment of the first playback device and the second playback device. The functions further include determining one or more first parameters of a first audio processing algorithm based on the first frequency response and a first target frequency response and determining one or more second parameters of a second audio processing algorithm based on the second frequency response and a second target frequency response. The functions further include sending, to the first playback device, the one or more first parameters of the first audio processing algorithm and sending, to the second playback device, the one or more second parameters of the second audio processing algorithm.

In another example, a method performed by a computing device includes, as the computing device is moving within an environment of a first playback device and a second playback device, capturing, via a microphone of the computing device, one or more first calibration sounds played by the first playback device and one or more second calibration sounds played by the second playback device. Each of the one or more first calibration sounds and each of the one or more second calibration sounds includes a sweep through frequencies of a calibration frequency range. The method further includes generating data representing the one or more first calibration sounds and the one or more second calibration sounds. The method further includes identifying (i) one or more first sections of the data such that each of the one or more first sections of the data corresponds to a respective calibration sound of the one or more first calibration sounds and (ii) one or more second sections of the data such that each of the one or more second sections of the data correspond to a respective calibration sound of the one or more second calibration sounds. The method further includes using the one or more first sections of the data to determine a first frequency response of the first playback device over the calibration frequency range. The first frequency response characterizes audio playback by the first playback device as influenced by acoustic characteristics of the environment of the first playback device and the second playback device. The method further includes using the one or more second sections of the data to determine a second frequency response of the second playback device over the calibration frequency range. The second frequency response characterizes audio playback by the second playback device as influenced by the acoustic characteristics of the environment of the first playback device and the second playback device. The method further includes determining one or more first parameters of a first audio processing algorithm based on the first frequency response and a first target frequency response and determining one or more second parameters of a second audio processing algorithm based on the second frequency response and a second target frequency response. The method further includes sending, to the first playback device, the one or more first parameters of the first audio processing algorithm and sending, to the second playback device, the one or more second parameters of the second audio processing algorithm.

In another example, a computing device includes one or more processors and a non-transitory computer-readable medium storing instructions that, when executed by the one or more processors, cause the computing device to perform functions. The functions include, as the computing device is moving within an environment of a first playback device and a second playback device, capturing, via a microphone of the computing device, one or more first calibration sounds played by the first playback device and one or more second calibration sounds played by the second playback device. Each of the one or more first calibration sounds and each of the one or more second calibration sounds includes a sweep through frequencies of a calibration frequency range. The functions further include generating data representing the one or more first calibration sounds and the one or more second calibration sounds. The functions further include identifying (i) one or more first sections of the data such that each of the one or more first sections of the data corresponds to a respective calibration sound of the one or more first calibration sounds and (ii) one or more second sections of the data such that each of the one or more second sections of the data correspond to a respective calibration sound of the one or more second calibration sounds. The functions further include using the one or more first sections of the data to determine a first frequency response of the first playback device over the calibration frequency range. The first frequency response characterizes audio playback by the first playback device as influenced by acoustic characteristics of the environment of the first playback device and the second playback device. The functions further include using the one or more second sections of the data to determine a second frequency response of the second playback device over the calibration frequency range. The second frequency response characterizes audio playback by the second playback device as influenced by the acoustic characteristics of the environment of the first playback device and the second playback device. The functions further include determining one or more first parameters of a first audio processing algorithm based on the first frequency response and a first target frequency response and determining one or more second parameters of a second audio processing algorithm based on the second frequency response and a second target frequency response. The functions further include sending, to the first playback device, the one or more first parameters of the first audio processing algorithm and sending, to the second playback device, the one or more second parameters of the second audio processing algorithm.

In one example, a non-transitory computer-readable medium stores instructions that, when executed by a first computing device, cause the first computing device to perform functions. The functions include receiving, from a second computing device, data representing one or more calibration sounds that are played by a playback device and captured by the second computing device. Each of the one or more calibration sounds includes a sweep through frequencies of a calibration frequency range. The functions further include identifying one or more sections of the data such that each of the one or more sections of the data corresponds to a respective calibration sound of the one or more calibration sounds. The functions further include using the one or more sections of the data to determine a frequency response of the playback device over the calibration frequency range. The frequency response of the playback device characterizes audio playback by the playback device as influenced by acoustic characteristics of the environment of the playback device. The functions further include determining one or more parameters of an audio processing algorithm based on the frequency response of the playback device and a target frequency response and sending, to the playback device, the one or more parameters of the audio processing algorithm.

In another example, a method performed by a first computing device includes receiving, from a second computing device, data representing one or more calibration sounds that are played by a playback device and captured by the second computing device. Each of the one or more calibration sounds includes a sweep through frequencies of a calibration frequency range. The method further includes identifying one or more sections of the data such that each of the one or more sections of the data corresponds to a respective calibration sound of the one or more calibration sounds. The method further includes using the one or more sections of the data to determine a frequency response of the playback device over the calibration frequency range. The frequency response of the playback device characterizes audio playback by the playback device as influenced by acoustic characteristics of the environment of the playback device. The method further includes determining one or more parameters of an audio processing algorithm based on the frequency response of the playback device and a target frequency response and sending, to the playback device, the one or more parameters of the audio processing algorithm.

In another example, a first computing device includes one or more processors and a non-transitory computer-readable medium storing instructions that, when executed by the one or more processors, cause the first computing device to perform functions. The functions include receiving, from a second computing device, data representing one or more calibration sounds that are played by a playback device and captured by the second computing device. Each of the one or more calibration sounds includes a sweep through frequencies of a calibration frequency range. The functions further include identifying one or more sections of the data such that each of the one or more sections of the data corresponds to a respective calibration sound of the one or more calibration sounds. The functions further include using the one or more sections of the data to determine a frequency response of the playback device over the calibration frequency range. The frequency response of the playback device characterizes audio playback by the playback device as influenced by acoustic characteristics of the environment of the playback device. The functions further include determining one or more parameters of an audio processing algorithm based on the frequency response of the playback device and a target frequency response and sending, to the playback device, the one or more parameters of the audio processing algorithm.

In one example, a non-transitory computer-readable medium stores instructions that, when executed by a first computing device, cause the first computing device to perform functions. The functions include receiving, from a second computing device, data representing one or more calibration sounds that are played by a playback device and captured by the second computing device. The functions further include identifying one or more sections of the data such that each of the one or more sections of the data corresponds to a respective calibration sound of the one or more calibration sounds. The functions further include determining that more than a threshold amount of sections of the one or more sections of the data correspond to respective signal-to-noise ratios (SNRs) that are less than a threshold signal-to-noise ratio and sending an indication, to the second computing device, that the playback device was not properly calibrated.

In another example, a method performed by a first computing device includes receiving, from a second computing device, data representing one or more calibration sounds that are played by a playback device and captured by the second computing device. The method further includes identifying one or more sections of the data such that each of the one or more sections of the data corresponds to a respective calibration sound of the one or more calibration sounds. The method further includes determining that more than a threshold amount of sections of the one or more sections of the data correspond to respective signal-to-noise ratios (SNRs) that are less than a threshold signal-to-noise ratio and sending an indication, to the second computing device, that the playback device was not properly calibrated.

In another example, a first computing device includes one or more processors and a non-transitory computer-readable medium storing instructions that, when executed by the one or more processors, cause the first computing device to perform functions. The functions include receiving, from a second computing device, data representing one or more calibration sounds that are played by a playback device and captured by the second computing device. The functions further include identifying one or more sections of the data such that each of the one or more sections of the data corresponds to a respective calibration sound of the one or more calibration sounds. The functions further include determining that more than a threshold amount of sections of the one or more sections of the data correspond to respective signal-to-noise ratios (SNRs) that are less than a threshold signal-to-noise ratio and sending an indication, to the second computing device, that the playback device was not properly calibrated.

In one example, a non-transitory computer-readable medium stores instructions that, when executed by a first computing device, cause the first computing device to perform functions. The functions include receiving, from a second computing device, data representing (i) one or more first calibration sounds that are played by a first playback device and captured by the second computing device and (ii) one or more second calibration sounds that are played by a second playback device and captured by the second computing device. The functions further include identifying (i) one or more first sections of the data such that each of the one or more first sections of the data correspond to a respective calibration sound of the one or more first calibration sounds and (ii) one or more second sections of the data such that each of the one or more second sections of the data correspond to a respective calibration sound of the one or more second calibration sounds. The functions further include using the one or more first sections of the data to determine a first frequency response of the first playback device over the calibration frequency range. The first frequency response characterizes audio playback by the first playback device as influenced by acoustic characteristics of the environment of the first playback device and the second playback device. The functions further include using the one or more second sections of the data to determine a second frequency response of the second playback device over the calibration frequency range. The second frequency response characterizes audio playback by the second playback device as influenced by the acoustic characteristics of the environment of the first playback device and the second playback device. The functions further include determining one or more first parameters of a first audio processing algorithm based on the first frequency response and a first target frequency response and determining one or more second parameters of a second audio processing algorithm based on the second frequency response and a second target frequency response. The functions further include sending, to the first playback device, the one or more first parameters of the first audio processing algorithm and sending, to the second playback device, the one or more second parameters of the second audio processing algorithm.

In another example, a method performed by a first computing device includes receiving, from a second computing device, data representing (i) one or more first calibration sounds that are played by a first playback device and captured by the second computing device and (ii) one or more second calibration sounds that are played by a second playback device and captured by the second computing device. The method further includes identifying (i) one or more first sections of the data such that each of the one or more first sections of the data correspond to a respective calibration sound of the one or more first calibration sounds and (ii) one or more second sections of the data such that each of the one or more second sections of the data correspond to a respective calibration sound of the one or more second calibration sounds. The method further includes using the one or more first sections of the data to determine a first frequency response of the first playback device over the calibration frequency range. The first frequency response characterizes audio playback by the first playback device as influenced by acoustic characteristics of the environment of the first playback device and the second playback device. The method further includes using the one or more second sections of the data to determine a second frequency response of the second playback device over the calibration frequency range. The second frequency response characterizes audio playback by the second playback device as influenced by the acoustic characteristics of the environment of the first playback device and the second playback device. The method further includes determining one or more first parameters of a first audio processing algorithm based on the first frequency response and a first target frequency response and determining one or more second parameters of a second audio processing algorithm based on the second frequency response and a second target frequency response. The method further includes sending, to the first playback device, the one or more first parameters of the first audio processing algorithm and sending, to the second playback device, the one or more second parameters of the second audio processing algorithm.

In another example, a first computing device includes one or more processors and a non-transitory computer-readable medium storing instructions that, when executed by the one or more processors, cause the first computing device to perform functions. The functions include receiving, from a second computing device, data representing (i) one or more first calibration sounds that are played by a first playback device and captured by the second computing device and (ii) one or more second calibration sounds that are played by a second playback device and captured by the second computing device. The functions further include identifying (i) one or more first sections of the data such that each of the one or more first sections of the data correspond to a respective calibration sound of the one or more first calibration sounds and (ii) one or more second sections of the data such that each of the one or more second sections of the data correspond to a respective calibration sound of the one or more second calibration sounds. The functions further include using the one or more first sections of the data to determine a first frequency response of the first playback device over the calibration frequency range. The first frequency response characterizes audio playback by the first playback device as influenced by acoustic characteristics of the environment of the first playback device and the second playback device. The functions further include using the one or more second sections of the data to determine a second frequency response of the second playback device over the calibration frequency range. The second frequency response characterizes audio playback by the second playback device as influenced by the acoustic characteristics of the environment of the first playback device and the second playback device. The functions further include determining one or more first parameters of a first audio processing algorithm based on the first frequency response and a first target frequency response and determining one or more second parameters of a second audio processing algorithm based on the second frequency response and a second target frequency response. The functions further include sending, to the first playback device, the one or more first parameters of the first audio processing algorithm and sending, to the second playback device, the one or more second parameters of the second audio processing algorithm.

In one example, a non-transitory computer-readable medium stores instructions that, when executed by a playback device, cause the playback device to perform functions. The functions include receiving, from a computing device, data representing one or more calibration sounds that are played by the playback device and captured by the computing device. Each of the one or more calibration sounds includes a sweep through frequencies of a calibration frequency range. The functions further include identifying one or more sections of the data such that each of the one or more sections of the data corresponds to a respective calibration sound of the one or more calibration sounds. The functions further include using the one or more sections of the data to determine a frequency response of the playback device over the calibration frequency range. The frequency response of the playback device characterizes audio playback by the playback device as influenced by acoustic characteristics of the environment of the playback device. The functions further include determining one or more parameters of an audio processing algorithm based on the frequency response of the playback device and a target frequency response. The functions further include playing audio that is processed using the audio processing algorithm.

In another example, a method performed by a playback device includes receiving, from a computing device, data representing one or more calibration sounds that are played by the playback device and captured by the computing device. Each of the one or more calibration sounds includes a sweep through frequencies of a calibration frequency range. The method further includes identifying one or more sections of the data such that each of the one or more sections of the data corresponds to a respective calibration sound of the one or more calibration sounds. The method further includes using the one or more sections of the data to determine a frequency response of the playback device over the calibration frequency range. The frequency response of the playback device characterizes audio playback by the playback device as influenced by acoustic characteristics of the environment of the playback device. The method further includes determining one or more parameters of an audio processing algorithm based on the frequency response of the playback device and a target frequency response. The method further includes playing audio that is processed using the audio processing algorithm.

In another example, a playback device includes one or more processors and a non-transitory computer-readable medium storing instructions that, when executed by the one or more processors, cause the playback device to perform functions. The functions include receiving, from a computing device, data representing one or more calibration sounds that are played by the playback device and captured by the computing device. Each of the one or more calibration sounds includes a sweep through frequencies of a calibration frequency range. The functions further include identifying one or more sections of the data such that each of the one or more sections of the data corresponds to a respective calibration sound of the one or more calibration sounds. The functions further include using the one or more sections of the data to determine a frequency response of the playback device over the calibration frequency range. The frequency response of the playback device characterizes audio playback by the playback device as influenced by acoustic characteristics of the environment of the playback device. The functions further include determining one or more parameters of an audio processing algorithm based on the frequency response of the playback device and a target frequency response. The functions further include playing audio that is processed using the audio processing algorithm.

In one example, a non-transitory computer-readable medium stores instructions that, when executed by a playback device, cause the playback device to perform functions. The functions include receiving, from a computing device, data representing one or more calibration sounds that are played by the playback device and captured by the computing device. The functions further include identifying one or more sections of the data such that each of the one or more sections of the data corresponds to a respective calibration sound of the one or more calibration sounds. The functions further include determining that more than a threshold amount of sections of the one or more sections of the data correspond to respective signal-to-noise ratios (SNRs) that are less than a threshold signal-to-noise ratio. The functions further include providing an indication that the playback device was not properly calibrated.

In another example, a method performed by a playback device includes receiving, from a computing device, data representing one or more calibration sounds that are played by the playback device and captured by the computing device. The method further includes identifying one or more sections of the data such that each of the one or more sections of the data corresponds to a respective calibration sound of the one or more calibration sounds. The method further includes determining that more than a threshold amount of sections of the one or more sections of the data correspond to respective signal-to-noise ratios (SNRs) that are less than a threshold signal-to-noise ratio. The method further includes providing an indication that the playback device was not properly calibrated.

In another example, a playback device includes one or more processors and a non-transitory computer-readable medium storing instructions that, when executed by the one or more processors, cause the playback device to perform functions. The functions include receiving, from a computing device, data representing one or more calibration sounds that are played by the playback device and captured by the computing device. The functions further include identifying one or more sections of the data such that each of the one or more sections of the data corresponds to a respective calibration sound of the one or more calibration sounds. The functions further include determining that more than a threshold amount of sections of the one or more sections of the data correspond to respective signal-to-noise ratios (SNRs) that are less than a threshold signal-to-noise ratio. The functions further include providing an indication that the playback device was not properly calibrated.

It will be understood by one of ordinary skill in the art that this disclosure includes numerous other embodiments. While some examples described herein may refer to functions performed by given actors such as "users" and/or other entities, it should be understood that this is for purposes of explanation only. The claims should not be interpreted to require action by any such example actor unless explicitly required by the language of the claims themselves.

When the terms "substantially" or "about" are used herein, it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102, 104, 106, 108, 110, 112, 114, 116, 118, 120, 122, and 124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
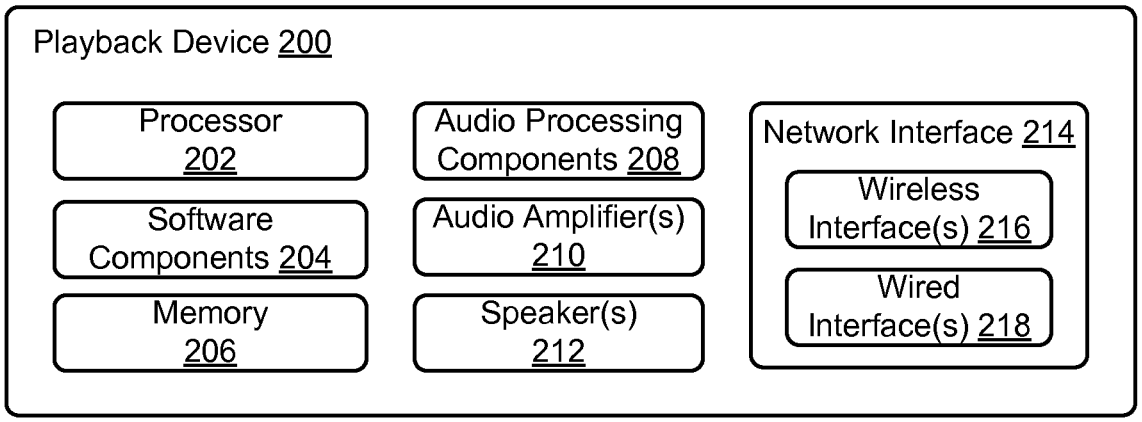
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 might not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The microphone(s) 220 may include an audio sensor configured to convert detected sounds into electrical signals. The electrical signal may be processed by the audio processing components 208 and/or the processor 202. The microphone(s) 220 may be positioned in one or more orientations at one or more locations on the playback device 200. The microphone(s) 220 may be configured to detect sound within one or more frequency ranges. In one case, one or more of the microphone(s) 220 may be configured to detect sound within a frequency range of audio that the playback device 200 is capable or rendering. In another case, one or more of the microphone(s) 220 may be configured to detect sound within a frequency range audible to humans. Other examples are also possible.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being played by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
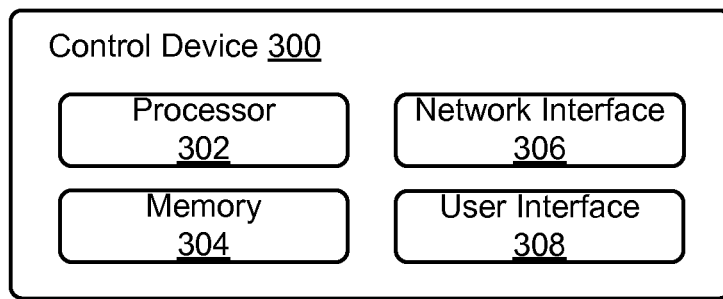
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

The microphone(s) 310 may include an audio sensor configured to convert detected sounds into electrical signals. The electrical signal may be processed by the processor 302. In one case, if the control device 300 is a device that may also be used as a means for voice communication or voice recording, one or more of the microphone(s) 310 may be a microphone for facilitating those functions. For instance, the one or more of the microphone(s) 310 may be configured to detect sound within a frequency range that a human is capable of producing and/or a frequency range audible to humans. Other examples are also possible.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
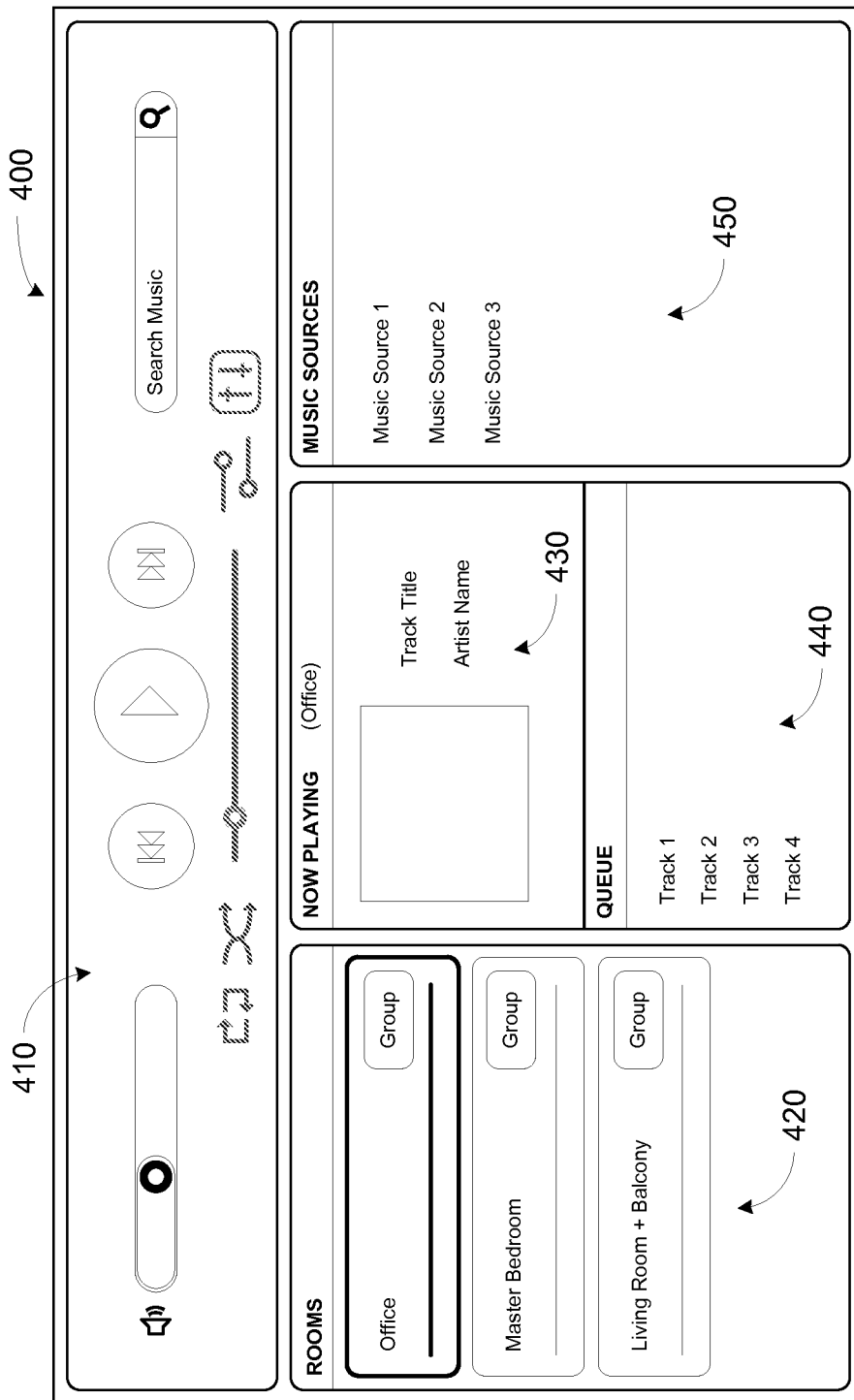
FIG. 4 shows an example controller interface.
Figure 5:
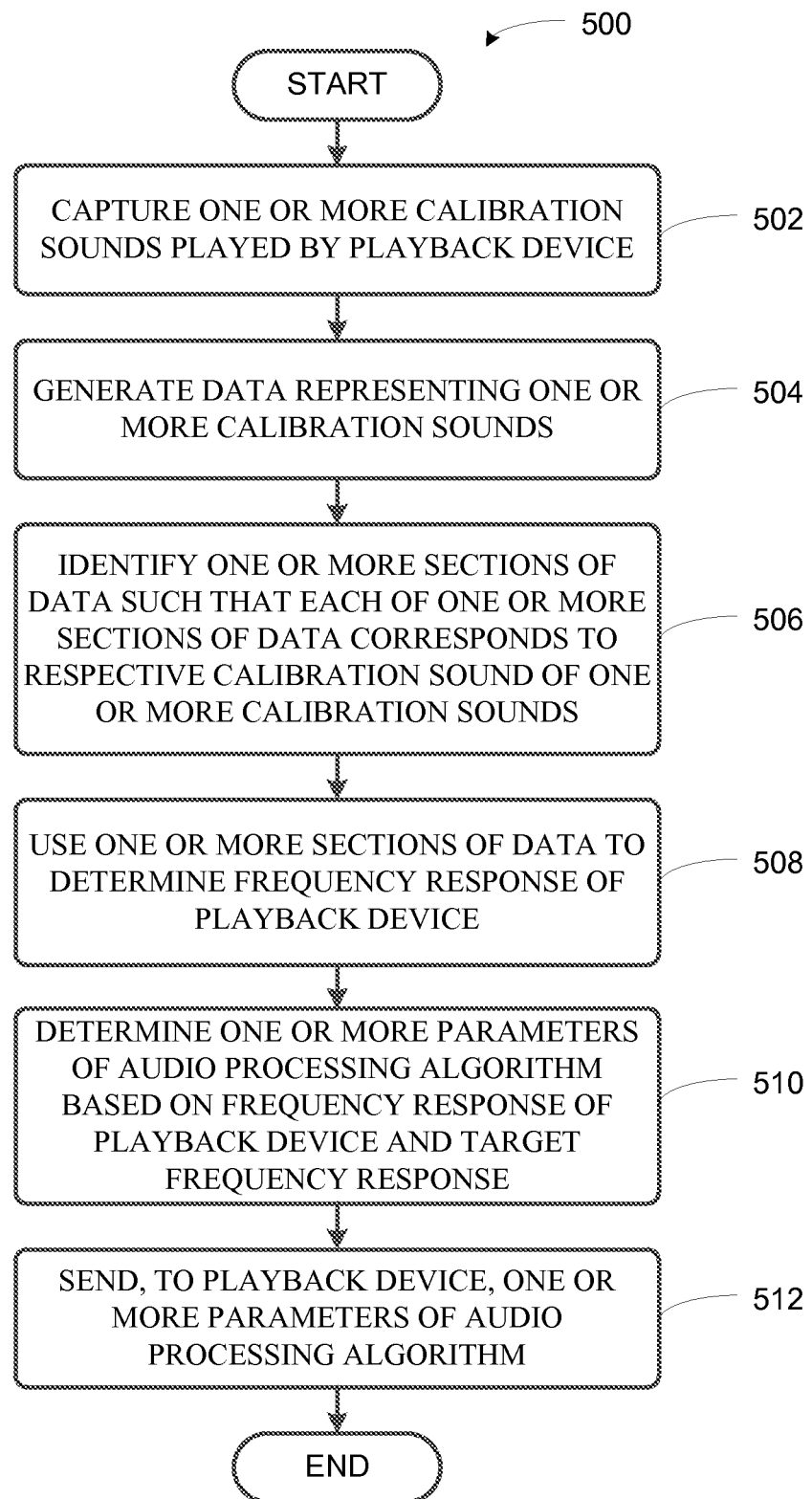
FIG. 5 is a flow diagram of an example method.
Figure 6:
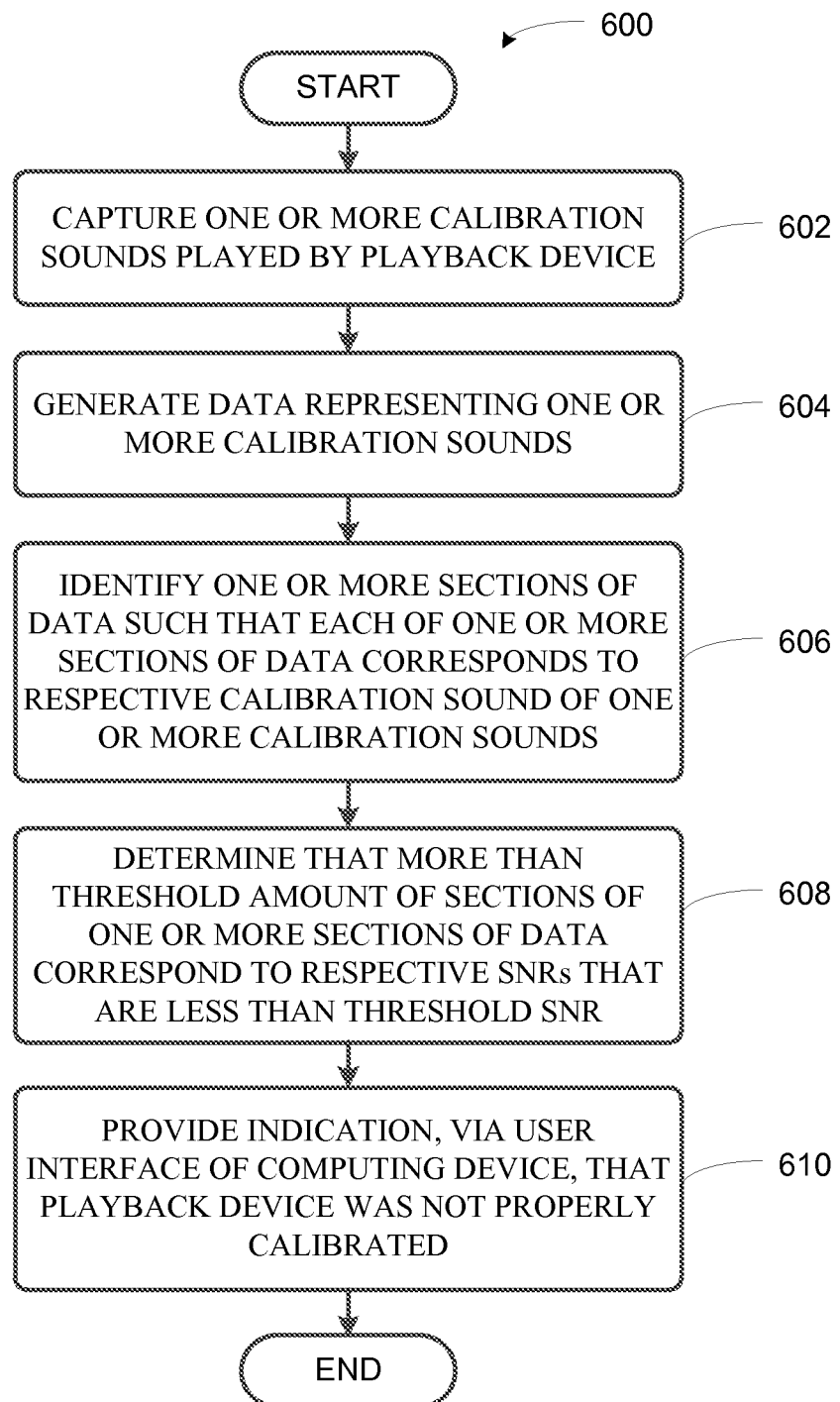
FIG. 6 is a flow diagram of an example method.
Figure 7A:
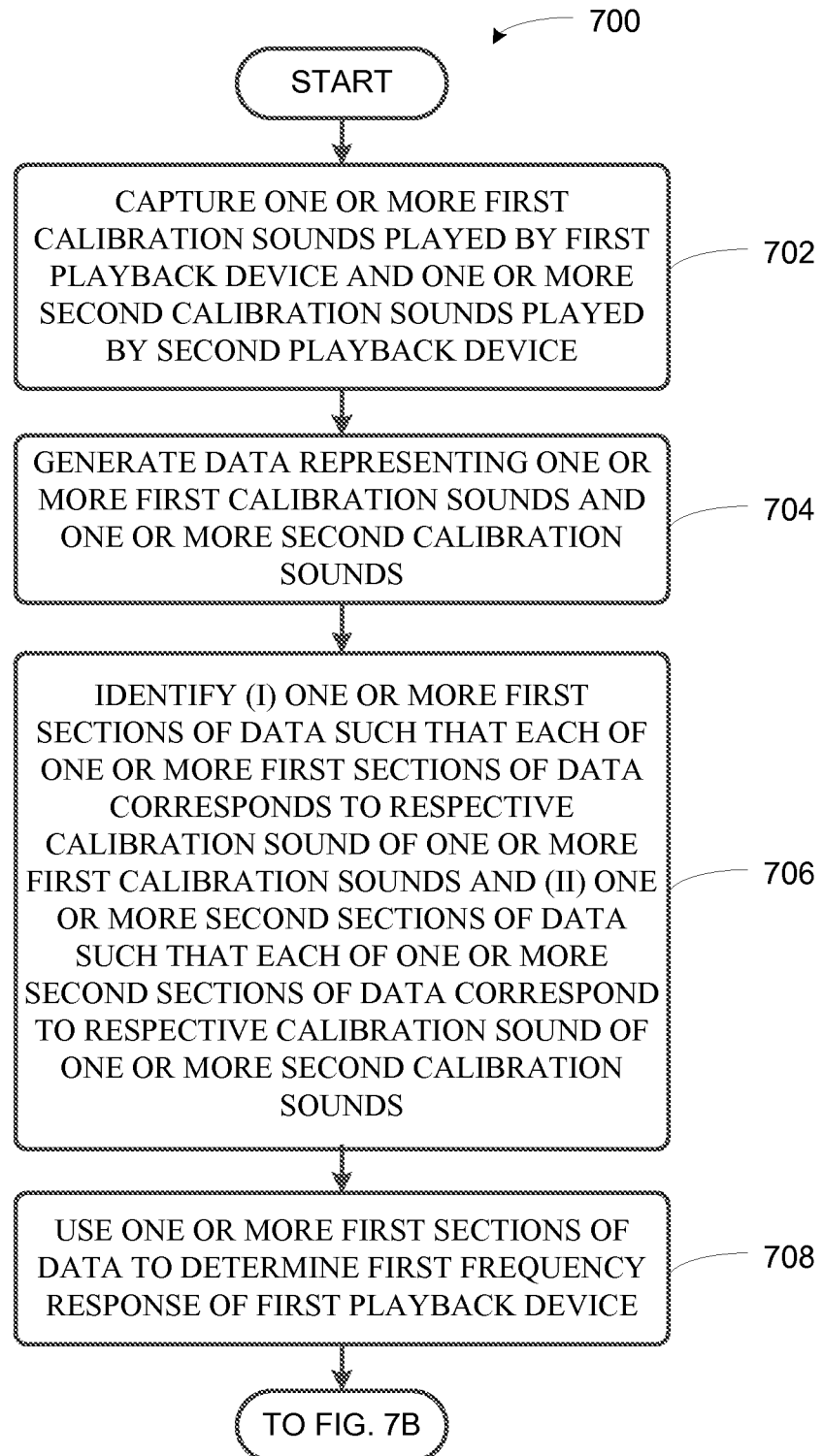
FIG. 7A is a flow diagram of an example method.
Figure 7B:
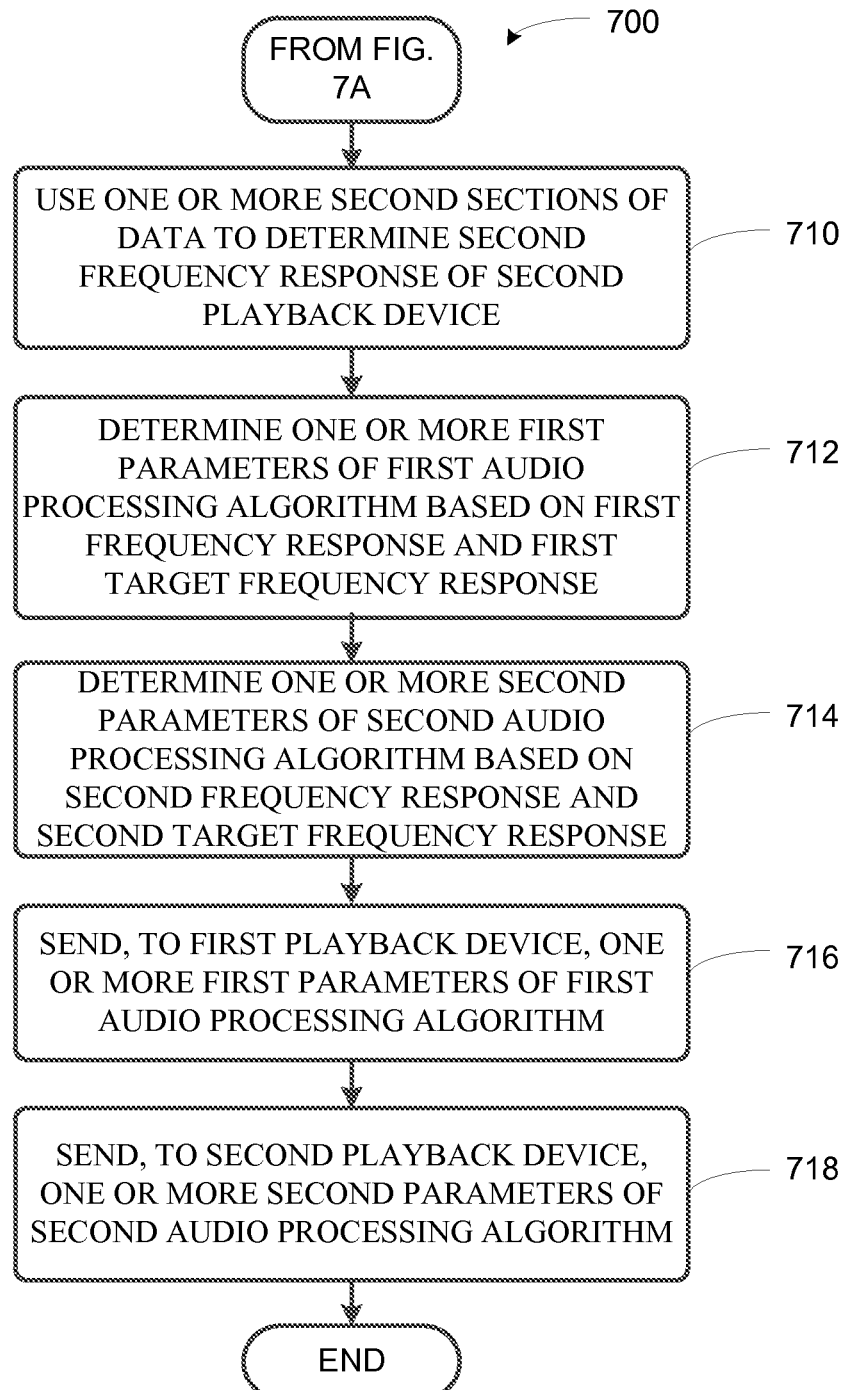
FIG. 7B is a flow diagram of an example method.
Figure 8:
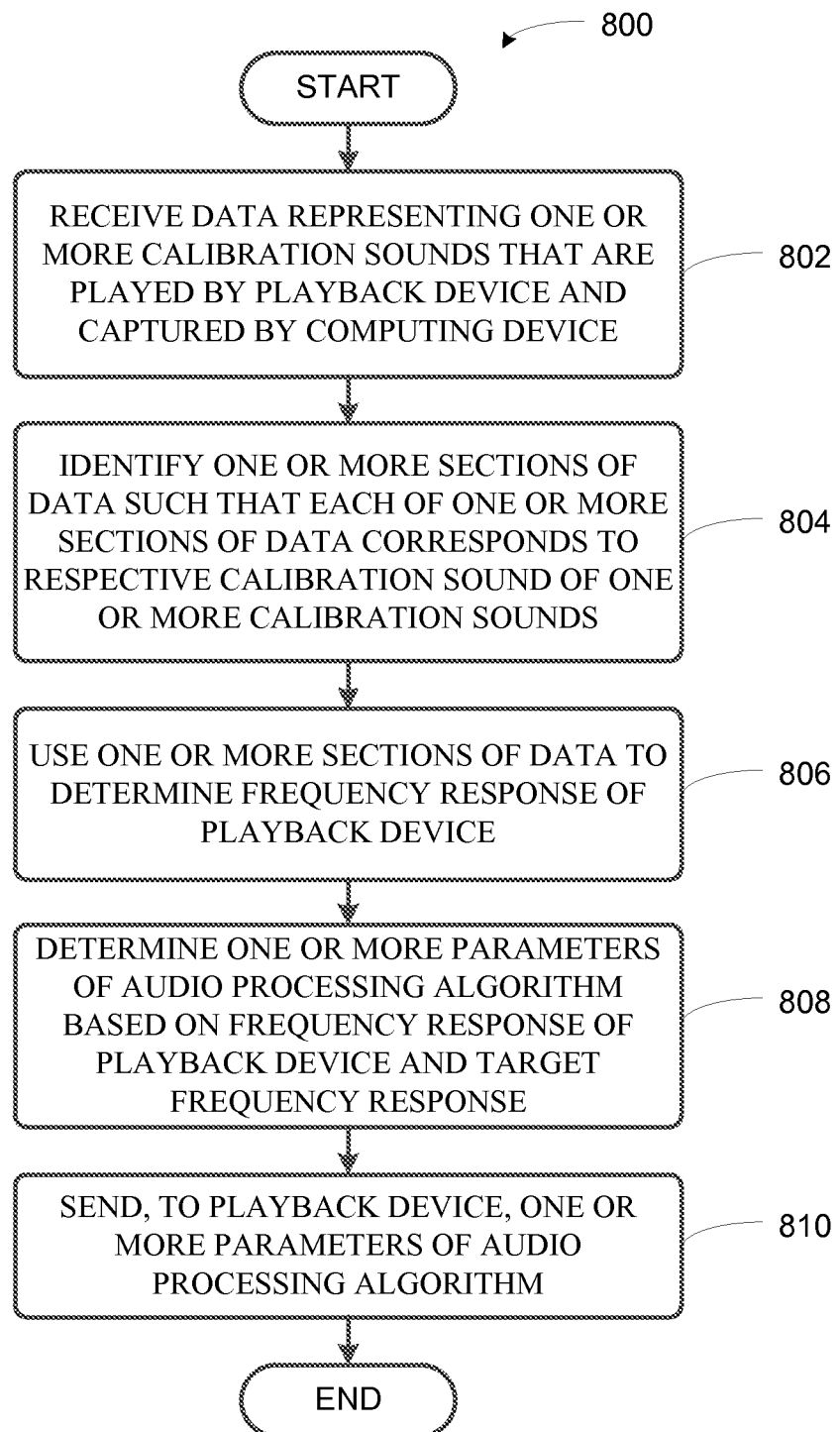
FIG. 8 is a flow diagram of an example method.
Figure 9:
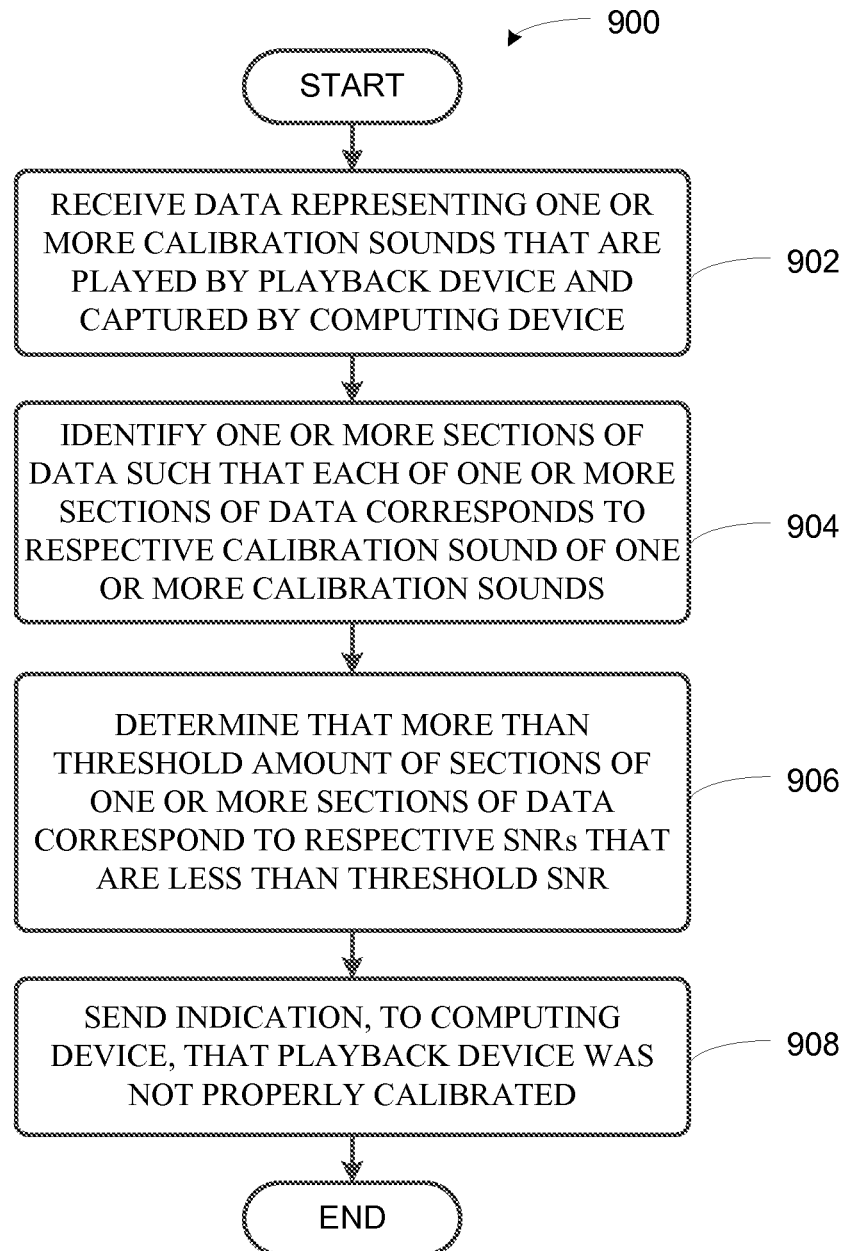
FIG. 9 is a flow diagram of an example method.
Figure 10A:
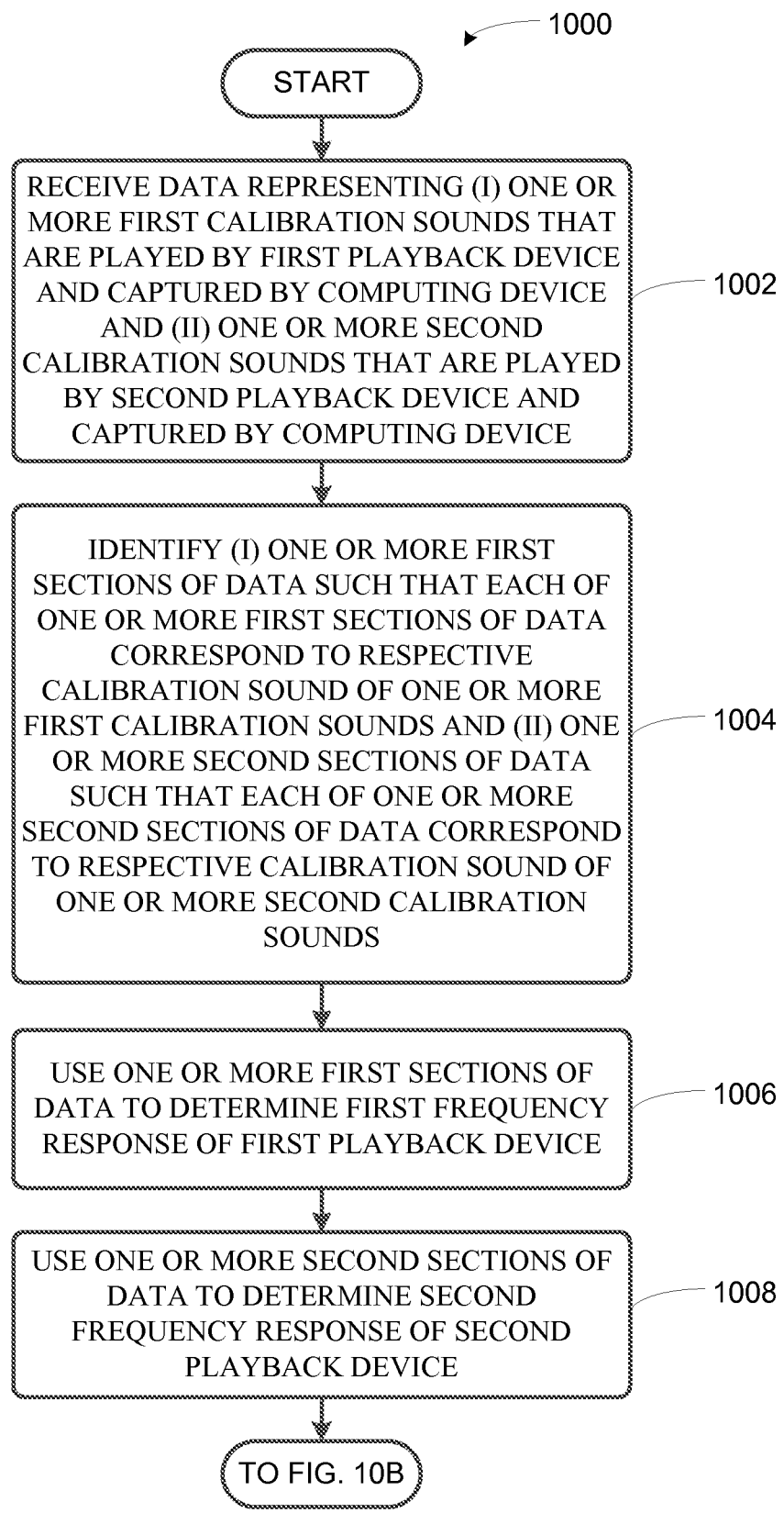
FIG. 10A is a flow diagram of an example method.
Figure 10B:
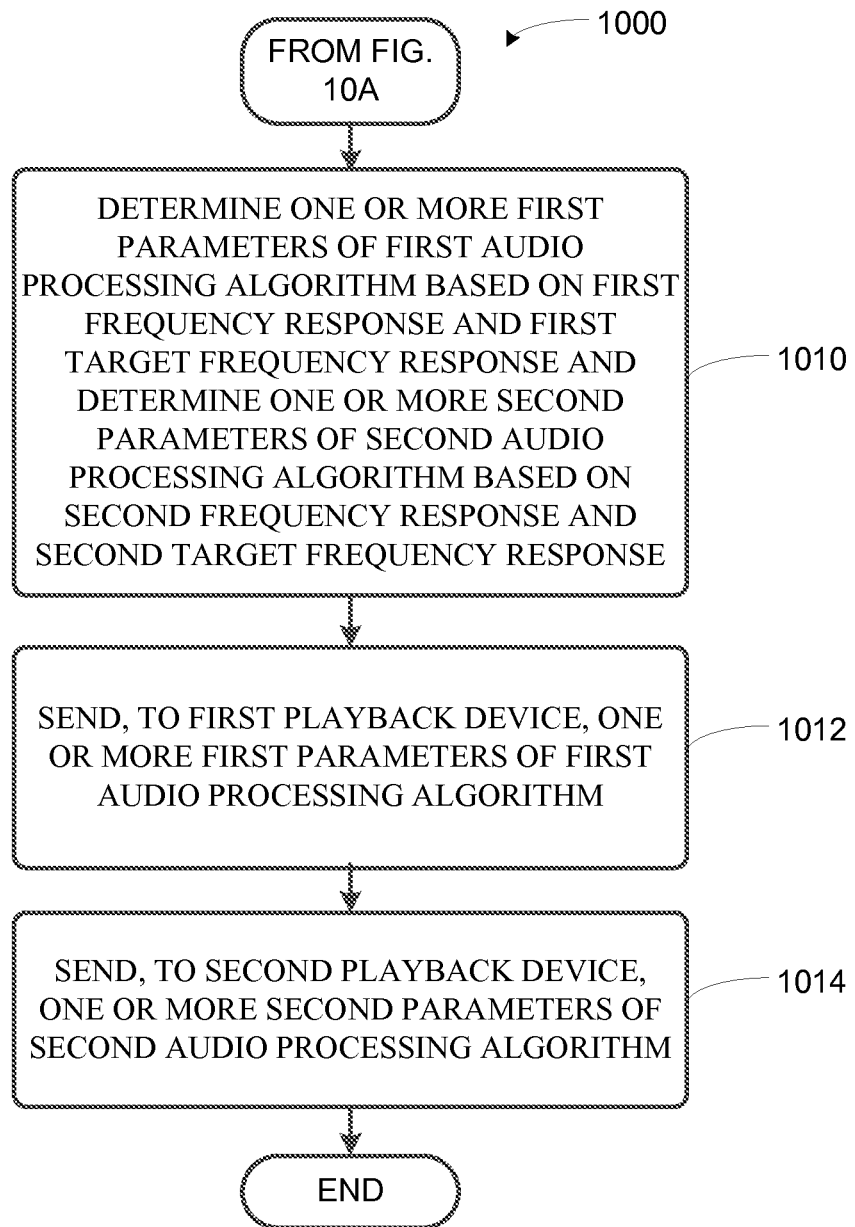
FIG. 10B is a flow diagram of an example method.
Figure 11:
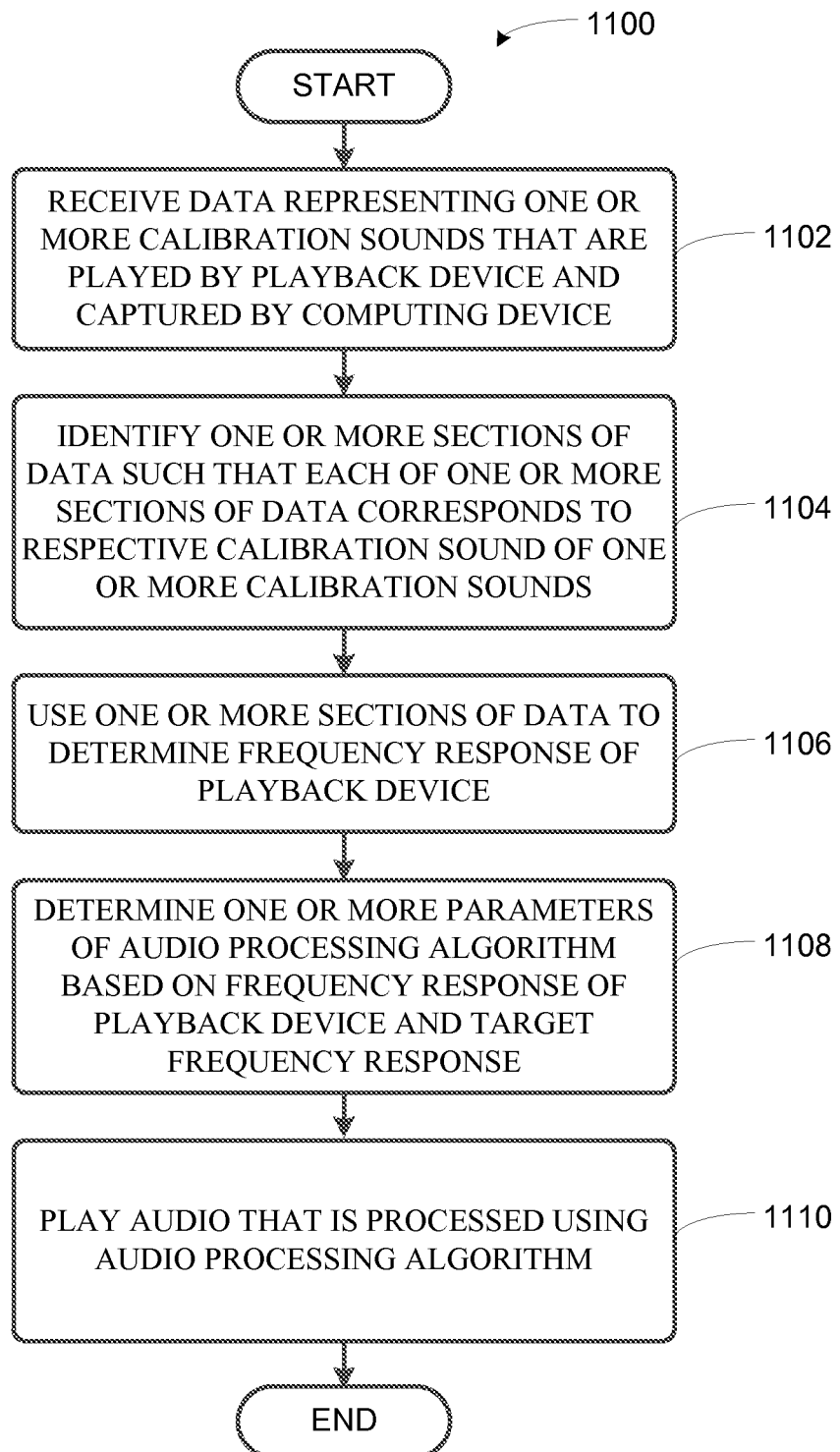
FIG. 11 is a flow diagram of an example method.
Figure 12:
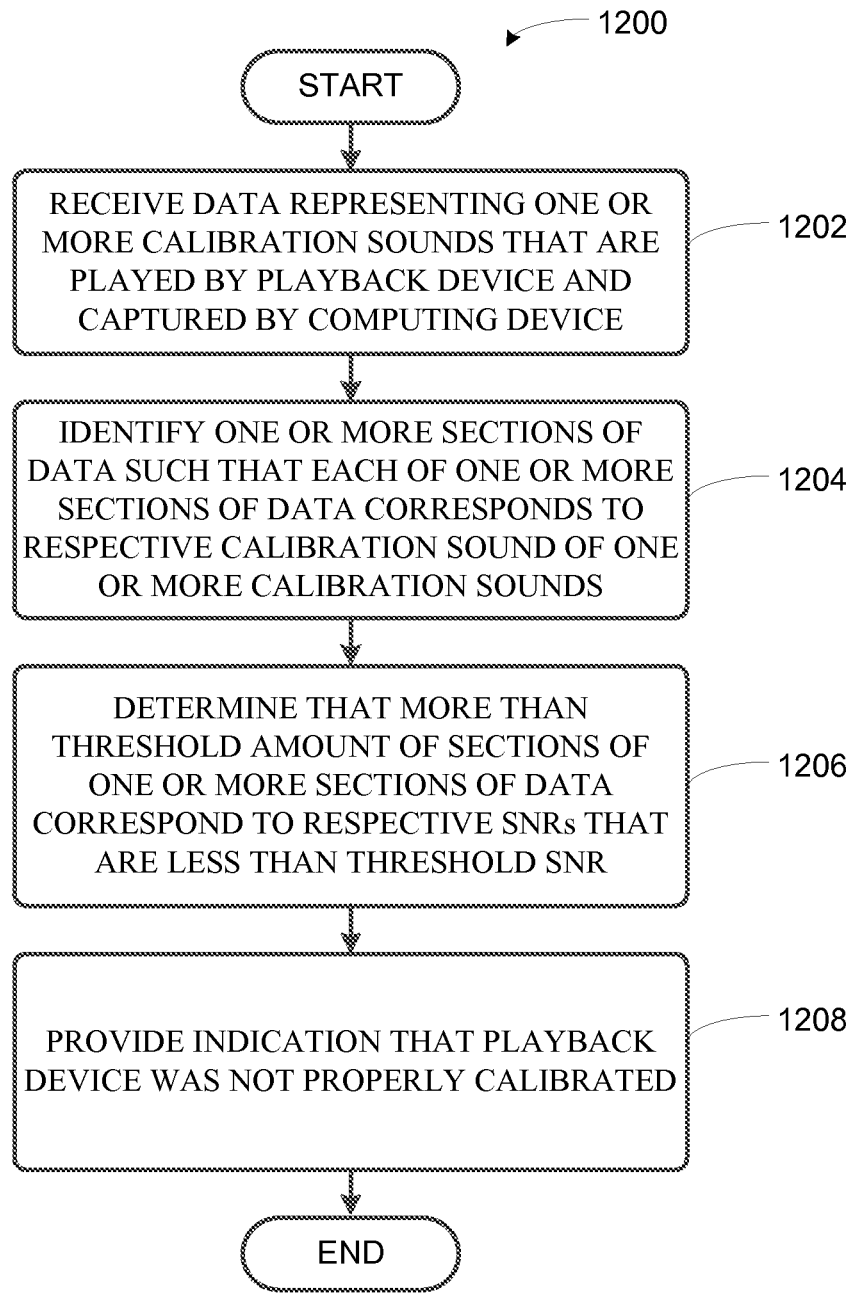
FIG. 12 is a flow diagram of an example method.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Methods and Systems Related to Facilitating Calibration of an Audio Playback Device As discussed above, some examples described herein include, among other things, detecting and analyzing calibration sounds that are played by a playback device to determine a frequency response of the playback device in its surrounding environment, and determining an audio processing algorithm tuned to adjust the frequency response of the playback device to a target frequency response. Other aspects of the examples will be made apparent in the remainder of the description herein.

Methods 500, 600, 700, 800, 900, 1000, 1100, and 1200 respectively shown in FIGS. 5, 6, 7A and 7B, 8, 9, 10A and 10B, 11, and 12 present example methods that can be implemented within an operating environment including, for example, one or more of the media playback system 100 of FIG. 1, one or more of the playback device 200 of FIG. 2, and one or more of the control device 300 of FIG. 3. The methods 500-1200 may involve other devices as well. Methods 500-1200 may include one or more operations, functions, or actions as illustrated by one or more of blocks 502, 504, 506, 508, 510, 512, 602, 604, 606, 608, 610, 702, 704, 706, 708, 710, 712, 714, 716, 718, 802, 804, 806, 808, 810, 902, 904, 906, 908, 1002, 1004, 1006, 1008, 1010, 1012, 1014, 1102, 1104, 1106, 1108, 1110, 1202, 1204, 1206, and 1208. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the methods 500-1200 and other processes and methods disclosed herein, the flowcharts show functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer-readable medium, for example, such as a storage device including a disk(s) or hard drive(s). In some embodiments, the program code may be stored in memory (e.g., disks or disk arrays) associated with and/or connected to a server system that makes the program code available for download (e.g., an application store or other type of server system) to desktop/laptop computers, smart phones, tablet computers, or other types of computing devices. The computer-readable medium may include non-transitory computer-readable media, for example, such as computer-readable media that stores data for short periods of time like register memory, processor cache, and Random Access Memory (RAM). The computer-readable medium may also include non-transitory media, such as secondary or persistent long-term storage, like read-only memory (ROM), optical or magnetic disks, compact-disc read-only memory (CD-ROM), for example. The computer-readable media may also be any other volatile or non-volatile storage systems. The computer-readable medium may be considered a computer-readable storage medium, for example, or a tangible storage device. In addition, for the methods 500-1200 and other processes and methods disclosed herein, each block in FIGS. 5-12 may represent circuitry that is wired to perform the specific logical functions in the process.

In some examples, the method 500 is performed by a computing device taking the form of a control device, such as the control device 300, but other examples are possible. As such, in the context of the method 500, the computing device may also be referred to herein as a control device. The method 500 may generally include the use of the computing device to calibrate a playback device.

At block 502, the method 500 may include, as the computing device is moving within an environment of the playback device, capturing, via a microphone of the computing device, one or more calibration sounds played by the playback device.

Figure 13:
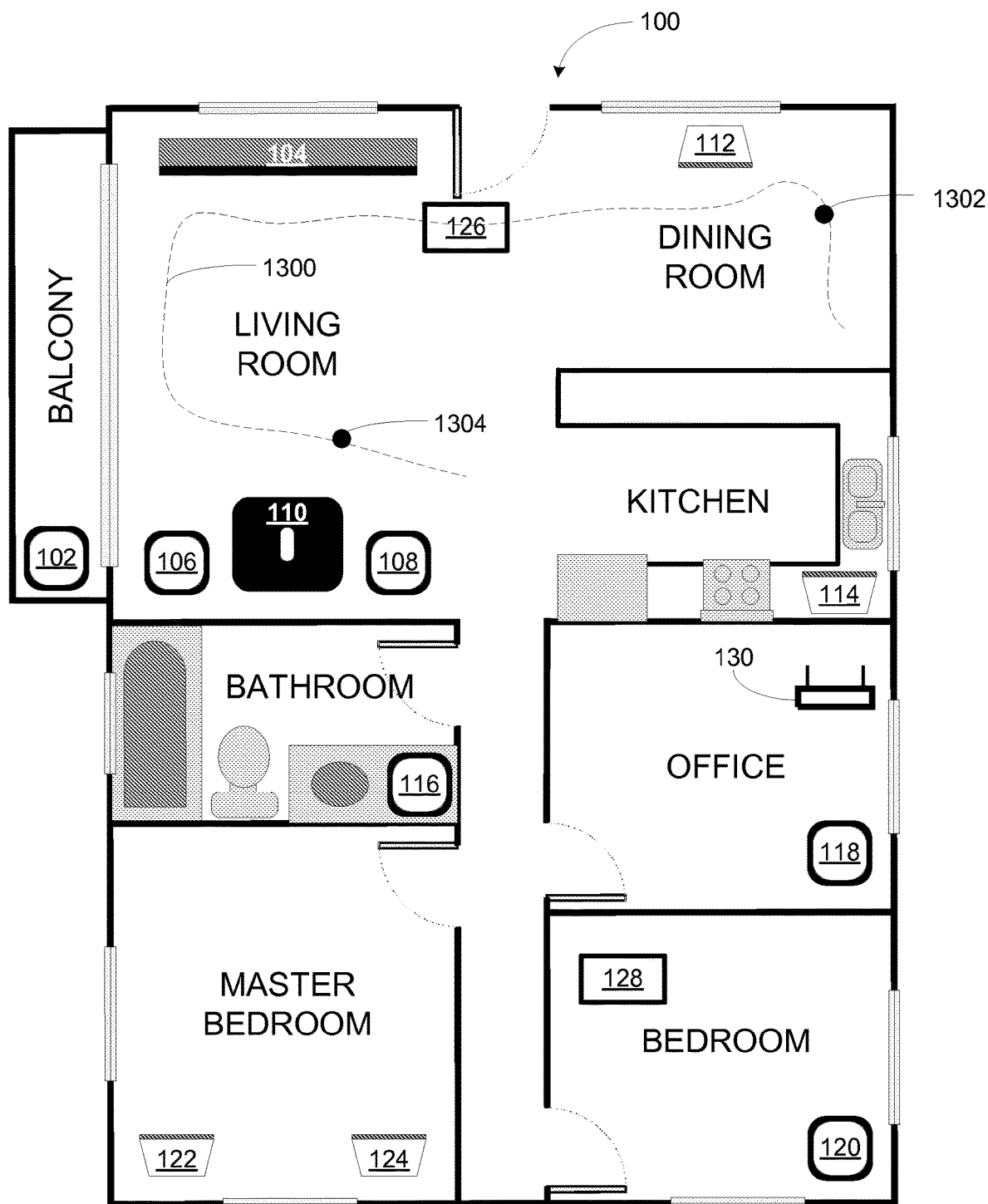
FIG. 13 shows an example path of a moving microphone.

To illustrate movement of the computing device during calibration, FIG. 13 shows media playback system 100 of FIG. 1. FIG. 13 shows a path 1300 along which the computing device (e.g., control device 126) might be moved during calibration. The control device 126 may indicate (e.g., via a user interface) how to perform such movement in various ways, such as by way of a video, animation, and/or audible instructions, among other examples.

The control device 126 may capture, via a microphone, calibration sounds played by a playback device (e.g., playback device 108) at various points along the path 1300 (e.g., at point 1302 and/or point 1304). Alternatively, the control device 126 may capture the calibration sounds along the path 1300. In some embodiments, the playback device 108 may play periodic calibration sounds such that the control device 126 captures respective instances of the calibration sound at different points along the path. Comparison of such captured calibration sounds may indicate how acoustic characteristics of the environment change from one physical location to another, which may influence parameters of an audio processing algorithm chosen for the playback device in that environment.

In this context, each of the one or more calibration sounds played by the playback device may include a sweep through frequencies of a calibration frequency range. For example, the calibration sounds may each include a swept sine or another sound that includes a sequence of all frequencies of the calibration frequency range. While there are an infinite number of frequencies between any two frequencies, in practice, the calibration sound may include only a sequence of discrete frequencies at a given frequency resolution. Such a collection of discrete frequencies may approximate a continuous sweep through all frequencies of the calibration frequency range.

In a more specific example, a calibration sound played by the playback device may include a first component that includes (i) calibration noise at frequencies between a minimum of the calibration frequency range and a first threshold frequency and (ii) a second component that sweeps through frequencies between a second threshold frequency and a maximum of the calibration frequency range.

Figure 14A:
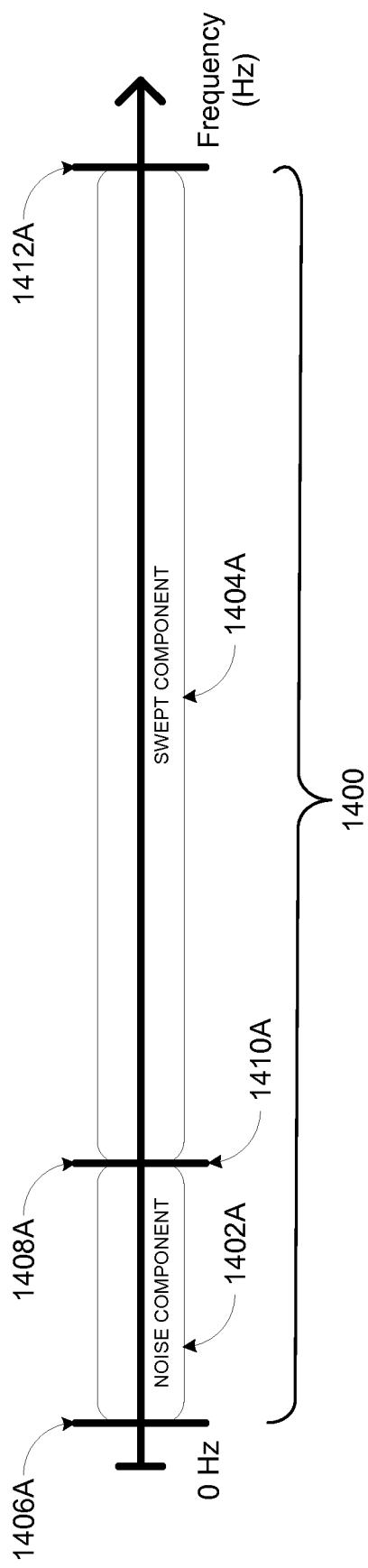
FIG. 14A shows an example calibration sound.
Figure 14B:
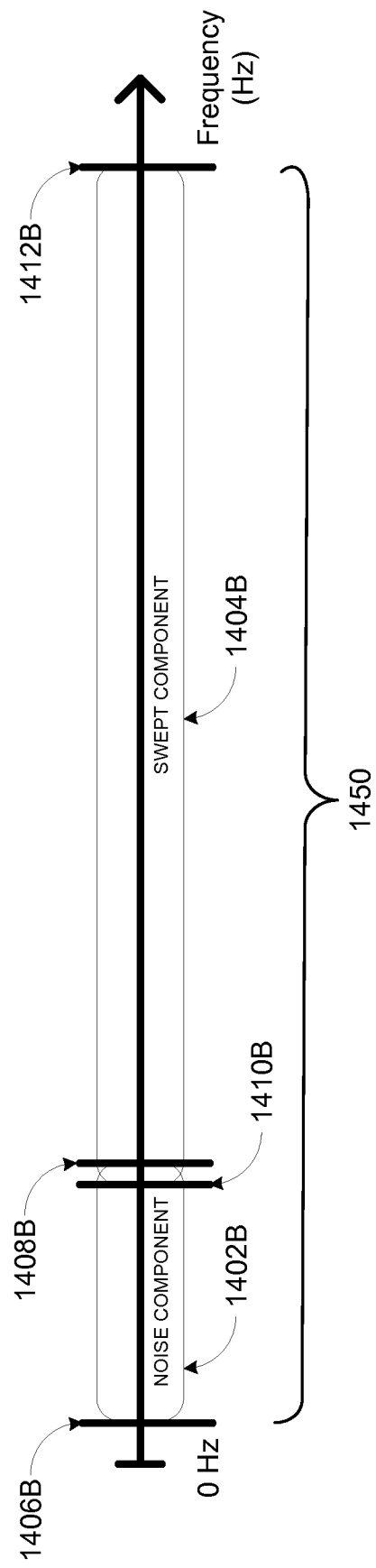
FIG. 14B shows an example calibration sound.

FIGS. 14A and 14B illustrate components of example calibration sounds 1400 and 1450 that span respective calibration frequency ranges. In FIG. 14A, the calibration frequency range is defined by a minimum frequency at 1406A and a maximum frequency at 1412A. FIG. 14A illustrates a first component 1402A (i.e., a noise component) and a second component 1404A (i.e., a "swept" component) of the calibration sound 1400. Component 1402A includes pseudo-random noise similar to brown noise (discussed below) and spans frequencies from a minimum frequency 1406A (e.g. 15-20 Hz) to a first threshold frequency 1408A (e.g., 50-100 Hz). Component 1404A includes a swept sine that spans frequencies from a second threshold frequency 1410A (e.g., 50-100 Hz) to a maximum frequency 1412A (e.g., 20-30 kHz). As shown, the threshold frequency 1408A and the threshold frequency 1410A may be the same frequency.

In FIG. 14B, the calibration frequency range is defined by a minimum frequency at 1406B and a maximum frequency at 1412B. FIG. 14B illustrates a first component 1402B (i.e., a noise component) and a second component 1404B (i.e., a "swept" component) of an example calibration sound 1450. Component 1402B includes pseudo-random noise similar to brown noise (discussed below) and spans frequencies from a minimum frequency 1406B to a first threshold frequency 1408A. Component 1404A includes a swept sine that spans frequencies from a second threshold frequency 1410B to a maximum frequency 1412B. As shown, the threshold frequency 1410B is a lower frequency than threshold frequency 1408B such that component 1402B and component 1404B overlap in a transition frequency range that extends from threshold frequency 1410B to threshold frequency 1408B.

Figure 15:
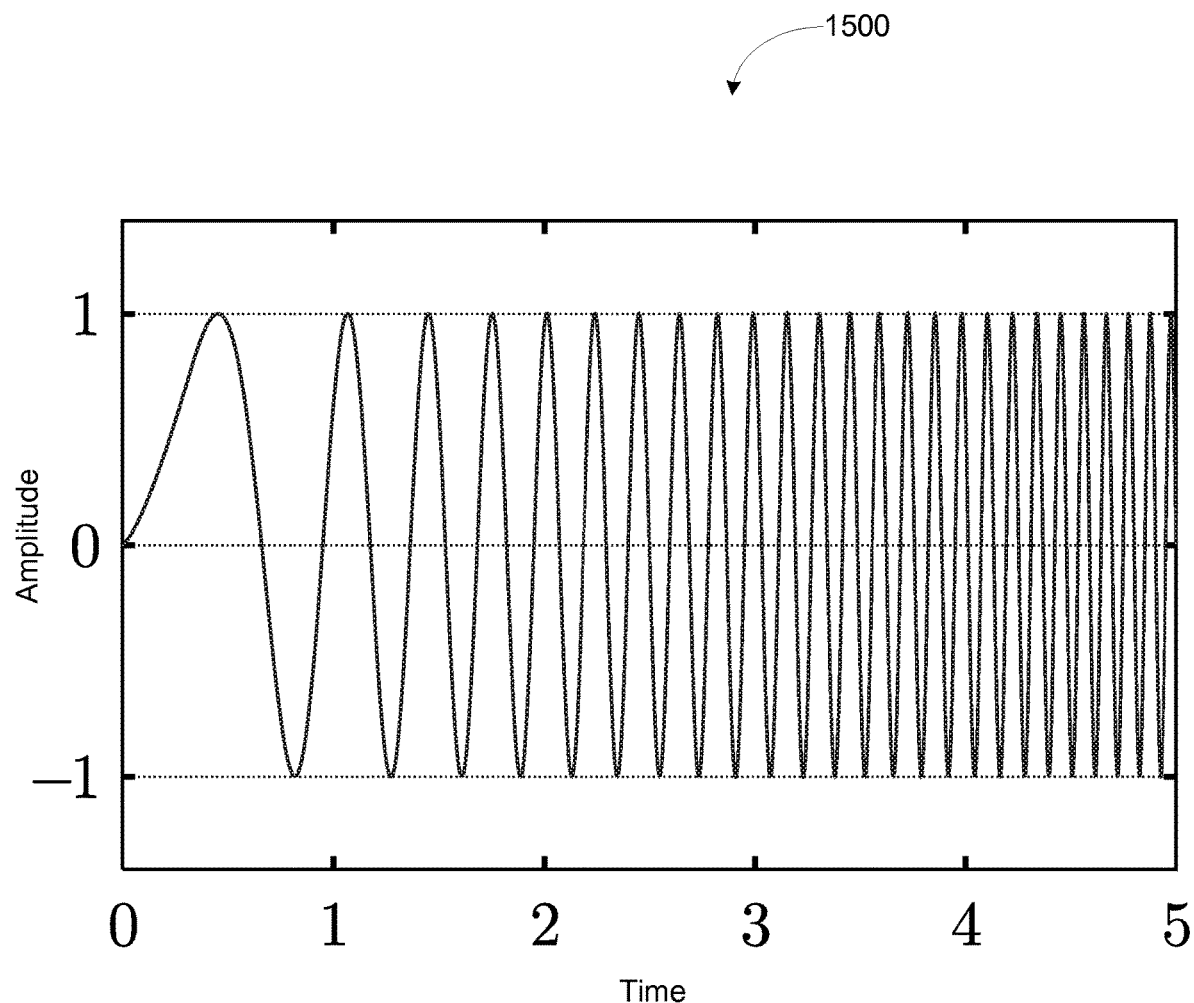
FIG. 15 shows an example swept component of a calibration sound.

A swept component (e.g., a chirp or swept sine) is a waveform in which the frequency increases or decreases with time. Including such a waveform as a component of a calibration sound may facilitate covering a calibration frequency range, as a swept component can be chosen that increases or decreases through the calibration frequency range (or a portion thereof). For example, a swept component emits each frequency of the swept component for a relatively short time period such that the swept component more efficiently covers a calibration frequency range relative to some other waveforms. FIG. 15 shows a graph 1500 that illustrates an example swept component. As shown in FIG. 15, the frequency of the waveform increases over time (plotted on the X-axis) and a tone is emitted at each frequency for a relatively short period of time. Other example swept components may have a frequency that decreases over time.

However, because each frequency of the swept component is emitted for a relatively short duration of time, the amplitude (or sound intensity) of the swept component must be relatively high at low frequencies to overcome typical background noise. Some speakers might not be capable of generating such high intensity tones without risking damage. Further, such high intensity tones might be unpleasant to humans within the audible range of the playback device, as might be expected during a calibration procedure that involves a moving microphone. Accordingly, some embodiments of the calibration sound might not include a swept component that extends to relatively low frequencies (e.g., below 50 Hz). Instead, the swept component may span frequencies between a second threshold frequency (e.g., a frequency around 50-100 Hz) and a maximum frequency of the calibration frequency range. The maximum of the calibration range may correspond to the physical capabilities of the playback device emitting the calibration sound, which might be 20,000 Hz or above.

Using a swept component might also facilitate the reversal of phase distortion caused by the moving microphone. A moving microphone may cause phase distortion, which may complicate the accurate determination of a frequency response from a captured calibration sound. However, with a swept component, the phase of each frequency is predictable (as Doppler shift). This predictability facilitates reversing the phase distortion so that a captured calibration sound can be associated with a (known) emitted calibration sound during analysis. Such an association can be used to determine the effect of the environment on the calibration sound.

As noted above, a swept component may increase or decrease in frequency over time. A descending chirp may be more pleasant to hear to some listeners than an ascending chirp, due to the physical shape of the human ear canal. While some implementations may use a descending swept signal, an ascending swept signal may also be effective for calibration.

As noted above, example calibration sounds may include a noise component in addition to a swept component. Noise refers to a random sound, which is in some cases filtered to have equal energy per octave. In embodiments where the noise component is periodic, the noise component of a calibration sound might be considered to be pseudorandom. The noise component of the calibration sound may be emitted for substantially the entire period or repetition of the calibration sound. This causes each frequency covered by the noise component to be emitted for a longer duration, which decreases the signal intensity typically required to overcome background noise.

Moreover, the noise component may cover a smaller frequency range than the swept component, which may allow increased sound energy to be used at each frequency within the range. As noted above, a noise component might cover frequencies between a minimum of the frequency range and a threshold frequency, which might be, for example a threshold frequency around 50-100 Hz. As with the maximum of the calibration frequency range, the minimum of the calibration frequency range may correspond to the physical capabilities of the playback device emitting the calibration sound, which might be 20 Hz or below.

Figure 16:
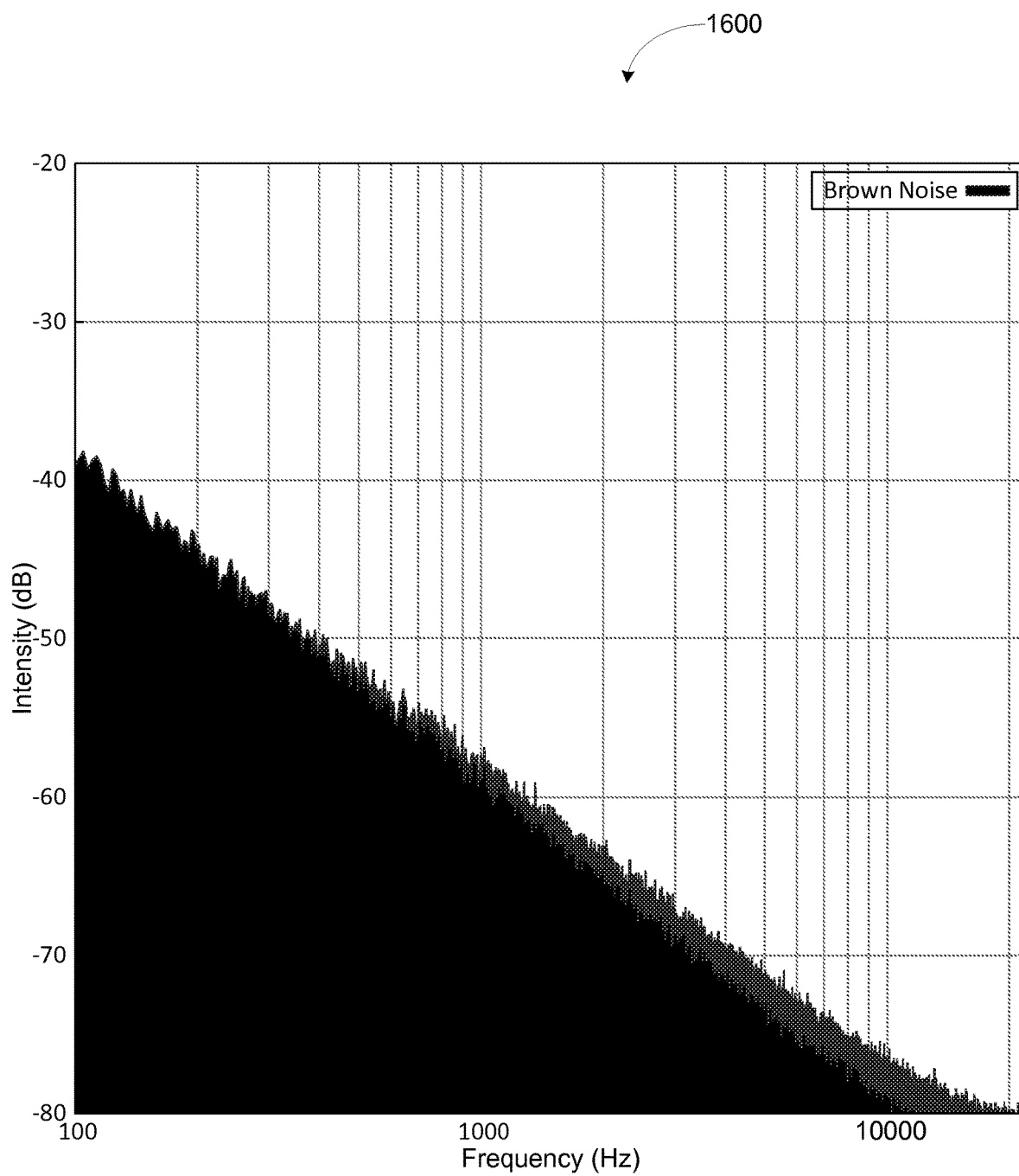
FIG. 16 shows an example noise component of a calibration sound.

FIG. 16 shows a graph 1600 that illustrates an example brown noise. Brown noise is a type of noise that is based on Brownian motion. In some cases, the playback device may emit a calibration sound that includes a brown noise in its noise component. Brown noise has a "soft" quality, similar to a waterfall or heavy rainfall, which may be considered pleasant to some listeners. While some embodiments may implement a noise component using brown noise, other embodiments may implement the noise component using other types of noise, such as pink noise or white noise. As shown in FIG. 16, the intensity of the example brown noise decreases by 6 dB per octave (20 dB per decade).

Some implementations of a calibration sound may include a transition frequency range in which the noise component and the swept component overlap. The noise component may include noise at frequencies between a minimum of the calibration frequency range and a first threshold frequency, and the second component may sweep through frequencies between a second threshold frequency and a maximum of the calibration frequency range.

To overlap these signals, the second threshold frequency may be a lower frequency than the first threshold frequency. In such a configuration, the transition frequency range includes frequencies between the second threshold frequency and the first threshold frequency, which might be, for example, 50-100 Hz. By overlapping these components, the playback device may avoid emitting a possibly unpleasant sound associated with a harsh transition between the two types of sounds.

In this context, a calibration sound may be separated in time from a subsequent calibration sound played by the playback device by a guard band that includes the first (noise) component. Additionally, the guard band might not include the second (swept) component.

Figure 17:
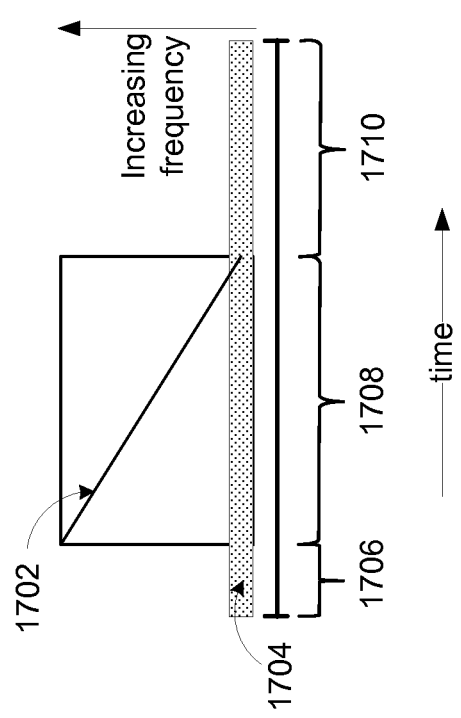
FIG. 17 shows an example calibration sound and guard bands.

FIG. 17 illustrates one example calibration sound 1708. The calibration sound 1708 includes a swept signal component 1702 and a noise component 1704. The swept signal component 1702 is shown as a downward sloping line to illustrate a swept signal that descends through frequencies of the calibration range. The noise component 1704 is shown to illustrate low-frequency noise. As shown, the swept signal component 1702 and the noise component 1704 overlap in a transition frequency range.

The calibration sound 1708 is preceded in time by a guard band 1706 and followed in time by a guard band 1710. As shown, both of the guard bands 1706 and 1710 may include the noise component 1704, but might not include the swept component 1702. The guard bands 1706 and 1710 may act as a "marker" for distinguishing the calibration sound 1708 from other captured calibration sounds.

At block 504, the method 500 may include generating data representing the one or more captured calibration sounds. For example, the microphone of the computing device may generate analog signals representing the captured calibration sounds and the computing device may process the analog signals via an analog-to-digital converter (ADC) and store digital data representing the one or more calibration sounds. At least initially, the data may be stored in a time-domain format as amplitudes (e.g., sound intensity) and respective times at which the amplitudes were detected.

At block 506, the method 500 may include identifying one or more sections of the data such that each of the one or more sections of the data corresponds to a respective calibration sound of the one or more calibration sounds.

In some examples, identifying the one or more sections of the data may include identifying a first section of the data that corresponds to a guard band and identifying a second section of the data that corresponds to a given calibration sound based on (i) the identified first section of the data and (ii) a predetermined periodicity of the one or more calibration sounds.

Figure 18:
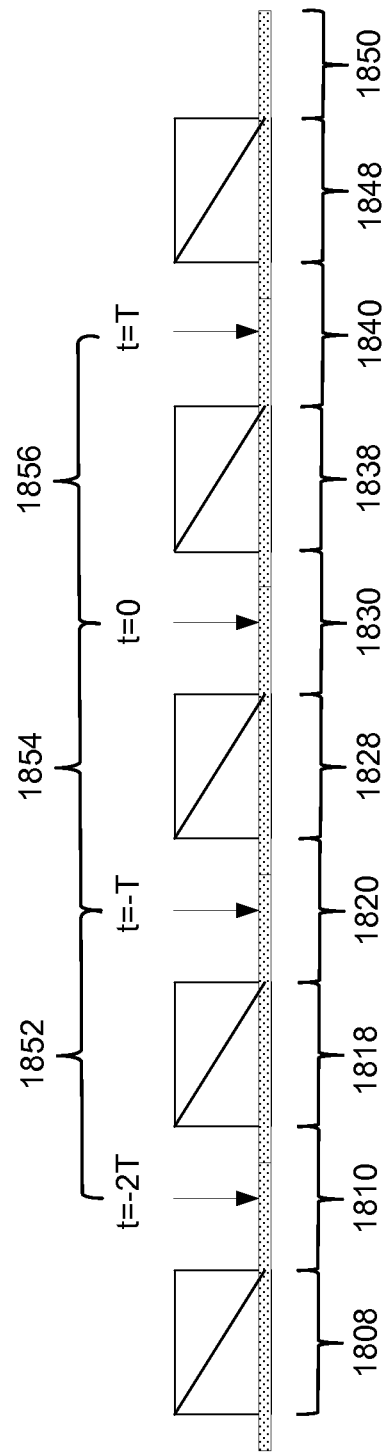
FIG. 18 shows example calibration sounds and guard bands.

FIG. 18 illustrates example periodic calibration sounds 1808, 1818, 1828, 1838, and 1848, and example guard bands 1810, 1820, 1830, 1840, and 1850. In some examples, the guard bands are about 0.1875 seconds long, which may allow reverberations of one calibration sound to dissipate before another calibration sound is commenced. In some contexts, it may be useful to think of FIG. 18 as depicting sections of data that represent calibration sounds and guard bands as well. In one example, the computing device may identify a section of the data that corresponds to the calibration sound 1828 based on (i) identifying data that corresponds to the guard band 1830 and (ii) a predetermined (known) periodicity of the calibration sounds 1808, 1818, 1828, 1838, and 1848.

For instance, the playback device may identify data corresponding to the guard band 1830 by identifying frequencies below that which are part of the (known) swept component of the calibration sound 1828. The computing device may then "cut" the data based on a predetermined periodicity. That is, the computing device may make a first cut of the data at a point in time t=0 within the guard band 1830, and then make subsequent cuts at t=n*T where 'n' is any integer. For example, the computing device may also cut the data at t=−2T, t=−T, and t=T, corresponding respectively to the guard bands 1810, 1820, and 1840. This may yield sections of data 1852, 1854, and 1856 corresponding respectively to the calibration sounds 1818, 1828, and 1838. Note that the sections of data 1852, 1854, and 1856 may represent portions of guard bands 1810, 1820, 1830 and 1840. Since the sections of data 1852, 1854, and 1856 each contain information regarding the entire calibration frequency range, the computing device may use the sections for calibration of the playback device. In some examples, the sections of data 1852, 1854, and 1856 may be further cut so as to include only information pertaining to calibration sounds and not include information pertaining to guard bands.

The computing device may also identify the data corresponding to the guard band 1830 by detecting an absence of a swept component (e.g., absence of higher frequencies) and a sound intensity of a noise component of the guard band 1830 that is perhaps lower than that of a swept component but greater than ambient background noise. The data may then be cut in a manner similar to that described above, based on the periodic nature of the calibration sounds 1808, 1818, 1828, 1838, and 1848.

In another example, by identifying data corresponding to guard bands, the computing device may identify sections of data that correspond to calibration sounds by a process of elimination. For example, the computing device may identify a first section of the data that corresponds to the guard band 1830, identify a second section of the data that corresponds to the guard band 1820, and identify a third section of the data that corresponds to the calibration sound 1828 based on the identified first section of the data and the identified second section of the data. The computing device may identify the first and second sections of data corresponding respectively to the guard bands 1820 and 1830 by any method described above, and the third section of the data corresponding to the calibration sound 1828 may be identified by its temporal position between the identified guard bands 1820 and 1830.

In some examples, identifying the one or more sections of the data may include identifying a section of the data representing a signal-to-noise ratio (SNR) that is greater than a threshold SNR. In this context, the SNR represented by the identified section of the data is a ratio of (i) a signal level of (a) a calibration sound and/or (b) a guard band to (ii) background noise detected by the microphone within the environment of the playback device.

For example, the computing device may analyze the data corresponding to the captured calibration sounds 1808, 1818, 1828, 1838, and 1848, and guard bands 1810, 1820, 1830 and 1840, as well as data corresponding to captured background noise that may be present in the environment of the playback device. For instance, if the computing device determines that the calibration sounds 1808, 1818, 1828, 1838, and 1848 and/or the guard bands 1810, 1820, 1830 and 1840 had sound intensity that was at least eight times as intense as the captured background noise, as averaged over the calibration frequency range, the computing device may use the data corresponding to the calibration sounds and/or guard bands to calibrate the playback device. On the other hand, data that corresponds to sounds that are not at least eight times as intense as the background noise, as averaged over the calibration range, might not be used to calibrate the playback device, and may be discarded. While the above example describes a threshold signal-to-noise ratio of eight, other SNRs may be used as a threshold for determining whether sections of data are used in the calibration process.

Once such data has "passed" such a SNR check, the computing device may further identify a subsection of such data that represents the guard band by identifying data that represents a sound intensity that is less than a threshold sound intensity. For example, the computing device may analyze data corresponding respectively to the guard bands 1820 and 1830, as well as data corresponding to the calibration sound 1828, and determine that the sound intensity of the calibration sound 1828 is twenty times as intense as the sound intensity of the guard bands 1820 and 1830 as averaged over the calibration frequency range, thereby recognizing that the data corresponding to the calibration sound 1828 does indeed correspond to a calibration sound. While the above example describes a threshold sound intensity ratio of 20:1, other threshold sound intensity ratios may be used as a threshold for distinguishing data corresponding respectively to (i) calibration sounds and (ii) guard bands.

The computing device may identify other sections of the generated data corresponding to other calibration sounds based on (i) the already identified subsection of the data and (ii) a predetermined periodicity of the one or more calibration sounds, as described above. For example, after identifying the data that corresponds to the guard band 1830, the computing device may "cut" the data at t=−2T, t=−T, t=0, t=T, thereby identifying the sections 1852, 1854, and 1856 of the data that correspond respectively to the calibration sounds 1818, 1828, and 1838.

Sections of data corresponding to calibration sounds may be identified by the computing device in other ways as well. For example, a guard band may include both a momentary first audio frequency (e.g., 5 kHz) and a momentary second audio frequency (10 kHz) at a particular time (not shown). The computing device may detect the first audio frequency and the second audio frequency at the particular time within the data representing the captured audio. In this context, the computing device may identify the one or more sections of the data based on (i) detecting the first audio frequency and the second audio frequency at the particular time and (ii) a predetermined periodicity of the one or more calibration sounds, as described above. For example, after identifying the data that corresponds to the guard band 1830, the computing device may "cut" the data at t=−2T, t=−T, t=0, t=T, thereby identifying the sections 1852, 1854, and 1856 of the data that correspond respectively to the calibration sounds 1818, 1828, and 1838.

At block 508, the method 500 may include using the one or more identified sections of the data to determine a frequency response of the playback device over the calibration frequency range. In this context, the frequency response of the playback device characterizes audio playback by the playback device as influenced by acoustic characteristics of the environment of the playback device. By identifying sections of the captured data that correspond respectively to calibration sounds that were captured as the microphone moved within the environment, the sections of data may be used to characterize how the physical characteristics of the playback device and/or the environment may distort (e.g., boost or attenuate) various audio frequencies that a listener may hear.

More specifically, the frequency response of the playback device may be a ratio (e.g., transfer function), at various frequencies of the calibration range, of (a) an average intensity of sound waves as captured by the microphone at various locations within the environment of the playback device to (b) a reference intensity that represents the amplitude of the sound waves as actually generated by the playback device. By further example, a playback device playing audio within an ideal environment that does not alter playback by the playback device would have a transfer function of 1 (or 0 dB) for all audio frequencies. At frequencies where the intensity as captured by the microphone is greater than the reference intensity, the transfer function may have a value greater than 1 (or greater than 0 dB). At frequencies where the intensity as captured by the microphone is lower than the reference intensity, the transfer function may have a value less than 1 (or less than 0 dB). The frequency response of the playback device may take other forms as well.

Using the one or more sections of the data to determine the frequency response may include the computing device converting the one or more identified sections of the data from a time-domain format to a frequency-domain format. In a time-domain format, the one or more sections of the data may represent amplitudes of captured audio over a given period of time. The computing device may use a fast-Fourier transform (FFT) or another conversion algorithm to convert the one or more sections of the data from a time-domain format to a frequency-domain format. In a frequency-domain format, the data may represent intensities of the captured audio at various respective frequencies within the calibration frequency range. The converted frequency-domain data may indicate at which frequencies the captured audio was amplified or attenuated by the environment of the playback device. This information may be used to adjust the actual frequency response of the playback device within the environment to a target frequency response (e.g., a "flat" frequency response).

More specifically, the computing device may calculate a sum of magnitudes of captured audio, over the calibration frequency range, of the converted one or more sections of the data. In one example, since the one or more calibration sounds represent audio captured by the microphone at various locations around the room, calculating sums at respective frequencies spanning the calibration frequency range may yield a frequency response that accounts for the various ways the environment affects playback at various listening positions within the environment.

Figure 19:
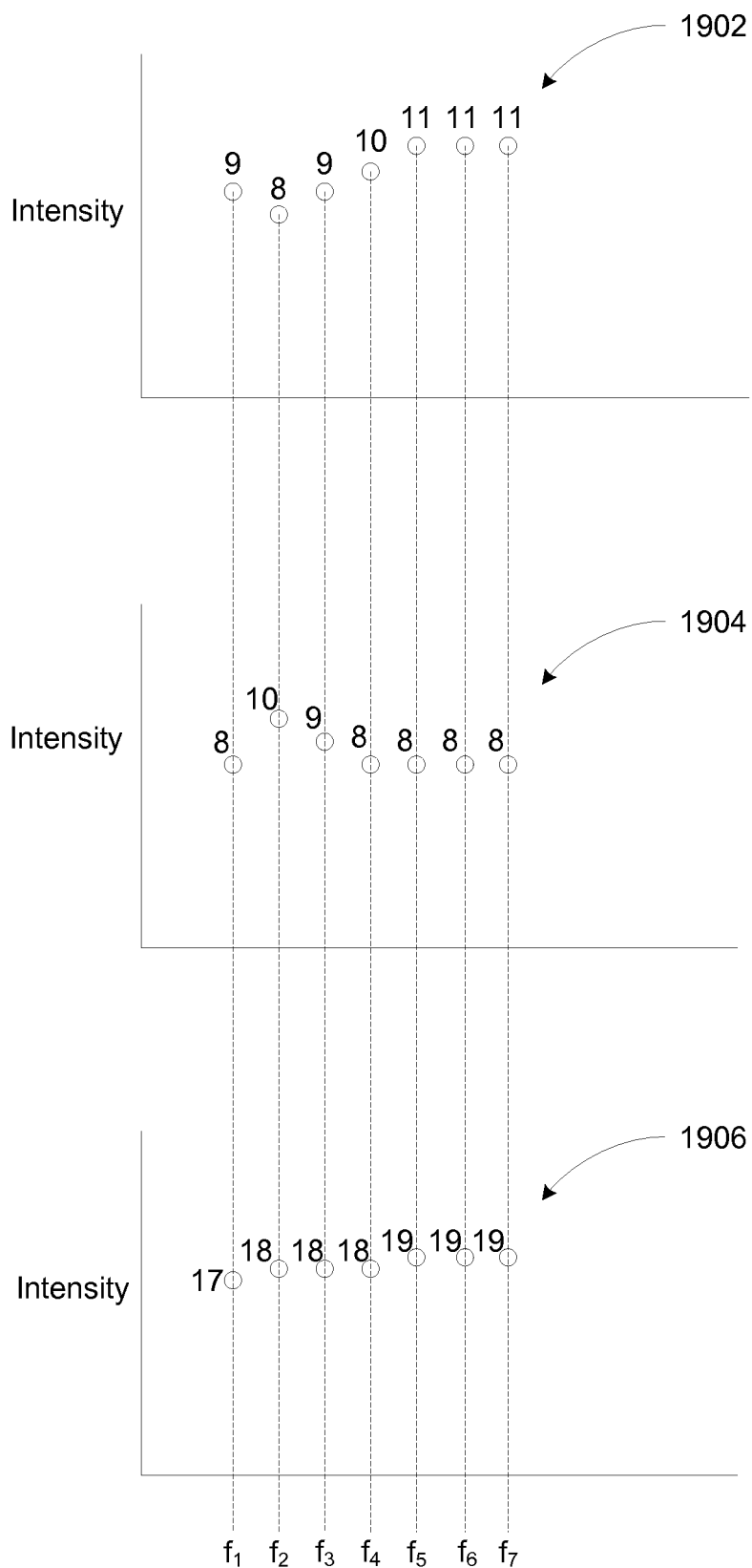
FIG. 19 shows example sections of data in a frequency-domain format.

Referring to FIG. 19 as an example, converted data section 1902 may correspond to the calibration sound 1828 captured by the microphone at point 1302 of FIG. 13. The converted data section 1904 may correspond to the calibration sound 1838 captured by the microphone at point 1304 of FIG. 13. (As the calibration sounds 1828 and 1838 are consecutive calibration sounds, the distance between points 1302 and 1304 may be exaggerated for illustrative purposes.)

Converted data section 1902 may include information regarding captured intensities of the calibration sound 1828 at arbitrary frequencies $f_1$, $f_2$, $f_3$, $f_4$, $f_5$, $f_6$, and $f_7$. (In practice, the frequencies $f_1$-$f_7$ may represent ranges of frequencies, and the intensities depicted may take the form of spectral power densities (W/Hz)). Converted data section 1904 may include information regarding captured intensities of the calibration sound 1838 at the same frequencies $f_1$, $f_2$, $f_3$, $f_4$, $f_5$, $f_6$, and $f_7$. The converted data section 1906 may represent a sum of the converted data section 1902 and the converted data section 1904 at the frequencies $f_1$, $f_2$, $f_3$, $f_4$, $f_5$, $f_6$, and $f_7$. The sum may be calculated as follows. At $f_1$, the intensity "9" of the captured calibration sound 1828 represented by converted data section 1902 is added to the intensity "8" of the captured calibration sound 1830 represented by converted data section 1904, yielding a sum intensity at $f_1$ of "17" for the converted data section 1906 at $f_1$. Similarly, at $f_2$, the intensity "8" of the captured calibration sound 1828 represented by the converted data section 1902 is added to the intensity "10" of the captured calibration sound 1830 represented by the converted data section 1904, yielding a sum intensity at $f_2$ of "18" for the converted data section 1906 at $f_1$. The rest of the converted data section 2006 may be calculated in a similar manner. As such, many converted sections of data representing numerous calibration sounds may be summed accordingly to determine the frequency response of the playback device.

In some examples, in order to shorten overall processing time, the computing device may calculate a "running sum" of the converted sections of data as the microphone moves around the environment capturing calibration sounds. Thus, calculating the sum of the converted one or more sections of the data may include calculating an initial sum of (i) a first converted section of the one or more converted sections of the data and (ii) a second converted section of the one or more converted sections of the data, and after calculating the initial sum, calculating a revised sum of (i) the first sum and (ii) a third converted section of the one or more converted sections of the data corresponding to a calibration sound that is captured after calibration sounds corresponding to the first and second converted sections of data, respectively.

In some examples, the computing device may normalize the one or more converted sections of the data so that each of the one or more normalized sections of the data represent a common amount of energy over a normalization frequency range (e.g., 300 Hz-3 kHz). A normalization procedure may include increasing or decreasing magnitudes of a converted section of data by a common factor, for all frequencies of the frequency calibration range. This may account for differences in captured intensity between calibration sounds that are due to the different calibration sounds being captured at various distances from the playback device. That is, calibration sounds that are captured near the playback device may be louder (at some or all frequencies) than calibration sounds that are captured far from the playback device, even though all the calibration sounds may be played with substantially the same intensity. This normalization may change the magnitudes of the converted sections of data at various frequencies, but generally will not change the ratios of intensity that exist between the various frequencies (e.g., the "shape" of the frequency response represented by the corresponding section of data). Without this normalization process, it might not be possible to discern the environment's true (frequency-dependent) effect upon the frequency response of the playback device.

In practice, one way to normalize a converted section of data might be to multiply the converted section of data by a scaling factor that is equal to (i) a reference intensity divided by (ii) an average intensity of the converted section of data over the normalization frequency range. For example, if the ratio of (i) the average intensity of the converted section of data over the normalization frequency range to (ii) the reference intensity is equal to 1.5, the converted section of data may be scaled (e.g., multiplied) by a factor of 0.666667.

In some examples, it may be beneficial to have calibration sounds captured near the playback device carry more weight in calibrating the playback device than calibration sounds captured far from the playback device (or vice versa). For instance, the environment may include seating areas near the playback device where listeners often sit while listening to audio content. As such, the computing device may normalize the one or more converted sections of the data by weighting the sections of data in proportion to the total energy represented by the respective converted sections of data over the calibration frequency range. Calibration sounds captured near the playback device will generally be louder than those captured far from the playback device. A reference intensity that corresponds to a central area of an environment may be determined, perhaps by capturing a calibration sound while the microphone is at such a location and by calculating an average intensity of that captured data over the normalization frequency range.

Thus, the converted sections of data representing calibration sounds may be each weighted exponentially, with the weighting exponent being (i) the average intensity of the converted section of data over the normalization frequency range minus (ii) the reference intensity. Accordingly, the converted sections of data representing calibration sounds captured near the playback device may be weighted with a positive exponent while the converted sections of data representing calibration sounds captured far from the playback device may be weighted with a negative exponent.

Calibration of a playback device may be improved by accounting for the frequency response of the microphone that captures the calibration sounds. Such a microphone may have physical characteristics that make the microphone more sensitive to certain frequencies rather than others. As such, the computing device may use the known frequency response of the microphone to process the one or more sections of data representing the captured calibration sounds so that the processed one or more sections of data more accurately represent the actual frequency response of the playback device.

For example, the computing device may store data in the form of an inverse FFT curve (or another similar data set) representing a known calibration sound captured (perhaps in an anechoic chamber) by the microphone. Accordingly, each of the one or more sections of data may be converted from a time-domain format to a frequency domain format, and multiplied, over the calibration frequency range, by the inverse FFT curve representing the microphone's frequency response. These processed sections of data may be normalized and/or used to determine the frequency response of the playback device as described above. If multiple microphones are used for calibration, multiple inverse FFT curves corresponding to the respective microphones may be stored by the computing device and/or used for calibration of the playback device. Thus, the processed one or more sections of data will generally be accurate representations of the corresponding calibration sounds as captured by the microphone while accounting for non-idealities of the microphone.

At block 510, the method 500 may include determining one or more parameters of an audio processing algorithm based on the frequency response of the playback device and a target frequency response.

As described above, the frequency response of the playback device may be determined based on one or more sections of data that have been converted to a frequency-domain format and that correspond to the one or more calibration sounds played by the playback device. For example, the one or more sections of data may be (i) converted from a time-domain format to a frequency-domain format, (ii) normalized according to a distance from the playback device at which the respective calibration sounds were captured and/or respective average sound intensities of the various calibration sounds, (iii) processed to account for the non-ideal frequency response of the microphone, and/or (iv) summed over the calibration frequency range. Any or all of the processes above may yield the frequency response of the playback device in the form of frequency-domain data.

The data making up the frequency response of the playback device may represent sound intensity as a function of frequency, but other examples are possible. The frequency response of the playback device may be may be multiplied by an inverse FFT curve that represents the target frequency response (described below) to yield an offset curve. The offset curve represents an "adjustment" that may be required to calibrate the playback device to match the target frequency response. The one or more parameters of the audio processing algorithm may be determined based on the offset curve. That is, when the playback device implements an audio processing algorithm characterized by the one or more parameters, the playback device may play audio according to the target frequency response within the environment. The one or more parameters may include biquad filter coefficients that represent the offset curve. The audio processing algorithm may be an infinite impulse response filer, perhaps made up of second order sections, but other examples are possible such as a finite impulse response filter.

In some examples, the target frequency response may simply be a "flat' response curve, representing an ideal situation where any audio content played by a playback device can be heard substantially as represented by the audio signal representing the audio content. Other target frequency responses are possible. Various target frequency responses may be selected by the computing device based on any of: playback device type, playback device orientation, zone configuration of the playback device, proximity and/or orientation of the playback device relative to another playback device, characteristics of audio content that is to be played by the playback device, etc.

In some examples, when the audio processing algorithm is implemented by the playback device according to the one or more determined parameters, no portion of audio played by the playback device is amplified by the audio processing algorithm by more than a threshold amplification factor. That is, the offset curve may be "clipped" or "limited" to avoid overloading speaker drivers of the playback device.

At block 512, the method 500 may include sending, to the playback device, the one or more parameters of the audio processing algorithm. For example, the computing device may send the one or more parameters to the playback device directly or indirectly via a wireless or wired network interface, but other examples are possible.

In some examples the calibration procedure may include a verification procedure. For example, the computing device may use one or more motion sensors to determine that the computing device was moved within the environment of the playback device, while capturing calibration sounds, in a manner sufficient to adequately determine the frequency response of the playback device. In this case, the computing device may provide a notification, via a user interface, that the calibration procedure was performed correctly.

In another verification procedure the computing device may capture additional calibration sounds played by the playback device while implementing the audio processing algorithm. Based on the captured one or more additional calibration sounds the computing device may determine or verify that the playback device is properly calibrated and use a user interface to provide such notification.

In some examples, the method 600 is performed by a computing device taking the form of a control device, such as the control device 300, but other examples are possible. As such, in the context of the method 600, the computing device may also be referred to herein as a control device.

At block 602, the method 600 may include capturing, via a microphone of the computing device, one or more calibration sounds played by a playback device. This may be performed similarly to block 502 described above.

At block 604, the method 600 may include generating data representing the one or more calibration sounds. This may be performed similarly to block 504 described above.

At block 606, the method 600 may include identifying one or more sections of the data such that each of the one or more sections of the data corresponds to a respective calibration sound of the one or more calibration sounds. This may be performed similarly to block 506 described above.

At block 608, the method 600 may include determining that more than a threshold amount of sections of the one or more sections of the data correspond to respective signal-to-noise ratios (SNRs) that are less than a threshold signal-to-noise ratio. An SNR of a section of data representing a calibration sound may be defined as a ratio of (i) a signal level of (a) the given calibration sound and/or (b) a guard band to (ii) background noise detected by the microphone within the environment of the playback device. In some examples, the threshold amount of sections may be 90% of the sections of data representing the captured one or more calibration sounds and the threshold SNR may be 8:1, but other example threshold amounts or threshold SNRs may be possible.

For example, the computing device may capture 100 calibration sounds played by the playback device. The computing device may then identify and analyze sections of data corresponding respectively to the 100 calibration sounds. Accordingly, the computing device may determine that 15 of the sections of data have respective SNRs of less than 8:1. As such, the computing device may determine that the calibration procedure has failed, that is, that the playback device might not be able to be properly calibrated based on the captured one or more calibration sounds.

At block 610, the method 600 may include providing an indication, via a user interface of the computing device, that the playback device was not properly calibrated. For example, the computing device may display a message that reads "CALIBRATION FAILED. REDUCE BACKGROUND NOISE OR MOVE CLOSER TO THE PLAYBACK DEVICE." In other examples, the computing device may emit a tone or a "spoken" alert recognizable to a user as indicating a failure of the calibration procedure.

In some examples, the method 700 is performed by a computing device taking the form of a control device, such as the control device 300, but other examples are possible. As such, in the context of the method 700, the computing device may also be referred to herein as a control device.

At block 702, the method 700 may include, as the computing device is moving within an environment of a first playback device and a second playback device, capturing, via a microphone of the computing device, one or more first calibration sounds played by the first playback device and one or more second calibration sounds played by the second playback device. In this context, each of the one or more first calibration sounds and each of the one or more second calibration sounds may include a sweep through frequencies of a calibration frequency range.

Figure 20:
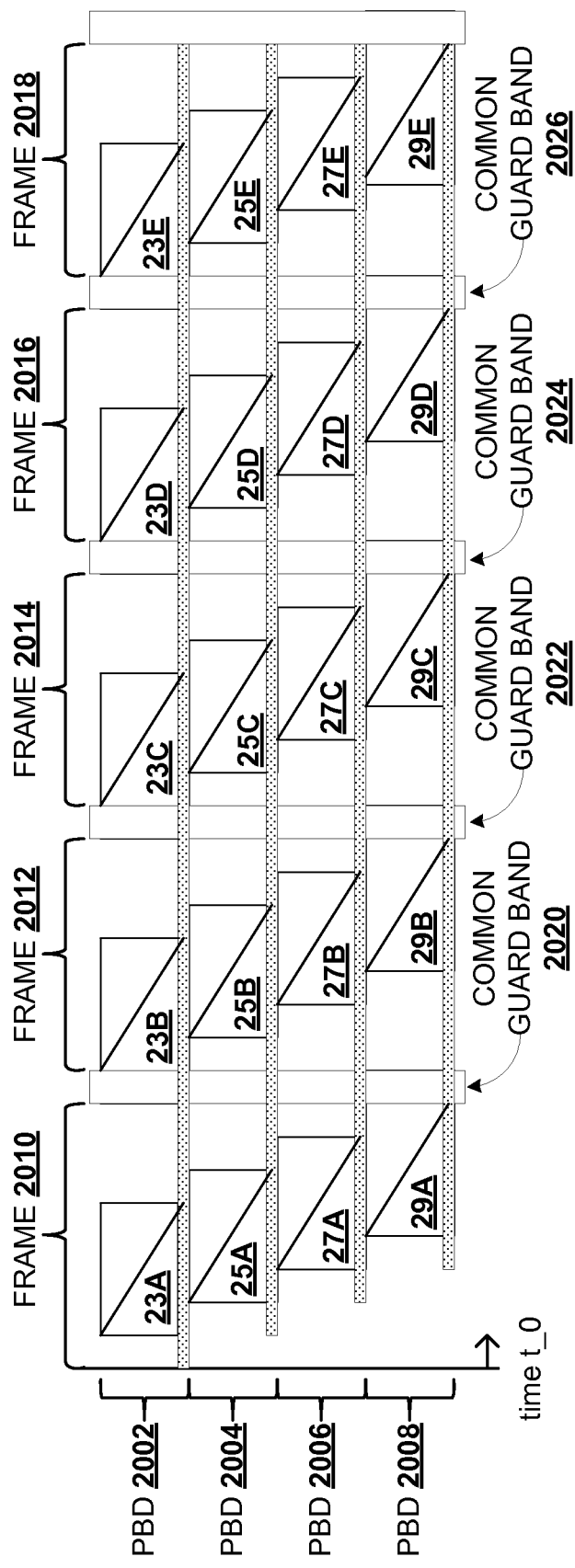
FIG. 20 shows example calibration sounds and guard bands.

Block 702 may be performed similarly to block 502 described above with the additional feature that the computing device may capture calibration sounds played by both first and second playback devices (and possibly additional playback devices). Referring to FIG. 20 as an example, the computing device may capture the calibration sounds 23A, 23B, 23C, 23D, and 23E played by a playback device 2002, the calibration sounds 25A, 25B, 25C, 25D, and 25E played by a playback device 2004, the calibration sounds 27A, 27B, 27C, 27D, and 27E played by a playback device 2006, and the calibration sounds 29A, 29B, 29C, 29D, and 29E played by a playback device 2008.

At block 704, the method 700 may include generating data representing the one or more first calibration sounds and the one or more second calibration sounds. Block 704 may be performed similarly to block 504 described above with the additional feature that the computing device may generate data corresponding to calibration sounds played by both first and second playback devices (and possibly additional playback devices). For example, the computing device may generate data representing the calibration sounds 23A-E, 25A-E, 27A-E, and 29A-E.

At block 706, the method 700 may include identifying (i) one or more first sections of the data such that each of the one or more first sections of the data corresponds to a respective calibration sound of the one or more first calibration sounds and (ii) one or more second sections of the data such that each of the one or more second sections of the data corresponds to a respective calibration sound of the one or more second calibration sounds. Block 706 may be performed similarly to block 506 described above with the additional feature that the computing device may identify sections of data corresponding to calibration sounds played by both first and second playback devices (and possibly additional playback devices). For example, the computing device may identify sections of generated data corresponding respectively to the calibration sounds 23A-E, 25A-E, 27A-E, and 29A-E.

As shown in FIG. 20, a media playback system may include four playback devices 2002, 2004, 2006, and 2008. As an example, the playback device 2002 might be a "front" playback device, the playback device 2004 might be a "left" playback device, the playback device 2006 might be a "right" playback device, and the playback device 2008 might be a "rear" playback device, but other examples are possible.

Calibration sounds may be played by the playback devices 2002-2008 within "frames." For example, the calibration sounds 23A, 25A, 27A, and 29A may be played respectively by the playback devices 2002, 2004, 2006, and 2008 within a frame 2010. The calibration sounds 23B, 25B, 27B, and 29B may be played respectively by the playback devices 2002, 2004, 2006, and 2008 within a frame 2012. The calibration sounds 23C, 25C, 27C, and 29C may be played respectively by the playback devices 2002, 2004, 2006, and 2008 within a frame 2014. The calibration sounds 23D, 25D, 27D, and 29D may be played respectively by the playback devices 2002, 2004, 2006, and 2008 within a frame 2016. The calibration sounds 23E, 25E, 27E, and 29E may be played respectively by the playback devices 2002, 2004, 2006, and 2008 within a frame 2018.

The frames 2010-2018 may be separated in time via common guard bands 2020, 2022, 2024, and 2026. For example, the playback devices 2002-2008 may play the respective calibration sounds 23A-29A in a staggered sequence such that none of the swept components of the calibration sounds 23A-29A are played during the common guard band 2020. After the common guard band 2020, the playback devices 2002-2008 may play the respective calibration sounds 23B-29B in a staggered sequence such that none of the swept components of the calibration sounds 23B-29B are played during the common guard bands 2020 or 2022. After the common guard band 2022, the playback devices 2002-2008 may play the respective calibration sounds 23C-29C in a staggered sequence such that none of the swept components of the calibration sounds 23C-29C are played during the common guard bands 2022 or 2024. After the common guard band 2024, the playback devices 2002-2008 may play the respective calibration sounds 23D-29D in a staggered sequence such that none of the swept components of the calibration sounds 23D-29D are played during the common guard bands 2024 or 2026. Similarly, after the common guard band 2026, the playback devices 2002-2008 may play the respective calibration sounds 23E-29E in a staggered sequence such that none of the swept components of the calibration sounds 23E-29E are played during the common guard band 2026.

As such, the computing device may identify one or more sections of data corresponding to the playback device 2002, one or more sections of data corresponding to the playback device 2004, one or more sections of data corresponding to the playback device 2006, and one or more sections of data corresponding to the playback device 2008.

For example, the computing device may identify sections of data representing calibration sounds based on a predetermined sequence of the calibration sounds. Within the frame 2010 for instance, the computing device may identify data corresponding to the maximum frequency of the calibration frequency range. Each of the calibration sounds 23A-29A begins with the maximum frequency of the calibration frequency range. The staggered sequence of the calibration sounds 23A-29A may be such that the computing device first captures the maximum frequency of the calibration sound 23A, then captures the maximum frequency of the calibration sound 25A, then captures the maximum frequency of the calibration sound 27A, and then captures the maximum frequency of the calibration sound 29A. Based on the staggered sequence, the computing device may determine that the first detected maximum frequency corresponds to the playback device 2002, the second detected maximum frequency corresponds to the playback device 2004, the third detected maximum frequency corresponds to the playback device 2006, and the fourth detected maximum frequency corresponds to the playback device 2002. The other frequencies included within the calibration sounds 23A-29A may be staggered according to this sequence as well, and the computing device may associate the captured frequencies with the respective playback devices that played the captured frequencies according to the staggered sequence. After detecting the threshold frequency representing the low end of the range of the swept component for each of the playback devices 2002-2008, the computing device may determine that any further captured calibration sounds will pertain to subsequent frames 2012-2018. Sections of data corresponding to calibration sounds 23B-23E, 25B-25E, 27B-25E, and 29B-29E may be identified in a similar manner.

At block 708, the method 700 may include using the one or more first sections of the data to determine a first frequency response of the first playback device over the calibration frequency range, wherein the first frequency response characterizes audio playback by the first playback device as influenced by acoustic characteristics of the environment of the first playback device and the second playback device.

At block 710, the method 700 may include using the one or more second sections of the data to determine a second frequency response of the second playback device over the calibration frequency range, wherein the second frequency response characterizes audio playback by the second playback device as influenced by the acoustic characteristics of the environment of the first playback device and the second playback device.

Blocks 708 and 710 may be performed similarly to block 508 described above with the additional feature that the computing device may determine frequency responses for both first and second playback devices (and possibly additional playback devices). For example, the computing device may use sections of data representing the calibration sounds 23A-E to determine a frequency response of the playback device 2002, may use data representing the calibration sounds 25A-E to determine a frequency response of the playback device 2004, may use data representing the calibration sounds 27A-E to determine a frequency response of the playback device 2006, and may use data representing the calibration sounds 29A-E to determine a frequency response of the playback device 2008.

At block 712, the method 700 may include determining one or more first parameters of a first audio processing algorithm based on the first frequency response and a first target frequency response.

At block 714, the method 700 may include determining one or more second parameters of a second audio processing algorithm based on the second frequency response and a second target frequency response.

Blocks 712 and 714 may be performed similarly to block 510 described above with the additional feature that the computing device may determine parameters of audio processing algorithms for both first and second playback devices (and possibly additional playback devices). For example, the computing device may use respectively determined frequency responses of the playback devices 2002-2008 to determine one or more parameters defining respective audio processing algorithms for each of the playback devices 2002-2008.

At block 716, the method 700 may include sending, to the first playback device, the one or more first parameters of the first audio processing algorithm.

At block 718, the method 700 may include sending, to the second playback device, the one or more second parameters of the second audio processing algorithm.

Blocks 716 and 718 may be performed similarly to block 512 described above.

In some examples, the method 800 is performed by a first computing device taking the form of a server that is connected to a media playback system via, perhaps, a wide area network, but other examples are possible. In the context of the method 800, the second computing device may take the form of a control device of the media playback system, but other examples are possible. The playback device mentioned in the context of the method 800 may also be a part of the media playback system.

At block 802, the method 800 may include receiving, from a second computing device, data representing one or more calibration sounds that are played by a playback device and captured by the second computing device. In this context, each of the one or more calibration sounds includes a sweep through frequencies of a calibration frequency range.

At block 804, the method 800 may include identifying one or more sections of the data such that each of the one or more sections of the data corresponds to a respective calibration sound of the one or more calibration sounds. Block 804 may be performed similarly to block 506 described above.

At block 806, the method 800 may include using the one or more sections of the data to determine a frequency response of the playback device over the calibration frequency range. In this context, the frequency response of the playback device characterizes audio playback by the playback device as influenced by acoustic characteristics of the environment of the playback device. Block 806 may be performed similarly to block 508 described above.

At block 808, the method 800 may include determining one or more parameters of an audio processing algorithm based on the frequency response of the playback device and a target frequency response. Block 808 may be performed similarly to block 510 described above.

At block 810, the method 800 may include sending, to the playback device, the one or more parameters of the audio processing algorithm. Block 810 may be performed similarly to block 512 described above.

In some examples, the method 900 is performed by a first computing device taking the form of a server that is connected to a media playback system via, perhaps, a wide area network, but other examples are possible. In the context of the method 900, the second computing device may take the form of a control device of the media playback system, but other examples are possible. The playback device mentioned in the context of the method 900 may also be a part of the media playback system.

At block 902, the method 900 may include receiving, from a second computing device, data representing one or more calibration sounds that are played by a playback device and captured by the second computing device. Block 902 may be performed similarly to block 802 described above.

At block 904, the method 900 may include identifying one or more sections of the data such that each of the one or more sections of the data corresponds to a respective calibration sound of the one or more calibration sounds. Block 904 may be performed similarly to block 506 described above.

At block 906, the method 900 may include determining that more than a threshold amount of sections of the one or more sections of the data correspond to respective signal-to-noise ratios (SNRs) that are less than a threshold signal-to-noise ratio. Block 906 may be performed similarly to block 608 described above.

At block 908, the method 900 may include sending an indication, to the second computing device, that the playback device was not properly calibrated.

In some examples, the method 1000 is performed by a first computing device taking the form of a server that is connected to a media playback system via, perhaps, a wide area network, but other examples are possible. In the context of the method 1000, the second computing device may take the form of a control device of the media playback system, but other examples are possible. The first and second playback devices mentioned in the context of the method 1000 may also be included within the media playback system.

At block 1002, the method 1000 may include receiving, from a second computing device, data representing (i) one or more first calibration sounds that are played by a first playback device and captured by the second computing device and (ii) one or more second calibration sounds that are played by a second playback device and captured by the second computing device. Block 1002 may be performed similarly to block 902 described above.

At block 1004, the method 1000 may include identifying (i) one or more first sections of the data such that each of the one or more first sections of the data correspond to a respective calibration sound of the one or more first calibration sounds and (ii) one or more second sections of the data such that each of the one or more second sections of the data correspond to a respective calibration sound of the one or more second calibration sounds. Block 1004 may be performed similarly to block 706 described above.

At block 1006, the method 1000 may include using the one or more first sections of the data to determine a first frequency response of the first playback device over the calibration frequency range. In this context, the first frequency response may characterize audio playback by the first playback device as influenced by acoustic characteristics of the environment of the first playback device and the second playback device. Block 1006 may be performed similarly to block 708 described above.

At block 1008, the method 1000 may include using the one or more second sections of the data to determine a second frequency response of the second playback device over the calibration frequency range. In this context, the second frequency response characterizes audio playback by the second playback device as influenced by the acoustic characteristics of the environment of the first playback device and the second playback device. Block 1008 may be performed similarly to block 710 described above.

At block 1010, the method 1000 may include determining one or more first parameters of a first audio processing algorithm based on the first frequency response and a first target frequency response and determining one or more second parameters of a second audio processing algorithm based on the second frequency response and a second target frequency response. Block 1010 may be performed similarly to blocks 712 and 714 described above.

At block 1012, the method 1000 may include sending, to the first playback device, the one or more first parameters of the first audio processing algorithm. Block 1012 may be performed similarly to block 716 described above.

At block 1014, the method 1000 may include sending, to the second playback device, the one or more second parameters of the second audio processing algorithm. Block 1014 may be performed similarly to block 718 described above.

In some examples, the method 1100 is performed by the playback device 200. The computing device mentioned in the context of the method 1100 may be a control device of a media playback system that includes the playback device 200.

At block 1102, the method 1100 may include receiving, from a computing device, data representing one or more calibration sounds that are played by the playback device and captured by the computing device. In this context, each of the one or more calibration sounds includes a sweep through frequencies of a calibration frequency range. Block 1102 may be performed similarly to block 802 described above.

At block 1104, the method 1100 may include identifying one or more sections of the data such that each of the one or more sections of the data corresponds to a respective calibration sound of the one or more calibration sounds. Block 1104 may be performed similarly to block 804 described above.

At block 1106, the method 1100 may include using the one or more sections of the data to determine a frequency response of the playback device over the calibration frequency range. In this context, the frequency response of the playback device characterizes audio playback by the playback device as influenced by acoustic characteristics of the environment of the playback device. Block 1106 may be performed similarly to block 806 described above.

At block 1108, the method 1100 may include determining one or more parameters of an audio processing algorithm based on the frequency response of the playback device and a target frequency response. Block 1108 may be performed similarly to block 808 described above.

At block 1110, the method 1100 may include playing audio that is processed using the audio processing algorithm.

In some examples, the method 1200 is performed by the playback device 200. The computing device mentioned in the context of the method 1200 may be a control device of a media playback system that includes the playback device 200.

At block 1202, the method 1200 may include receiving, from a computing device, data representing one or more calibration sounds that are played by the playback device and captured by the computing device. Block 1202 may be performed similarly to block 802 described above.

At block 1204, the method 1200 may include identifying one or more sections of the data such that each of the one or more sections of the data corresponds to a respective calibration sound of the one or more calibration sounds. Block 1204 may be performed similarly to block 804 described above.

At block 1206, the method 1200 may include determining that more than a threshold amount of sections of the one or more sections of the data correspond to respective signal-to-noise ratios (SNRs) that are less than a threshold signal-to-noise ratio. Block 1206 may be performed similarly to block 608 described above.

At block 1208, the method 1200 may include providing an indication that the playback device was not properly calibrated. Block 1208 may be performed similarly to block 610 described above.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A system comprising a first playback device and a second playback device, wherein the first playback device comprises:
    at least one first microphone;
    at least one first audio transducer;
    a first communications interface;
    at least one first processor; and
    at least one first non-transitory computer-readable medium comprising program instructions that are executable by the at least one first processor such that the first playback device is configured to perform first functions comprising:
        playing back one or more calibration sounds via the at least one first audio transducer in synchrony with playback of the one or more calibration sounds by the second playback device;
        while playing back the one or more calibration sounds, capturing, via the at least one first microphone, first sound data;

identifying first sections of the first sound data that correspond to portions of the one or more calibration sounds as played back by the first playback device;

determining a first calibration based on the identified first sections of the first sound data; and applying the first calibration to playback by the first playback device, wherein the first calibration at least partially offsets acoustic characteristics of an environment surrounding the first playback device when applied to playback by the first playback device, wherein the second playback device comprises:

at least one second microphone;

at least one second audio transducer;

a second communications interface;

at least one second processor; and at least one second non-transitory computer-readable medium comprising program instructions that are executable by the at least one second processor such that the second playback device is configured to perform second functions comprising:

playing back the one or more calibration sounds via the at least one second audio transducer in synchrony with playback of the one or more calibration sounds by the first playback device;

while playing back the one or more calibration sounds, capturing, via the at least one second microphone, second sound data;

identifying second sections of the second sound data that correspond to portions of the one or more calibration sounds as played back by the second playback device;

determining a second calibration based on the identified second sections of the second sound data; and applying the second calibration to playback by the second playback device, wherein the second calibration at least partially offsets acoustic characteristics of an environment surrounding the second playback device when applied to playback by the second playback device.

2. The system of claim 1, wherein playing back the one or more calibration sounds via the at least one first audio transducer in synchrony with play back of the one or more calibration sounds by the second playback device comprises:

sending, via the first communications interface, playback timing data, and wherein playing back the one or more calibration sounds via the at least one second audio transducer in synchrony with play back of the one or more calibration sounds by the first playback device comprises:

receiving, via the second communications interface, the playback timing data; and synchronizing playback of the one or more calibration sounds via the received playback timing data.

3. The system of claim 2, wherein playing back the one or more calibration sounds via the at least one first audio transducer in synchrony with play back of the one or more calibration sounds by the second playback device comprises:

sending, via the first communications interface, (i) data representing at least a portion of the one or more calibration sounds and (ii) the playback timing data.

4. The system of claim 1, wherein the first calibration comprises a first audio processing algorithm, and wherein determining the first calibration based on the identified first sections of the first sound data comprises:

determining one or more parameters of the first audio processing algorithm based on a target response and one or more responses represented in the identified first sections of the first sound data.

5. The system of claim 1, wherein a given calibration sound of the one or more calibration sounds comprises a first component that includes calibration noise at frequencies between a minimum of a calibration frequency range and a first threshold frequency, and a second component that sweeps through frequencies between a second threshold frequency and a maximum of the calibration frequency range.

6. The system of claim 5, wherein the first threshold frequency and the second threshold frequency are the same frequency.

7. The system of claim 1, wherein the first playback device comprises one or more sensors, and wherein the first functions further comprise:

detecting, via the one or more sensors, that the first playback device has moved more than a threshold amount; and based on the detecting, causing the first playback device and the second playback device to initiate calibration, wherein the calibration comprises determining the first calibration and determining the second calibration.

8. The system of claim 1, wherein the first functions further comprise:

while the first calibration is applied, playing back one or more additional calibration sounds;

while playing back the one or more additional calibration sounds, capturing, via the at least one first microphone, additional sound data;

identifying sections of the additional sound data that correspond to portions of the one or more additional calibration sounds as played back by the first playback device; and determining that the first calibration is valid based on the identified section of the additional sound data.

9. The system of claim 1, wherein the first functions further comprise:

causing a control device to display an indication that the first calibration is applied.

10. The system of claim 1, wherein identifying first sections of the first sound data that correspond to portions of the one or more calibration sounds as played back by the first playback device comprises:

identifying first sections that are staggered in time from the second sections.

11. The system of claim 1, wherein the first functions further comprise:

while the first calibration is applied, playing back audio content via the at least one first audio transducer in synchrony with playback of the audio content by the second playback device.

12. The system of claim 11, wherein the first playback device and the second playback device are configured in a stereo pair, and wherein playing back the audio content via the at least one first audio transducer in synchrony with the playback of the audio content by the second playback device comprises:

playing back a left channel of the audio content via the at least one first audio transducer in synchrony with playback of a right channel of the audio content by the second playback device.

13. A method to be performed by a first playback device and a second playback device, the method comprising:

the first playback device playing back one or more calibration sounds via at least one first audio transducer in synchrony with playback of the one or more calibration sounds by the second playback device;

while playing back the one or more calibration sounds, the first playback device capturing, via at least one first microphone, first sound data;

the first playback device identifying first sections of the first sound data that correspond to portions of the one or more calibration sounds as played back by the first playback device;

the first playback device determining a first calibration based on the identified first sections of the first sound data;

the first playback device applying the first calibration to playback by the first playback device, wherein the first calibration at least partially offsets acoustic characteristics of an environment surrounding the first playback device when applied to playback by the first playback device, the second playback device playing back the one or more calibration sounds via at least one second audio transducer in synchrony with playback of the one or more calibration sounds by the first playback device;

while playing back the one or more calibration sounds, the second playback device capturing, via at least one second microphone, second sound data;

the second playback device identifying second sections of the second sound data that correspond to portions of the one or more calibration sounds as played back by the second playback device;

the second playback device determining a second calibration based on the identified second sections of the second sound data; and the second playback device applying the second calibration to playback by the second playback device, wherein the second calibration at least partially offsets acoustic characteristics of an environment surrounding the second playback device when applied to playback by the second playback device.

14. The method of claim 13, wherein playing back the one or more calibration sounds via the at least one first audio transducer in synchrony with play back of the one or more calibration sounds by the second playback device comprises:

sending, via a first communications interface, playback timing data, and wherein playing back the one or more calibration sounds via the at least one second audio transducer in synchrony with play back of the one or more calibration sounds by the first playback device comprises:

receiving, via a second communications interface, the playback timing data; and synchronizing playback of the one or more calibration sounds via the received playback timing data.

15. The method of claim 14, wherein playing back the one or more calibration sounds via the at least one first audio transducer in synchrony with play back of the one or more calibration sounds by the second playback device comprises:

sending, via the first communications interface, (i) data representing at least a portion of the one or more calibration sounds and (ii) the playback timing data.

16. The method of claim 13, wherein the first calibration comprises a first audio processing algorithm, and wherein determining the first calibration based on the identified first sections of the first sound data comprises:

determining one or more parameters of the first audio processing algorithm based on a target response and one or more responses represented in the identified first sections of the first sound data.

17. The method of claim 13, wherein a given calibration sound of the one or more calibration sounds comprises a first component that includes calibration noise at frequencies between a minimum of a calibration frequency range and a first threshold frequency, and a second component that sweeps through frequencies between a second threshold frequency and a maximum of the calibration frequency range.

18. The method of claim 13, wherein the first playback device comprises one or more sensors, and wherein the method further comprises:

detecting, via the one or more sensors, that the first playback device has moved more than a threshold amount; and based on the detecting, causing the first playback device and the second playback device to initiate calibration, wherein the calibration comprises determining the first calibration and determining the second calibration.

19. The method of claim 13, further comprising:

while the first calibration is applied, playing back one or more additional calibration sounds;

while playing back the one or more additional calibration sounds, capturing, via the at least one first microphone, additional sound data;

identifying sections of the additional sound data that correspond to portions of the one or more additional calibration sounds as played back by the first playback device, and determining that the first calibration is valid based on the identified section of the additional sound data.

20. A first playback device comprising:

at least one microphone;

at least one first audio transducer;

a communications interface;

at least one processor; and at least one non-transitory computer-readable medium comprising program instructions that are executable by the at least one processor such that the first playback device is configured to:

play back one or more calibration sounds via the at least one first audio transducer of the first playback device in synchrony with playback of the one or more calibration sounds by a second playback device;

while playing back the one or more calibration sounds, capture, via the at least one microphone, first sound data;

identify first sections of the first sound data that correspond to portions of the one or more calibration sounds as played back by the first playback device;

determine a first calibration based on the identified first sections of the first sound data;

apply the first calibration to playback by the first playback device, wherein the first calibration at least partially offsets acoustic characteristics of an environment surrounding the first playback device when applied to playback by the first playback device; and cause the second playback device to play back the one or more calibration sounds via at least one second audio transducer in synchrony with playback of the one or more calibration sounds by the first playback device.

* * * * *

UNITED STATES PATENT AND TRADEMARK OFFICE
CERTIFICATE OF CORRECTION

| | | |
|---|---|---|
| PATENT NO. | : 11,803,350 B2 | Page 1 of 1 |
| APPLICATION NO. | : 17/407793 | |
| DATED | : October 31, 2023 | |
| INVENTOR(S) | : Timothy W. Sheen | |

It is certified that error appears in the above-identified patent and that said Letters Patent is hereby corrected as shown below:

In the Claims

In Column 44, in Claim 19, Line 32, delete "device," and insert -- device; --, therefor.

Signed and Sealed this
Ninth Day of January, 2024

*Katherine Kelly Vidal*

Katherine Kelly Vidal
*Director of the United States Patent and Trademark Office*